(12) United States Patent
Takada et al.

(10) Patent No.: US 7,552,531 B2
(45) Date of Patent: Jun. 30, 2009

(54) METHOD OF MANUFACTURING A PRINTED WIRING BOARD HAVING A PREVIOUSLY FORMED OPENING HOLE IN AN INNERLAYER CONDUCTOR CIRCUIT

(75) Inventors: Masaru Takada, Ogaki (JP); Kiyotaka Tsukada, Ogaki (JP); Hiroyuki Kobayashi, Ogaki (JP); Hisashi Minoura, Ogaki (JP); Yoshikazu Ukai, Ogaki (JP); Mitsuhiro Kondo, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 302 days.

(21) Appl. No.: 10/367,711

(22) Filed: Feb. 19, 2003

(65) Prior Publication Data
US 2003/0150644 A1 Aug. 14, 2003

Related U.S. Application Data

(62) Division of application No. 09/341,792, filed as application No. PCT/JP98/00289 on Jan. 23, 1998, now Pat. No. 6,590,165.

(30) Foreign Application Priority Data

| Feb. 3, 1997 | (JP) | ................................ 9-35633 |
| Feb. 13, 1997 | (JP) | ................................ 9-47248 |
| Feb. 17, 1997 | (JP) | ................................ 9-49883 |
| Feb. 19, 1997 | (JP) | ................................ 9-52482 |
| Feb. 19, 1997 | (JP) | ................................ 9-52483 |
| Feb. 19, 1997 | (JP) | ................................ 9-52484 |
| Feb. 27, 1997 | (JP) | ................................ 9-61921 |
| Mar. 3, 1997 | (JP) | ................................ 9-65511 |
| Mar. 5, 1997 | (JP) | ................................ 9-69158 |
| Mar. 19, 1997 | (JP) | ................................ 9-85786 |
| Dec. 24, 1997 | (JP) | ................................ 9-367268 |

(51) Int. Cl.
*H01K 3/10* (2006.01)
(52) U.S. Cl. .................... 29/852; 29/846; 427/97.7; 174/254
(58) Field of Classification Search .................. 29/846, 29/852; 427/97.1, 97.7, 99; 174/254
See application file for complete search history.

(56) References Cited

U.S. PATENT DOCUMENTS 3,571,923 A * 3/1971 Shaheen et al. ............... 29/852

(Continued)

FOREIGN PATENT DOCUMENTS

DE 41 29 835 A1 3/1993

(Continued)

OTHER PUBLICATIONS

Pargellis A. N. et al., "Formation fo Microvias in Epoxy-Glass Composites by Laser Ablation", Optics and Laser Technology, Elsevier Science Publishers BV., Amsterdam, NL, vol. 22, No. 3, Jun.1, 1990, pp. 205-207.

(Continued)

*Primary Examiner*—Rick K Chang
(74) *Attorney, Agent, or Firm*—Oliff & Berridge, PLC

(57) ABSTRACT

A method of producing a printed wiring board comprising innerlayer conductor circuits among insulating layers and blind via-holes formed by irradiating laser beams from the outermost surface of the insulating layer toward the innerlayer conductor circuit. A central portion of the innerlayer conductor circuit contains a previously formed opening hole located at the bottom of the blind via-hole. Thereafter, a metal plated film is formed on surfaces of the innerlayer conductor circuits and the blind via-holes.

5 Claims, 32 Drawing Sheets

U.S. PATENT DOCUMENTS

| | | | |
|---|---|---|---|
| 4,258,468 A | | 3/1981 | Balde |
| 4,642,160 A | | 2/1987 | Burgess |
| 4,729,061 A | | 3/1988 | Brown |
| 4,894,115 A | | 1/1990 | Eichelberger et al. |
| 4,935,584 A | | 6/1990 | Boggs |
| 5,034,569 A | * | 7/1991 | Gofuku et al. ............... 174/254 |
| 5,191,174 A | | 3/1993 | Chang et al. |
| 5,227,013 A | | 7/1993 | Kumar |
| 5,347,712 A | | 9/1994 | Yasuda et al. |
| 5,438,478 A | | 8/1995 | Kondo et al. |
| 5,578,341 A | | 11/1996 | Hirosawa |
| 5,729,897 A | * | 3/1998 | Schmidt et al. ............... 29/852 |
| 5,826,330 A | * | 10/1998 | Isoda et al. .................... 29/852 |

FOREIGN PATENT DOCUMENTS

| | | |
|---|---|---|
| EP | 0 180 183 A | 5/1986 |
| EP | 0 471 938 A | 2/1992 |
| EP | 0 694 968 A | 1/1996 |
| FR | 2 423 953 A1 | 11/1979 |
| JP | A 58-64097 | 4/1983 |
| JP | A 62-216297 | 9/1987 |
| JP | A 3-54885 | 3/1991 |
| JP | A-03-165093 | 7/1991 |
| JP | A 3-165594 | 7/1991 |
| JP | A-03-211791 | 9/1991 |
| JP | A 4-5891 | 1/1992 |
| JP | A 04-162796 | 6/1992 |
| JP | A 4-186741 | 7/1992 |
| JP | A-04-250695 | 9/1992 |
| JP | A 5-75253 | 3/1993 |
| JP | A 5-102641 | 4/1993 |
| JP | A 6-302965 | 10/1994 |
| JP | A 08-330734 | 12/1996 |
| JP | A 9-130049 | 5/1997 |
| JP | A-09-172261 | 6/1997 |
| JP | A 9-199861 | 7/1997 |
| JP | A-10/190233 | 7/1998 |
| JP | A 10-224041 | 8/1998 |

OTHER PUBLICATIONS

Kestenbaum A. et al., "Laser Drilling of Microvias in Epoxy-Glass Printed Circuit Boards", IEEE Transactions on Components, Hybrids, and Manufacturing Technology, IEEE Inc. New York, vol. 13, No. 4, Dec. 1, 1990, pp. 1055-1062.

IBM Corporation, "Heat Sink Attach Process for Surface Mounted Technology, Tape Automated Bonding and Card on Board Devices", IBM Technical Disclosure Bulletin, vol. 39, No. 4, Apr. 1, 1996, p. 99.

* cited by examiner

METHOD OF MANUFACTURING A PRINTED WIRING BOARD HAVING A PREVIOUSLY FORMED OPENING HOLE IN AN INNERLAYER CONDUCTOR CIRCUIT

BACKGROUND OF THE INVENTION

1. Field of Invention

This invention relates to a printed wiring board provided with via-holes formed by using a laser beam and a method of manufacturing the same.

2. Description of Related Art

A printed wiring board, as shown for example in FIG. 61, is formed by laminating plural insulating layers 91~93 one upon the other and electrically connecting innerlayer conductor circuits 95, 97 arranged between the layers to an outer conductor circuit 94 existing on an outermost surface through metal plated films 96 formed on via-holes 99a, 99b. A resin substrate such as glass-epoxy substrate or the like is used to form insulating layers 91-93. The via-holes 99a, 99b are blind via-holes each covered at one end and opened at the other end.

There are various methods of forming via-holes, such as using a drill, using a laser beam, etc.

However, these drilling methods cause unevenness in the depth accuracy. And also, it is recently demanded to make more fine a diameter of the via-hole with the advance of high densification in a wiring pattern.

For this end, there is proposed the formation of holes through the laser beam JP A62 216297, JP A 3 165594.

According to the latter method, as shown in FIG. 62, the via-holes 99a, 99b can be formed in a region ranging from an outermost surface of a multi-layer laminated plate up to innerlayer conductor circuits existing therein by utilizing a property that laser beams 81 reflect on the innerlayer conductor circuits 95, 97, each made of a metal such as copper foil, metal plated film or the like.

In the printed wiring board, however, a relatively shallow via-hole 99a arranged at the innerlayer conductor circuit 95 near to the outermost surface of the printed wiring board and a relatively deep via-hole 99b arranged at the innerlayer conductor circuit 97 far away from the outermost surface are existent together as the via-hole as shown in FIG. 62.

As a result, when the holes are formed through the laser beam 81, as shown in FIG. 63, there may be damage 98 such as breakage, swelling and the like, in a central portion of the innerlayer conductor circuit 95 arranged in the bottom of the shallow via-hole 99a although the innerlayer conductor circuit 97 arranged in the bottom of the deep via-hole 99b is not damaged.

Once such damages are caused, when a metal plated film is formed on each surface of the innerlayer conductor circuit 95 and via-hole 99a and between such a surface and an outer conductor circuit, pieces 98a of the innerlayer conductor circuit broken due to the damage 98 remain in the via-hole 99a, so that the metal plated film may not be formed sufficiently. Such an insufficient metal plated film badly affects electric conduction between the innerlayer conductor circuit 95 and the outer conductor circuit 94 and sometimes rejects the printed wiring board itself.

The reason why the damage is caused in the innerlayer conductor circuit 95 as mentioned above is due to the fact that laser beams 81 having an intensity required for the formation of the deep via-hole 99b are irradiated to not only the shallow via-hole 99a but also the deep via-hole 99b as shown in FIG. 62.

Therefore, it is also considered to adjust a laser beam intensity in accordance with the depth of the via-hole to be formed. However, the number of via-holes formed in one printed wiring board is as many as, for example, 500~10000. Therefore, it is complicated to adjust the intensity of the laser beam for every via-hole and also requires an expensive control device for such an adjustment.

Furthermore, a black oxide film is formed on the surfaces of the innerlayer conductor circuits 95, 97 for ensuring an adhesion property to the insulating layers 91, 92. Since the black oxide film is high in the energy absorption of laser beam, there is a fear of causing damages such as breakage and the like due to fusion and swelling of the innerlayer conductor circuit provided on its surface with the black oxide film.

Also, the insulating layer made of the resin or the like is exposed in the via-hole, so that it is difficult to form the metal plated film. For this end, the joining property between the inner wall of the via-hole and the metal plated film is low resulting in peeling, dropping-out and the like of the metal plated film. This can have a bad effect on the electric conduction of the via-hole.

The formation of the metal plated film on the via-hole is carried out by flowing an electric plating solution into the via-hole. However, as the inner diameter of the hole becomes small, it is difficult to make the formation of the plated film uniform, resulting in the electric conduction of the via-hole being insufficient.

Further, it has been attempted to provide the electric conduction by using solder to fill in the via-hole instead of the metal plated film. In this case, the joining strength between the inner wall of the via-hole and the solder is low. Also, the solder may be forced out from the via-hole through external pressure.

Moreover, it is required to utilize the irradiation of the laser beam to form holes other than the via-hole.

In the light of the above problems, the invention provides a printed wiring board and a method of manufacturing the same which can form via-holes having reliable electrical conduction without causing damage of innerlayer conductor circuits through a laser beam and furthermore to realize novel circuit formation through the laser beam.

SUMMARY OF THE INVENTION

A first aspect of the invention lies in a method of manufacturing a printed wiring board including at least two insulating layers made of a synthetic resin, an innerlayer conductor circuit arranged between the insulating layers, and a blind via-hole formed in at least one of the at least two insulating layers from an outermost surface of the insulating layer toward the innerlayer conductor circuit, characterized in that an opening hole is previously formed in a central portion of the innerlayer conductor circuit located in a bottom portion of the blind via-hole, and a laser beam is irradiated from the outermost surface of the insulating layer to form the blind via-hole, and then a metal plated film is formed on the innerlayer conductor circuit and the surface of the blind via-hole.

In the first aspect of the invention, it is important to note that the opening hole is previously formed in the central portion of the innerlayer conductor circuit.

In the first aspect of the invention, the blind via-hole ranging from the outermost surface of the printed wiring board to the innerlayer conductor circuit is formed by irradiating the laser beam toward a portion where the blind via-hole is to be formed.

In this case, the insulating layer in the printed wiring board is vaporized and removed by a higher energy of the laser beam, whereby the hole is gradually formed toward the inside of the printed wiring board. When the laser beam arrives at the innerlayer conductor circuit, the laser beam is reflected by the innerlayer conductor circuit made of the metal. At this time, the irradiation of the laser beam is stopped. Thus, the formation of the blind via-hole is terminated.

It is important that the formation of many blind via-holes is carried out, for example, by successively irradiating the laser beam for every hole. On the other hand, the irradiation time and energy required for the formation of the holes differs between shallow blind via-holes and deep blind via-holes.

However, the irradiation is conducted successively and continuously as mentioned above, so that all holes are formed under the same conditions by setting the time and energy so as to form the deep blind via-hole.

In the first aspect of the invention, the opening hole is formed in the innerlayer conductor circuit corresponding to the shallow blind via-hole.

In the formation of the shallow blind via-hole, therefore, even though the laser beam already arrives at the innerlayer conductor circuit to complete the formation of the via-hole, the laser beam is successively irradiated under the condition forming the deep blind via-hole. In this case, however, a central portion of the laser beam having a large energy is irradiated to the opening hole to pass therethrough.

The laser beam passing through the opening hole is irradiated only to the insulating layer ahead of the opening hole. Therefore, the insulating layer ahead of the opening hole is somewhat pierced in the portion of the innerlayer circuit conductor, but damage is not caused in the innerlayer conductor circuit itself.

On the other hand, the irradiation of the laser beam is stopped at a time of reflecting on the innerlayer conductor circuit in the formation of the deep blind via-hole, so that damage is not caused.

Also, there is a method of simultaneously irradiating laser beams to all holes to be formed irrespectively of the depth of the blind via-holes. In this case, the same function and effect as mentioned above is obtained (see the following embodiments).

With respect to the thus obtained blind via-holes having different depths, the metal plated film is formed in the inside of each hole in the same manner as in the conventional technique. In this case, all of the innerlayer conductor circuits do not cause the damage through the laser beam as mentioned above, so that a state of forming the insufficient metal plated film as described in the conventional technique can be avoided and the metal plated film having an excellent electric conduction can be formed.

As the insulating layer made of the synthetic resin in the first aspect of the invention, there are a synthetic resin alone, a resin substrate comprised of a synthetic resin and an inorganic filler, and a cloth substrate comprised of a synthetic resin and an inorganic cloth.

As the synthetic resin, mention may be made of epoxy resin, phenolic resin, polyimide resin, polybutadiene resin, fluoride resin and the like. The insulating layer made of only such a synthetic resin may be formed between another insulating layers as a prepreg adhesion layer as shown in the following embodiment.

As the inorganic filler added to the synthetic resin, mention may be made of glass short fibers, silica powder, mica powder, alumina, carbon and so on. A substrate made of a mixture of the synthetic resin and the inorganic filler is high in the strength as compared with the synthetic resin alone.

Also, the cloth substrate is a substrate comprised of a woven or knitted cloth and a synthetic resin such as glass-epoxy substrate, glass-polyimide substrate and so on. As such a cloth substrate, there is a substrate formed by impregnating the cloth with the synthetic resin. As a material of the cloth, there are glass fiber cloth, carbon cloth, aramide cloth and so on. As the synthetic resin, use may be made of the above materials.

The formation of a via-hole through the laser beam is carried out by irradiating the laser beam to a portion forming the blind via-hole. As the laser beam, it is preferable to use a carbon dioxide gas laser having a large energy and an excimer laser having no heat affection.

The blind via-hole is formed up to a given innerlayer conductor circuit arranged at the inside of the printed wiring board. In the thus formed blind via-hole, the metal plated film is continuously formed from the innerlayer conductor circuit at the bottom of the via-hole through a wall face of the via-hole to an outer conductor circuit.

When an innerlayer conductor circuit is provided on two or more stages in the printed wiring board and the blind via-hole is formed on each of the innerlayer conductor circuits, it is favorable to irradiate the laser beam at a state that the opening hole is formed in the innerlayer conductor circuit near to the outermost surface at a side of irradiating the laser beam, while the opening hole is not formed in the innerlayer conductor circuit far away from the outermost surface. Thus, there can be obtained the same function and effect as mentioned above.

The opening hole formed in the innerlayer conductor circuit is preferable to be 30~60% of a diameter of the blind via-hole. When the diameter of the opening hole is less than 30%, if a distance between the innerlayer conductor circuit having the opening hole and the deepest innerlayer conductor circuit having no opening hole is large, the innerlayer conductor circuit having the opening hole may be damaged by the laser beam. On the other hand, when it exceeds 60%, the connection between copper plated film and the innerlayer conductor circuit may be insufficient.

It is preferable that the metal plated film be formed so as to cover the opening hole in the innerlayer conductor circuit. Thus, the bottom of the blind via-hole is completely covered with the metal plated film, so that there is no penetration of humidity into the blind via-hole.

Moreover, the first aspect of the invention is applicable to printed wiring boards requiring high connection reliability such as memory modules, multi-chip modules, mother boards, daughter boards, plastic packages and the like.

A second aspect of the invention lies in a method of manufacturing a printed wiring board including at least two insulating layers made of a synthetic resin, an innerlayer conductor circuit arranged between the insulating layers, and a plurality of blind via-holes formed from an outermost surface toward the innerlayer conductor circuit and having different depths by successively irradiating a laser beam every a portion forming the blind via-hole, characterized in that a shallowest blind via-hole is formed as a standard hole by using a standard laser beam having an energy strength required for the formation of the standard hole, and the standard laser beam is irradiated plural times in the formation of the blind via-holes having deeper depths.

In the second aspect of the invention, it is important to note that the standard hole is formed by irradiating the standard laser beam, while the blind via-holes having a depth deeper than the standard hole are formed by irradiating the standard laser beam plural times.

The function and effect of the second aspect of the invention will be described below.

In the second aspect of the invention, the blind via-hole ranging from the outermost surface of the printed wiring board to the innerlayer conductor circuit is formed by irradiating the laser beam toward a portion forming the blind via-hole.

In this case, the insulating layer in the printed wiring board is vaporized and removed by a higher energy of the laser beam, whereby a hole is gradually formed toward the inside of the printed wiring board. When the laser beam arrives at the innerlayer conductor circuit, the laser beam is reflected by the innerlayer conductor circuit made of the metal. At this time, the irradiation of the laser beam is stopped. Thus, the formation of the blind via-hole is terminated.

Also, the formation of many blind via-holes is carried out, for example, by successively irradiating the laser beam every hole. In this case, the irradiation time and energy required for the formation of the hole differ between the shallow blind via-hole and the deep blind via-hole.

In the second aspect of the invention, therefore, the standard laser beam having an energy strength required for the formation of a shallowest blind via-hole as a standard hole is used and the formation of the standard hole is conducted by irradiating the standard laser beam one time. On the other hand, the blind via-holes having a depth deeper than the standard hole are formed by irradiating the standard laser beam plural times.

According to the second aspect of the invention, therefore, blind via-holes are divided into the standard holes and the other blind via-holes. The irradiation number of the standard laser beam may be determined in accordance therewith. Also, the blind via-holes other than the standard hole have several kinds of depths. The depth of each blind via-hole can previously be known in the planning of the printed wiring board.

On the other hand, an oscillator for the laser beam irradiates the standard laser beam every time the oscillator is moved to a coordinate point indicating, for example, a position of each blind via-hole. Also, movement and stopping at each coordinate point are carried out by N/C control by means of a coordinate control device.

When the irradiation number of the standard laser beam required for every blind via-hole is set, for example, in the laser beam oscillator positioned by the coordinate control device, every blind via-hole can be irradiated at the required energy strength.

As a result, the time required for the formation of many blind via-holes is shortened and cost can be reduced. Also, it is enough to control whether or not the irradiation is required plural times, so that the cost of the device can be reduced.

According to the second aspect of the invention, therefore, many blind via-holes having different depths can easily be formed only by adjusting the irradiation number of the standard laser beam.

Moreover, the depth of the blind via-hole is a depth ranging from the outermost surface of the printed wiring board to the innerlayer conductor circuit (including a lower circuit at a bottom surface), and each depth differs in accordance with a distance between the innerlayer conductor circuits. Also, the distance is determined by a thickness of the insulating layer between the innerlayer conductor circuits. Therefore, the depth of the blind via-hole other than the standard hole becomes generally near to an integer times a depth of the standard hole. As a result, the blind via-holes other than the standard hole can be formed by irradiating the standard laser beam plural times.

As the insulating layer in the second aspect of the invention, there is synthetic resin alone, a resin substrate comprised of a synthetic resin and an inorganic filler and a cloth substrate comprised of a synthetic resin and an inorganic cloth.

As the synthetic resin, mention may be made of epoxy resin, phenolic resin, polyimide resin, polybutadiene resin, fluoride resin and the like. The insulating layer made of only such a synthetic resin may be formed between another insulating layers as a prepreg adhesion layer.

As the laser beam, it is preferable to use a carbon dioxide gas laser having a large energy and an excimer laser having no heat affection.

For example, the energy strength of the standard laser beam can experimentally be determined by frequency, power (W) and irradiation time of the laser beam.

Moreover, the blind via-hole is formed up to a given innerlayer conductor circuit. In the thus formed blind via-hole, a metal plated film is continuously formed from the innerlayer conductor circuit at the bottom of the via-hole through the inner wall of the via-hole to an outer conductor circuit (see FIG. 10).

Furthermore, it is favorable that the standard laser beam is irradiated one time in the formation of all blind via-holes and thereafter the standard laser beam is irradiated only to the blind via-holes having a depth deeper than the standard hole at irradiation number required for the formation of these via-holes.

In this way, there can be obtained an effect of forming holes having various depths at a uniform state in the same cycle.

The standard laser beam is irradiated so as to successively form adjacent blind via-holes. In this case, it is favorable that one irradiation is conducted in the formation of the standard hole and the irradiation for the formation of the blind via-holes having a depth deeper than the standard hole is conducted at a number required for such a via-hole each time.

Thus, movement not requiring for the formation can be controlled to a minimum level, so that a total formation time can be shortened.

Moreover, the second aspect of the invention is applicable to printed wiring boards requiring high connection reliability such as memory modules, multi-chip modules, mother boards, daughter boards, plastic packages and the like.

A third aspect of the invention lies in a method of manufacturing a printed wiring board by forming an innerlayer conductor circuit on a surface of an innerlayer substrate, forming a black oxide film on a surface of the innerlayer conductor circuit, forming a second conductor circuit onto the innerlayer substrate through an insulating layer, irradiating a laser beam to form a via-hole ranging from an outer most surface of the insulating layer to the innerlayer conductor circuit, and then forming a metal plated film onto an inner wall face of the via-hole, characterized in that a portion of the innerlayer conductor circuit irradiated by the laser beam is an exposed portion having no black oxide film.

The formation of a hole through the laser beam is carried out by irradiating the laser beam to a portion forming the via-hole. As the laser beam, it is favorable to use a carbon dioxide gas laser having a large energy and an excimer laser having no heat affection.

And also, the formation of the via-hole through the laser beam is conducted by vaporizing and removing the insulating layer by a higher energy of the laser beam to successively form a hole toward the inside of the printed wiring board. When the laser beam arrives at the innerlayer conductor circuit, the laser beam is reflected by the inneriayer conductor circuit made of the metal. At this time, the irradiation of the laser beam is stopped.

The function of the third aspect of the invention will be described.

In the method according to the third aspect of the invention, the portion irradiated by the laser beam is an exposed portion of the innerlayer conductor circuit having no black oxide film.

Therefore, the laser beam is reflected by the innerlayer conductor circuit made of the metal and hardly absorbed by the innerlayer conductor circuit. As a result, it prevents abnormally heating the innerlayer conductor circuit, so that there is no damage of the innerlayer conductor circuit through heat.

In the third aspect of the invention, therefore, the via-hole can be formed by using the laser beam without damaging the innerlayer conductor circuit. Also, the via-hole is formed by the laser beam, so that via-holes having a smaller diameter can be obtained and it is easy to manufacture a printed wiring board having high density and accuracy.

As mentioned above, according to the third aspect of the invention, there can be provided a method of manufacturing a multilayer printed wiring board without causing the damage of the innerlayer conductor circuit in the formation of the via-hole through the laser beam.

Furthermore, the printed wiring board obtained in the third aspect of the invention can be used in memory module, multichip module, mother board, daughter board, plastic package and the like which require a high connection reliability.

The exposed portion is preferably formed by forming the black oxide film on the innerlayer conductor circuit and thereafter etching the black oxide film. Thus, the black oxide film can easily be formed at arbitrary positions.

Alternatively, the exposed portion is preferable to be formed by partly masking the innerlayer conductor circuit so as not to form the black oxide film in the formation of the black oxide film on the innerlayer conductor circuit.

In this way, the exposed portion can easily be formed in the formation of the black oxide film.

The insulating layer and the second conductor circuit are favorably formed at two or more sets. Thus, there can easily be obtained a printed wiring board of high density wiring.

Moreover, when the insulating layer and the second conductor circuit are two or more sets, a set of certain insulating layer and second conductor circuit formed thereon is provided on its surface with another set of different insulating layer and second conductor circuit formed thereon (see FIG. 20). That is, the second conductor circuit is formed on the insulating layer, so that they are used as one set for the formation of the multi-layer.

In this case, a via-hole ranging from an outermost surface of an outermost insulating layer to a surface of either second conductor circuit may be formed (see FIG. 20).

Furthermore, it is favorable that the black oxide film is also formed on the surface of the second conductor circuit. Likewise the innerlayer conductor circuit and the portion irradiated by the laser beam for the formation of the via-hole is an exposed portion having no black oxide film (see the following embodiment 3).

Moreover, the printed wiring board obtained by the above method is, for example, a printed wiring board comprising an insulating layer, an innerlayer conductor circuit arranged adjacent to the insulating layer and provided on its surface with a black oxide film and a via-hole extending from an outermost surface of the insulating layer to the innerlayer conductor circuit, characterized in that an exposed portion having no black oxide film is formed on the innerlayer conductor circuit in a position corresponding to the bottom of the via-hole.

In such a printed wiring board, the black oxide film is not existent on the portion of the innerlayer conductor circuit corresponding to the bottom of the via-hole, so that the innerlayer conductor circuit is exposed at this portion. The laser beam is hardly absorbed on this portion.

Therefore, when the laser beam is irradiated to the insulating layer for forming the via-hole in the insulating layer, it prevents abnormally heating the innerlayer conductor circuit and also prevents damage due to fusion of the innerlayer conductor circuit or the like.

As mentioned above, according to the third aspect of the invention, there can be provided the multilayer printed wiring board causing no damage in the innerlayer conductor circuit in the formation of the via-hole through the laser beam.

A fourth aspect of the invention lies in a printed wiring board including two or more insulating layers located on an innerlayer conductor circuit, a via-hole extending from an outermost surface of the insulating layer through the two or more insulating layers to the innerlayer conductor circuit, and an inner metal plated film formed in the via-hole and electrically connecting the innerlayer conductor circuit to an outer conductor circuit formed on the outermost surface, characterized in that an annular middle land having an opening hole is arranged so as to protrude into the inside of the via-hole, and the via-hole is a stepped via-hole consisting of an outer via-hole segment located outside the annular middle land and an inner via-hole segment located at the side of the innerlayer conductor circuit and having a diameter smaller than that of the outer via-hole segment and a stepped portion located at the annular middle land, and the inner metal plated film is a stepped plated film formed along inner wall faces of the outer via-hole segment and the inner via-hole segment.

The function of the fourth aspect of the invention will be described below.

In the printed wiring board according to the fourth aspect of the invention is arranged the annular middle land having an opening hole so as to protrude into the inside of the via-hole. And also, the via-hole is a stepped via-hole having a stepped portion on the annular middle land. Furthermore, the inner metal plated film is a stepped plated film formed along the inner wall faces of the outer via-hole segment and the inner via-hole segment.

The annular middle land is exposed in the stepped portion of the via-hole. Such an exposed portion is a ring having an outer diameter equal to the diameter of the outer via-hole segment and an inner diameter equal to the diameter of the inner via-hole segment. This portion contacts with the inner metal plated film forming the stepped plated film (see FIG. 27).

The inner metal plated film hardly joins to the exposed portion of the insulating layer in the via-hole, but can strongly join to the annular middle land. Therefore, the inner metal plated film is joined to the exposed portion of the annular middle land, whereby it can strongly be joined to the inside of the via-hole.

And also, the side face of the opening hole in the annular middle land is exposed to the via-hole, so that the inner metal plated film can also be joined to this portion.

Therefore, the peeling and dropping of the inner metal plated film can be prevented.

Now, a boundary conductor circuit as mentioned later may be arranged in a boundary portion. However, when the via-hole is formed in a portion having no boundary conductor circuit, a thickness of an opening peripheral edge of the via-hole becomes thinner by a thickness of the boundary conductor circuit as compared with a place having the boundary conductor circuit arranged in the boundary portion. As a result, a depression corresponding to the thickness of the boundary conductor circuit is formed in the opening peripheral edge of the via-hole.

When the annular middle land is arranged, the thickness of the annular middle land thickens the thickness of the opening peripheral edge of the via-hole, so that the occurrence of the depression in the opening peripheral edge of the via-hole can be prevented.

As mentioned above, according to the fourth aspect of the invention, there can be provided the printed wiring board wherein the inner metal plated film is strongly joined to the inside of the via-hole.

It may be favorable that the annular middle land is a dummy land not connected to the boundary conductor circuit arranged in the boundary portion facing two or more insulating layers adjacent to each other.

Thus, when many insulating layers are laminated, even if via-holes are formed in portions of these insulating layers having no boundary conductor circuit, the occurrence of the depression in the opening peripheral edge of the via-hole can be prevented.

Also, it may be favorable that the annular middle land is an electrically conductive land connecting to the boundary conductor circuit arranged in the boundary portion facing two or more insulating layers adjacent to each other.

In this case, three or more conductor layers can be connected to each other through one via-hole. Therefore, the wiring area of the via-hole and land is reduced, so that it is possible to make a high densification.

The annular middle land is preferable to be made of a metal such as copper, nickel or the like.

As the method of manufacturing the above printed wiring board, there is, for example, a method of manufacturing a printed wiring board by arranging two or more insulating layers on an innerlayer conductor circuit, forming a via-hole so as to extend from an outermost surface of the insulating layer through the two or more insulating layers to the innerlayer conductor circuit, forming an inner metal plated film in the via-hole to electrically conduct the innerlayer conductor circuit to an outer conductor circuit arranged on the outermost surface, arranging an annular middle land having an opening hole so as to protrude into the inside of the via-hole, wherein the via-hole is a stepped via-hole consisting of an outer via-hole segment located outside the annular middle land and an inner via-hole segment located at the side of the innerlayer conductor circuit and having a diameter smaller than that of the outer via-hole segment and a stepped portion located at the annular middle land, and the inner metal plated film is a stepped plated film formed along inner wall faces of the outer via-hole segment and the inner via-hole segment, characterized in that the via-hole is formed by irradiating a laser beam from the outermost surface toward the innerlayer conductor circuit in which the laser beam is arrived to the innerlayer conductor circuit through the opening hole of the annular middle land and irradiated to a range required for forming the diameter of the outer via-hole segment, and the metal plated film is formed after the formation of the via-hole.

According to this manufacturing method, the printed wiring board wherein the inner metal plated film is strongly joined to the inside of the via-hole can be provided likewise the fourth aspect of the invention.

Since the via-hole is formed by the irradiation of the laser beam, via-holes having a very fine diameter of not more than 300 µm can easily be obtained.

As mentioned above, according to this method, there can easily be manufactured a printed wiring board having fine-diameter via-holes in which the inner metal plated film is strongly joined to the inside of the via-hole.

The formation of the via-hole through the laser beam is carried out by irradiating the laser beam to a portion forming the via-hole. As the laser beam, it is favorable to use a carbon dioxide gas laser having a large energy and an excimer laser having no heat affection.

Also, in the formation of the via-hole by the irradiation of the laser beam, the insulating layers are vaporized and removed by a high energy to successively form a hole toward the inside of the printed wiring board.

In this case, the laser beam forming the neighborhood of the outer diameter of the via-hole is reflected on the annular middle land. Therefore, the insulating layer existing beneath the annular middle land remains as it is.

Furthermore, the laser beam forming a central portion of the via-hole passes through the opening hole of the annular middle land to vaporize and remove a further lower insulating layer. Thereafter, when the laser beam arrives at the innerlayer conductor circuit, it is reflected by the innerlayer conductor circuit made of the metal. Therefore, the irradiation of the laser beam stops at this time.

Thus, the via-hole formed by the laser beam is large in the outer diameter at a position above the annular middle land and small in the outer diameter located beneath the annular middle land.

That is, a stepped via-hole having a stepped portion can be formed.

It may be preferable for the annular middle land to be a dummy land not connecting to the boundary conductor circuit arranged in the boundary portion facing the two or more insulating layers adjacent to each other.

It may also be preferable for the annular middle land is preferable to be an electrically conductive land connecting to the boundary conductor circuit arranged in the boundary portion facing the two or more insulating layers adjacent to each other.

In any case, the same function and effect as mentioned above can be obtained.

A fifth aspect of the invention lies in a printed wiring board including two or more insulating layers on an innerlayer conductor circuit, a via-hole extending from an outermost surface of the insulating layer through the two or more insulating layers to the innerlayer conductor circuit and an inner metal plated film formed in the via-hole so as to electrically connect the innerlayer conductor circuit to an outer conductor circuit arranged on the outermost surface, characterized in that an annular dummy land for reinforcement having an opening hole around the via-hole is arranged in a boundary portion facing the two or more insulating layers to each other and is joined to the inner metal plated film.

In the printed wiring board, an innerlayer conductor circuit may be arranged in the boundary portion, but the annular dummy land is separately arranged so as not to connect to such an innerlayer conductor circuit and is a reinforcing land. The annular dummy land is favorably made of a metal such as copper nickel or the like.

The function of the fifth aspect of the invention will be described below.

In the printed wiring board according to the fifth aspect of the invention, the annular reinforcing dummy land is arranged around the via-hole and is joined to the inner metal plated film in the via-hole.

The inner metal plated film hardly joins to an exposed portion of the insulating layer in the via-hole, but strongly joins to the side face of the annular dummy land. Therefore, the inner metal plated film is strongly joined to the inside of the via-hole.

As a result, the peeling and dropping-out of the inner metal plated film can be prevented.

Now, the innerlayer conductor circuit may be arranged in the boundary portion, but when the via-hole is formed in a portion having no innerlayer conductor circuit, an opening peripheral edge of the via-hole becomes thinner by a thickness of the innerlayer conductor circuit as compared with a portion having the innerlayer conductor circuit. For this end, a depression corresponding to the thickness of the innerlayer conductor circuit is formed in the opening peripheral edge of the via-hole. This is particularly liable to be caused in the via-hole formed by passing through four or more insulating layers (see FIG. 33). The occurrence of the depression in the opening peripheral edge of the via-hole can be prevented by arranging the annular dummy land.

As mentioned above, according to the fifth aspect of the invention, there can be provided the printed wiring board in which the inner metal plated film is strongly joined to the inside of the via-hole.

Also, the printed wiring board obtained in the fifth aspect of the invention can be used in, for example, memory modules, multi-chip modules, mother boards, daughter boards, plastic packages or the like which require connection reliability.

In the annular dummy land it is favorable to have an outer diameter larger than the diameter of the via-hole and to include an opening hole having a diameter equal to the diameter of the via-hole.

Thus, the annular dummy land can be more stably arranged and also the reinforcing effect can be enhanced.

As the method of manufacturing the above printed wiring board, there is a method of manufacturing a printed wiring board including two or more insulating layers on an innerlayer conductor circuit, a via-hole extending from an outermost surface of the insulating layer through the two or more insulating layers to the innerlayer conductor circuit and an inner metal plated film formed in the via-hole so as to electrically connect the innerlayer conductor circuit to an outer conductor circuit arranged on the outermost surface, wherein an annular dummy land for reinforcement having an opening hole around the via-hole is arranged in a boundary portion facing the two or more insulating layers adjacent to each other and is joined to the inner metal plated film, characterized in that the via-hole is formed by irradiating a laser beam from the outermost surface toward the innerlayer conductor circuit in which the laser beam is arrived to the innerlayer conductor circuit through the opening hole of the annular dummy land, and thereafter the inner metal plated film is formed.

According to this method, a printed wiring board wherein the inner metal plated film is strongly joined to the inside of the via-hole can be obtained.

Since the via-hole is formed by the irradiation of the laser beam, via-holes having a very fine diameter of not more than 300 μm can easily be obtained.

As mentioned above, according to this method, there can easily be manufactured a printed wiring board having fine-diameter via-holes in which the inner metal plated film is strongly joined to the inside of the via-hole.

The formation of the via-hole through the laser beam is carried out by irradiating the laser beam to a portion forming the via-hole. As the laser beam, it is favorable to use a carbon dioxide gas laser having a large energy and an excimer laser having no heat affection.

Also, in the formation of the via-hole by the irradiation of the laser beam, the insulating layers are vaporized and removed by a high energy to successively form a hole toward the inside of the printed wiring board. When the laser beam arrives at the innerlayer conductor circuit, it is reflected by the innerlayer conductor circuit made of the metal. Therefore, the irradiation of the laser beam stops at this time.

In the annular dummy land it is favorable to have an outer diameter larger than the diameter of the via-hole and include an opening hole having a diameter equal to the diameter of the via-hole.

Thus, the annular dummy land can be more stably arranged and also the reinforcing effect can be enhanced.

A sixth aspect of the invention lies in a printed wiring board comprising an insulating layer, an upper conductor circuit arranged on an upper surface of the insulating layer, a lower conductor circuit arranged on a lower surface thereof, a blind via-hole passing through the insulating layer between the upper conductor circuit and the lower conductor circuit and bottomed at the lower conductor circuit and a via-plated layer formed on an inner wall face of the blind via-hole so as to electrically connect the upper conductor circuit to the lower conductor circuit, characterized in that a flowing hole of a plating solution having a diameter smaller than the blind via-hole is formed in the lower conductor circuit constituting the bottom of the blind via-hole.

The diameter of the flowing hole of the plating solution differs in accordance with the diameter of the blind via-hole, but when the diameter of the blind via-hole is 0.1~0.3 mm, the diameter of the flowing hole of the plating solution is preferable to be 0.01~0.1 mm.

Thus, the uniform via-plated layer can be obtained.

Moreover, when the diameter of the flowing hole is less than 0.01 mm, it is feared that the object of flowing the plating solution can not be attained. While, when it exceeds 0.1 mm, the hole is not closed with the plated film and it is feared to cause a problem that a leakage of a solder is created in the filling of the solder.

The function of the sixth aspect of the invention will be described below.

In the printed wiring board according to the sixth aspect of the invention, the flowing hole of the plating solution having a diameter smaller than the blind via-hole is formed in the lower conductor circuit constituting the bottom of the blind via-hole.

In the formation of the via-plated layer, the plating solution can be flowed through the flowing hole into the inside and outside of the blind via-hole. For this end, the plating solution sufficiently containing a plating component always contacts with the inner wall face of the blind via-hole, so that the uniform via-plated layer can be obtained without causing a spotted state.

Therefore, there can be obtained a printed wiring board having an excellent electric conduction between the upper conductor circuit and the lower conductor circuit or an excellent connection reliability therebetween.

As mentioned above, according to the sixth aspect of the invention, there can be provided a printed wiring board wherein the via-plated layer is uniformly formed on the blind via-hole without causing the spotted state.

The printed wiring board obtained in the sixth aspect of the invention can be used in, for example, memory modules, multi-chip modules, mother boards, daughter boards, plastic packages or the like which require high connection reliability.

Of course, the sixth aspect of the invention is applicable to not only the printed wiring board having a single insulating layer but also the printed wiring board having plural insulating layers.

It is preferable that the flowing hole of plating solution is closed with the via-plated layer. Thus, a quantity of the solder can be uniform.

It is favorable that the diameter of the flowing hole of plating solution is 10~40% of the diameter of the blind via-hole. Thus, the flowing of the plating solution can be sufficiently carried out. On the other hand, when the diameter of the flowing hole is less than 10% of the diameter of the blind via-hole, the flowing of the plating solution may not be attained. While, when it is more than 40%, the closing of the hole by plating may be insufficient.

As the method of manufacturing the above printed wiring board, there is a method of manufacturing a printed wiring board including an insulating layer, an upper conductor circuit arranged on an upper surface of the insulating layer, a lower conductor circuit arranged on a lower surface thereof, a blind via-hole passing through the insulating layer between the upper conductor circuit and the lower conductor circuit and bottomed at the lower conductor circuit and a via-plated layer formed on an inner wall face of the blind via-hole so as to electrically connect the upper conductor circuit to the lower conductor circuit, wherein a flowing hole of a plating solution having a diameter smaller than the blind via-hole is formed in the lower conductor circuit constituting the bottom of the blind via-hole, characterized in that the blind via-hole is formed by irradiating a laser beam from the upper surface of the insulating layer toward the lower conductor circuit, and the flowing hole of the plating solution is formed in the lower conductor circuit through the laser beam in the formation of the blind via-hole, and a chemical plating solution is flowed in the blind via-hole and the flowing hole of the plating solution to form a chemical plated layer in the blind via-hole, and thereafter an electroplating is carried out by flowing an electroplating solution to form the via-plated layer.

In this manufacturing method, the electroplating is carried out by utilizing the flowing hole of the plating solution formed in the lower conductor circuit and flowing the electroplating solution to form the via-plated layer. In this case, the electroplating solution can sufficiently flow to the outside and inside of the blind via-hole through the flowing hole of the plating solution. Thus, the uniform via-plated layer can be obtained without causing the spotted state.

Since the via-hole is formed by the laser beam, via-holes having a smaller diameter can be obtained, so that it is easy to manufacture a printed wiring board having high density and accuracy.

Moreover, the formation of via-hole through the laser beam is carried out by irradiating the laser beam to a portion forming the via-hole. As the laser beam, it is favorable to use a carbon dioxide gas laser having a large energy and an excimer laser having no heat affection.

In the formation of the via-hole by the irradiation of the laser beam, the insulating layer is vaporized and removed by a high energy to successively form the via-hole toward the inside of the printed wiring board. When the laser beam arrives at the lower conductor circuit, it is reflected on the lower conductor circuit made of a metal. Therefore, the irradiation of the laser beam stops at this time.

Also, the energy of the laser beam is high in the central portion and low in the peripheral edge portion. Therefore, the flowing hole of the plating solution can be easily formed in the central portion of the lower conductor circuit constituting the bottom of the blind via-hole by using the laser beam.

It is favorable that an exposed portion of the insulating layer for the formation of the flowing hole of the plating solution (i.e. a portion having no innerlayer conductor circuit) is previously formed in the innerlayer conductor circuit. The laser beam is reflected because the lower conductor circuit is made of a metal such as copper foil or the like. By forming the exposed portion, the insulating layer located above the exposed portion is vaporized and removed, whereby the flowing hole of the plating solution can be obtained.

A seventh aspect of the invention lies in a method of manufacturing a printed wiring board including a step of forming an upper pattern on an upper surface of an insulating substrate in a peripheral edge of a portion for the formation of an electric conduction hole, a step of forming a lower pattern closing the portion for the formation of the electric conduction hole on a lower surface of the insulating substrate, a step of forming the electric conduction hole in the insulating substrate, and a step of a metal plated film on an inner wall face of the electric conduction hole by a chemical plating treatment and an electroplating treatment, characterized in that the electroplating treatment is carried out by applying a current having a current density of 0.8~1.4 $A/dm^2$ to a chemical plated film covering the inner wall face of the electric conduction hole at a state of immersing the insulating substrate in an electroplating bath.

The function and effect of the seventh aspect of the invention will be described below.

In the seventh aspect of the invention, the current density of the current applied to the chemical plated film is made smaller than that of the conventional technique as mentioned above. For this end, a thick plated film can be formed in the inner wall face of the electric conduction hole. Therefore, the mechanical strength of the metal plated film becomes high and the electric connection reliability of the electric conduction hole is improved.

Also, the metal plated film having a sufficient thickness can be formed even on the inner wall face of the electric conduction hole having a smaller diameter, so that the high density packaging of the electric conduction hole can be realized.

Moreover, the step of forming the upper pattern, the step of forming the lower pattern and the step of forming the electric conduction hole may be conducted either way and are not in order.

The metal plated film is preferably copper. In this case, a metal plated film having a good ductility and a small electric resistance can be formed.

The electroplating treatment is favorably carried out two or more times. Thus, the metal plated film having a thicker thickness can be formed in a short time. And also, the thickness of the metal plated film can be uniform. On the other hand, when the electroplating treatment is conducted only one time, a long time is taken in the formation of the thick metal plated film.

The upper pattern and lower pattern mean any electric conducting patterns formable on the surface of the insulating substrate such as wiring circuit, pad, terminal, land and the like, which may be formed, for example, by etching of a metal foil, a metal plating or the like.

As the insulating substrate, there are synthetic resin alone, prepreg and the like. As the synthetic resin, there are epoxy resin, phenolic resin, polyimide resin, polybutadiene resin, fluorine resin and so on.

The printed wiring board is composed of a single insulating substrate or of a laminate of two or more insulating substrates. In case of the laminate of two or more insulating substrates, the electric conduction hole may pass through all insulating substrates or may pass through a part of the insulating substrates.

The above printed wiring board can be used in, for example, memory modules, multi-chip modules, mother boards, daughter boards, plastic packages or the like.

As the formation of the electric conduction hole, there are, for example, a method of irradiating a laser beam to a hole forming portion of the insulating layer, a method of chemically melting a hole forming portion of the insulating layer and the like.

An eighth aspect of the invention lies in a printed wiring board including an insulating substrate, a conductor pattern formed on a surface of the insulating substrate, a solder filling hole passing through the insulating substrate and arriving at an upper surface of the conductor pattern and a solder filled in the solder filling hole, characterized in that the insulating substrate includes fibers therein, and end portions of the fibers protrude from a wall face of the solder filling hole and encroach into the solder.

The function and effect of the eighth aspect of the invention will be described below.

In the eighth aspect of the invention, the end portions of the fibers included in the insulating substrate protrude from the wall face of the solder filling hole. These end portions of the fibers encroach into the solder filled in the solder filling hole. Therefore, the solder is strongly bonded to the solder filling hole. As a result, even when the printed wiring board is subjected to dynamic action from the exterior, the solder never gets out of the solder filling hole.

Since the end portions of the fibers protruded from the wall face of the solder filling hole encroach into the solder, even when the insulating substrate is a thin sheet of about 0.05-0.20 mm and a bonding area between the solder and the solder filling hole is small, the solder never gets out of the solder filling hole. In the protrusion of the end portions of the fibers from the wall face of the solder filling hole, there is, for example, a method of conducting the formation of the solder filling hole through a laser beam.

The fiber is preferably one or more of glass fiber, resin fiber and ceramic fiber. Thus, the encroaching force of the fiber into the inside of the solder is increased and the bonding strength between the solder and the solder filling hole is more increased.

The fibers are included in the insulating substrate at a state of, for example, felt or cloth.

As the method of producing the above printed wiring board, there is a method of a printed wiring board by filling a solder into an inside of a solder filling hole, characterized in that a conductor pattern is first formed on a surface of an insulating substrate including fibers, and then a laser beam is irradiated to a portion of the insulating substrate not covered with the conductor pattern toward the conductor pattern to form a solder filling hole at a state of protruding end portions of the fibers included in the inside of the insulating substrate from a wall face of the solder filling hole, and thereafter a solder is filled into the inside of the solder filling hole.

In the method of the eighth aspect, the solder filling hole is formed by the irradiation of the laser beam, whereby the end portions of the fibers are left in the wall face of the solder filling hole. Therefore, the end portions of the fibers can easily protrude from the wall face of the solder filling hole.

Also, the laser beam can form the solder filling hole in only the insulating substrate, in which the conductor pattern covering an opening portion of the solder filling hole can be left as it is. For this end, the production step can be simplified by forming conductor patterns on front and back surfaces of the insulating substrate before the formation of the solder filling hole.

The fiber is preferable to be one or more of glass fiber, resin fiber and ceramic fiber. Thus, the encroaching force of the fiber into the inside of the solder is increased and the bonding strength between the solder and the solder filling hole is more increased.

The fibers are included in the insulating substrate at a state of, for example, felt or cloth.

A ninth aspect of the invention lies in a printed wiring board including at least two insulating layers, an innerlayer conductor circuit between the insulating layers, a blind via-hole formed from an outermost surface toward the innerlayer conductor circuit, and a solder filled in the inside of the blind via-hole, characterized in that the blind via-hole has an uneven form at a section of its wall face.

The function of the ninth aspect of the invention will be described below.

In the printed wiring board according to the ninth aspect of the invention, the wall face of the blind via-hole has a section of uneven form.

Therefore, the solder filled in the blind via-hole comes into the unevenness and is fixed thereto. As a result, the solder can provide a high bonding strength to the blind via-hole.

The printed wiring board obtained in the ninth aspect of the invention can be used in, for example, memory modules, multi-chip modules, mother boards, daughter boards, plastic packages or the like which require high connection reliability.

As the above uneven form, there are preferably a concave form widening in a lateral direction of the blind via-hole, a convex form protruding inward in the blind via-hole, and a wavy form (see FIG. 52, FIG. 54, FIG. 55 as mentioned later).

In this way, the filled solder can surely be bonded to the inside of the blind via-hole.

It is favorable that the solder filled in the blind via-hole is connected to another PC board through a solder ball.

Thus, the electric conduction between the PC board and the blind via-hole can surely be held.

Moreover, the PC board includes various boards provided with printed circuits. Concretely, there are mentioned mother boards, daughter boards, memory modules, multi-chip modules, card modules and the like for various apparatus.

As the method of producing the above printed wiring board, there is a method of producing a printed wiring board, which include at least two insulating layers, an innerlayer conductor circuit between the insulating layers, a blind via-hole formed from an outermost surface toward the innerlayer conductor circuit and having an uneven form at a section of its wall face, and a solder filled in the inside of the blind via-hole, characterized in that the blind via-hole is formed by irradiating a laser beam, and thereafter molten solder is flowed into the blind via-hole.

According to the above method, there can be produced the printed wiring board in which the section of the wall face of the blind via-hole is uneven form.

Therefore, the solder filled in the blind via-hole can come into the unevenness. As a result, the solder can provide a high bonding strength to the blind via-hole.

And also, the blind via-hole is formed by the irradiation of the laser beam, so that a very fine size of not more than 300 μm can be obtained.

The formation of the blind via-hole through the laser beam is carried out by irradiating a laser beam to a portion forming the blind via-hole. As the laser beam, it is favorable to use a carbon dioxide gas laser having a large energy and an excimer laser having no heat affection.

In the formation of the blind via-hole by the irradiation of the laser beam, the insulating layer is vaporized and removed by a high energy to successively form the via-hole toward the inside of the printed wiring board. When the top of the laser beam arrives at the innerlayer conductor circuit, the laser beam is reflected on the innerlayer conductor circuit made of a metal. Therefore, the irradiation of the laser beam stops at this time.

Moreover, it is favorable that the insulating substrate is comprised of a prepreg obtained by impregnating a resin into a substrate of glass cloth or the like because the blind via-hole having a section of irregular form can be obtained only by the irradiation of the laser beam.

This is due to the fact that when the insulating substrate is vaporized and removed by the laser beam, the resin portion is removed before the substrate portion.

Next, a tenth aspect of the invention is a method of forming a mounting recess portion by utilizing a technique of forming holes through the irradiation of the laser beam.

That is, the tenth aspect of the invention lies in a method of producing a printed wiring board including a mounting recess portion for mounting an electronic part, a conductor pattern, and a heat-sink plate arranged at the bottom of the mounting recess portion, characterized in that a conductor pattern is formed on an insulating substrate;

a heat-sink plate is adhered to a lower face of a portion of the insulating substrate forming the mounting recess portion; and a laser beam is irradiated to an upper face of the portion forming the mounting recess portion to form a mounting recess portion.

The function and effect of the tenth aspect of the invention will be described below.

In the tenth aspect of the invention, as shown in FIG. 56, after the portion of the insulating substrate forming the mounting recess portion is covered with the heat-sink plate, the mounting recess portion is formed by the irradiation of the laser beam. Therefore, an opening portion having a desired size can easily be obtained.

In the tenth aspect of the invention, the laser beam is irradiated toward the portion forming the mounting recess portion to form the mounting recess portion ranging from the surface of the printed wiring board to the heat-sink plate adhered to the opposite side thereof.

In this case, the portion of the insulating substrate forming the mounting recess portion is vaporized and removed by a high energy of the laser beam to successively form a hole toward the inside of the insulating substrate. When the top of the laser beam arrives at the heat-sink plate, the laser beam is reflected on the heat-sink plate. Therefore, the irradiation of the laser beam stops at this time. Thus, there can be formed the mounting recess portion of non-passing type in which one opening portion is covered with the heat-sink plate.

Even when the insulating substrate is thin, the mounting recess portion can be formed without damaging the insulating substrate.

Further, the bottom of the mounting recess portion is a surface of the heatsink plate. Therefore, an electronic part is mounted onto the surface of the heat-sink plate in the inside of the mounting recess portion. As a result, the mounting recess portion having excellent heat dissipation properties can be formed.

Even in case of forming the mounting recess portion passing through a plurality of insulating substrates, it is not required to form a through-hole for the formation of the mounting recess portion in every insulating substrate as in the conventional technique. Furthermore, the positioning of the insulating substrates for connecting the through-holes to each other is useless. Therefore, according to the tenth embodiment of the invention, the mounting recess portion can be formed easily and accurately.

It is preferable to use a method of producing a printed wiring board in which the insulating substrate is comprised by laminating two or more insulating layers and a conductor pattern is formed in the inside of the insulating substrate. Thus, a high density wiring of the printed wiring board can be realized.

The thickness of the heat-sink plate is preferably 0.01-2 mm. In this case, a high strength is obtained at the bottom of the mounting recess portion and also the working of the heat-sink plate becomes easy. However, when it is less than 0.01 mm, the strength at the bottom of the mounting recess portion becomes low and there may be breakage in the heat-sink plate. However, when it exceeds 2 mm, the working of the heat-sink plate may be difficult.

As the laser beam, there are used, for example, a carbon dioxide gas laser, an excimer laser and the like.

As the insulating substrate, use may be made of a synthetic resin alone, a resin substrate of synthetic resin and inorganic filler, a cloth substrate of synthetic resin and inorganic cloth and the like. As the synthetic resin, there are, for example, epoxy resin, phenolic resin, polyimide resin, polybutadiene resin, fluoride resin and so on. The insulating substrate made of only such a synthetic resin may be used as a prepreg or a solder resist to be interposed between the other insulating substrates.

As the inorganic filler added to the synthetic resin, there are glass fibers, silica powder, mica powder, alumina, carbon and the like. The substrate made of a mixture of the synthetic resin and the inorganic filler is higher in strength as compared with the synthetic resin alone.

Also, the cloth substrate is a substrate made of a cloth woven or knitted in cloth form and a synthetic resin such as glass epoxy substrate, glass polyimide substrate or the like. As such a cloth substrate, there is a substrate obtained by impregnating the cloth with a synthetic resin. As a material of the cloth, there are glass fiber cloth, carbon cloth, aramide cloth and the like. As the synthetic resin, the same material as mentioned above is used.

The conductor pattern means a conductive pattern formed in a plane direction of the insulating substrate such as wiring pattern, pads, lands, terminals and the like. The conductor pattern may be formed by an etching of a metal foil, a metal plating or the like.

The printed wiring board obtained in the tenth aspect of the invention can be used in, for example, memory modules, multi-chip modules, mother boards, daughter boards, plastic packages or the like.

DETAILED DESCRIPTION OF PREFERRED EMBODIMENTS

Embodiment 1

The production method of a first embodiment of the printed wiring board according to the first aspect of the invention is described with reference to FIG. 1 to FIG. 7.

Figure 6:
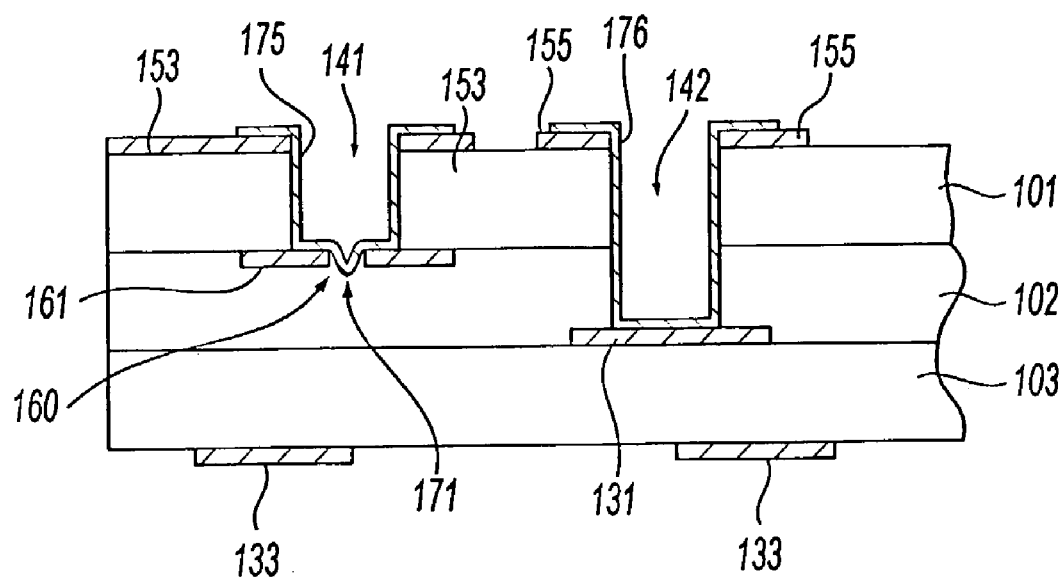
FIG. 6 is a diagrammatic section view of the printed wiring board having metal plated films formed on blind via-holes in Embodiment 1.

At first, the printed wiring board to be produced in this embodiment comprises three insulating layers of a synthetic resin 101, 102, 103, innerlayer conductor circuits 161, 131 formed between these insulating layers 101-103 and blind via-holes 141, 142 formed from an outermost surface of the insulating layers 101-103 toward the innerlayer conductor circuits 161, 131 as shown in FIG. 6.

Also, metal plated films 175, 176 extending from the innerlayer conductor circuits 161, 131 to outer conductor circuits 153, 155 are formed on inner wall faces of the blind via-holes 141, 142. Moreover, an outer conductor circuit 133 is located at a lower face.

The production method of the above printed wiring board is described below.

Figure 1A:
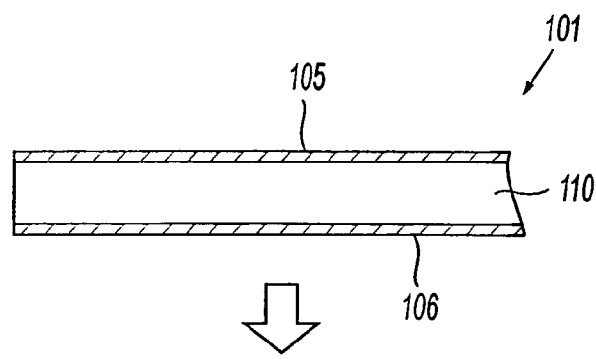
FIGS. 1(A)-1(D) are flow charts illustrating lamination steps of a printed wiring board in Embodiment 1.

As shown in FIG. 1(A), there is provided a first insulating layer 101. The first insulating layer is a copper clad laminate formed by adhering copper foils 105, 106 to upper and lower faces of a resin substrate 110. The resin substrate 110 is a film made of a polyimide resin.

Figure 1B:
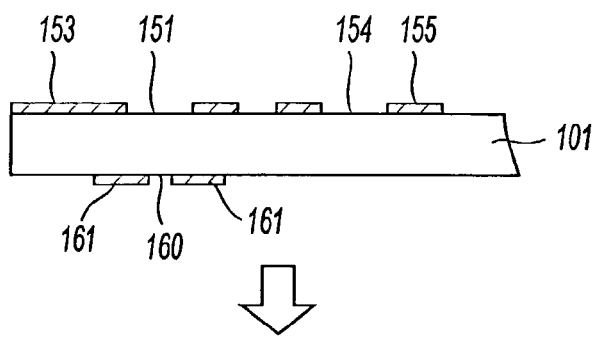

As shown in FIG. 1(B), the first insulating layer 101 is etched to form laser beam irradiating holes 151, 154 and outer conductor circuits 153, 155 in the upper face copper foil 105 and an innerlayer conductor circuit 161 in the lower face.

Figure 3:
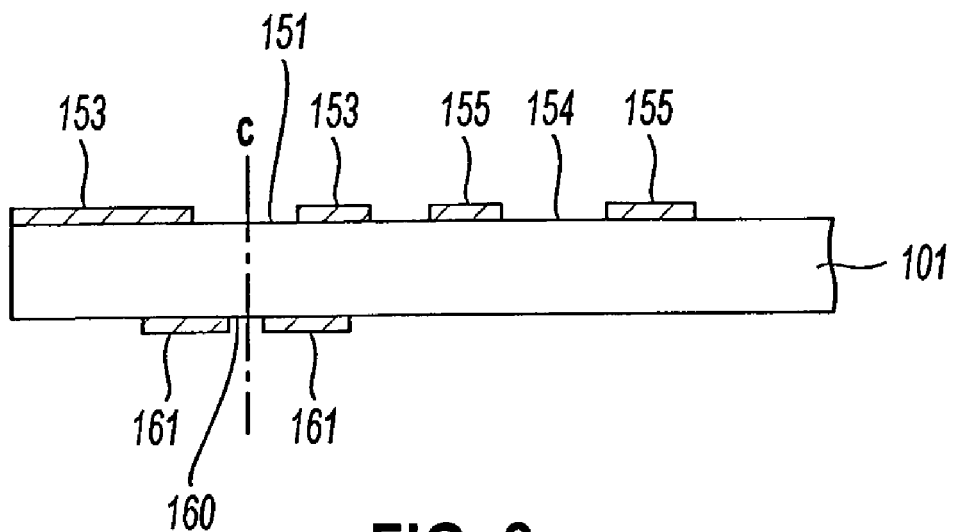
FIG. 3 is an enlarged diagrammatic view of a first insulating layer in Embodiment 1.
Figure 4:
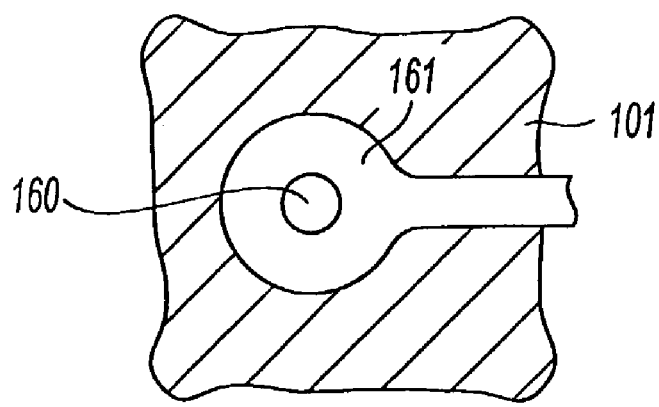
FIG. 4 is a bottom view of an innerlayer conductor circuit provided with an opening hole in Embodiment 1.

Noteworthily, as shown in FIGS. 1, 3 and 4, the innerlayer conductor circuit 161 has an opening hole 160 at its central portion. A center line C of the opening hole 160 is coincident with a center line of the laser beam irradiating hole 151 (FIG. 3).

Figure 1C:
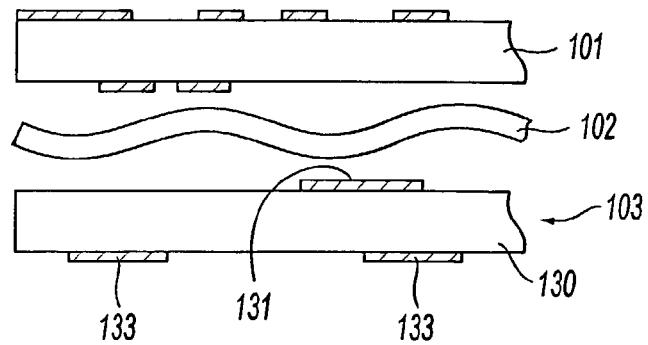

As shown in FIG. 1(C), there are provided a second insulating layer 102 using a prepreg as an adhesion sheet and a third insulating layer 103 separately formed. The second insulting layer 102 is a glass polyimide material. The third insulating layer 103 comprises a cloth substrate 130, an innerlayer conductor circuit 131 formed on an upper face thereof and lower outer conductor circuits 133 formed on a lower face thereof. The cloth substrate 130 is formed by impregnating a glass cloth with a polyimide resin.

Figure 1D:
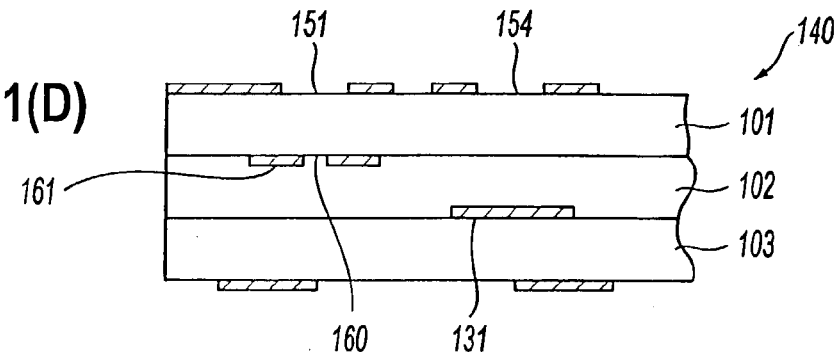

Then, the second insulating layer 102 and the first insulating layer 101 are successively piled on the above insulating layer 103 and thereafter hot-pressed as shown in the same figure. Thus, as shown in FIG. 1(D), these layers are integrally united with each other to provide a laminate 140 having the laser beam irradiating holes 151, 154 on its upper face. The laser beam irradiating holes 151, 154 meet with the innerlayer conductor circuits 161, 131.

The innerlayer conductor circuits 161, 131 have a diameter of 0.25 mm, while the innerlayer conductor circuit 161 has the opening hole 160 having a diameter of 0.05 mm in its central portion. The opening hole 160 corresponds to 50% of a diameter of a blind via-hole (100 μm).

Figure 2A:
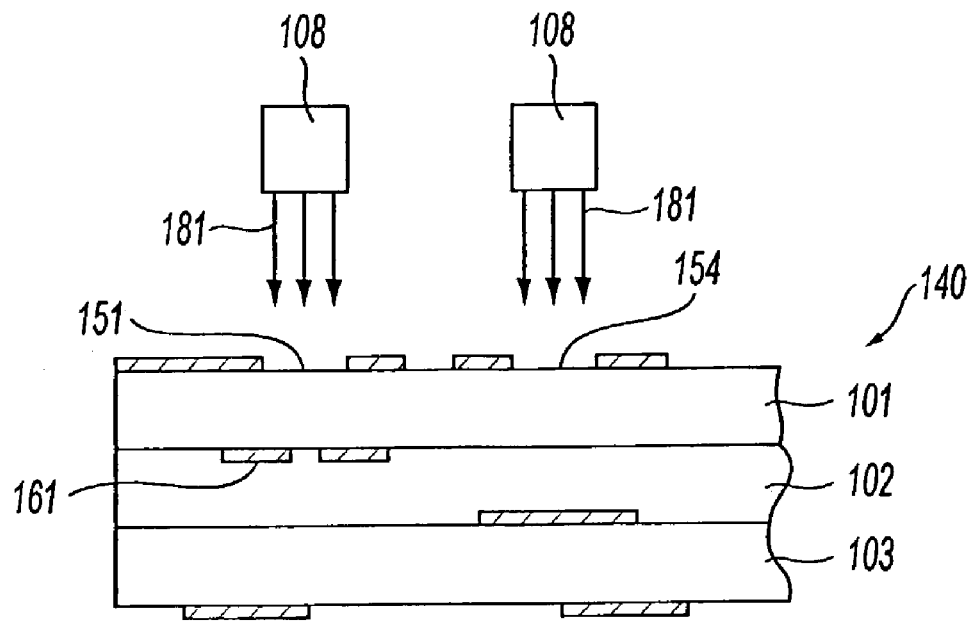
FIGS. 2(A)-2(B) are diagrammatic views illustrating the formation of blind via-holes through laser beam in Embodiment 1.

As shown in FIG. 2(A), laser beams having the same output are simultaneously irradiated from laser beam oscillators 108 toward the laser beam irradiating holes 151, 154. Among these laser beams 181, a laser beam irradiated to the laser beam irradiating hole 151 forms a hole while vaporizing and removing the resin substrate of the first insulating layer 101. Finally, the laser beam 181 arrives at the innerlayer conductor circuit 161 of the copper foil to form a shallower blind via-hole 141. As a result, the laser beam 181 is reflected on the innerlayer conductor circuit 161.

At this time, however, the laser beam 108 irradiated to the laser beam irradiating hole 154 is still forming a deeper blind via-hole 142 and does not yet arrive at the innerlayer conductor circuit 131. For this end, the laser beams 181 are continuously irradiated to both innerlayer conductor circuits 161, 131.

Figure 2B:
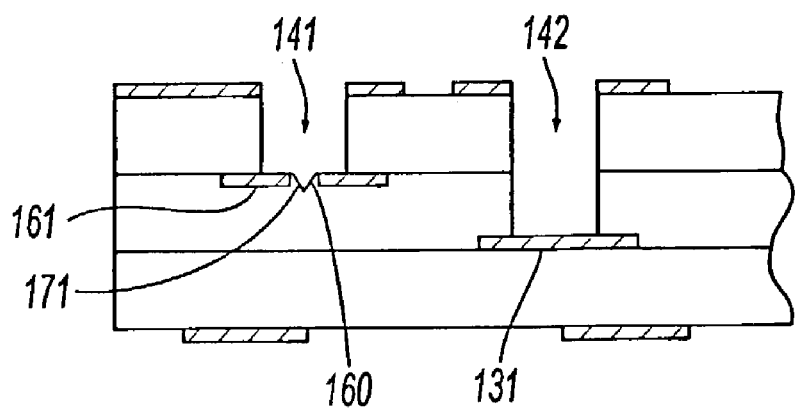
Figure 5:
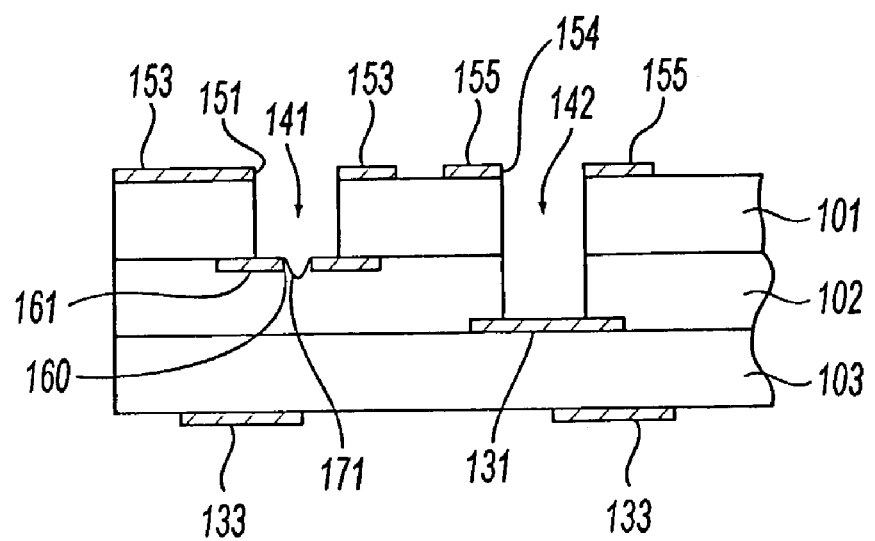
FIG. 5 is a diagrammatic section view of the printed wiring board having blind-via-holes through hole formation in Embodiment 1.
Figure 7:
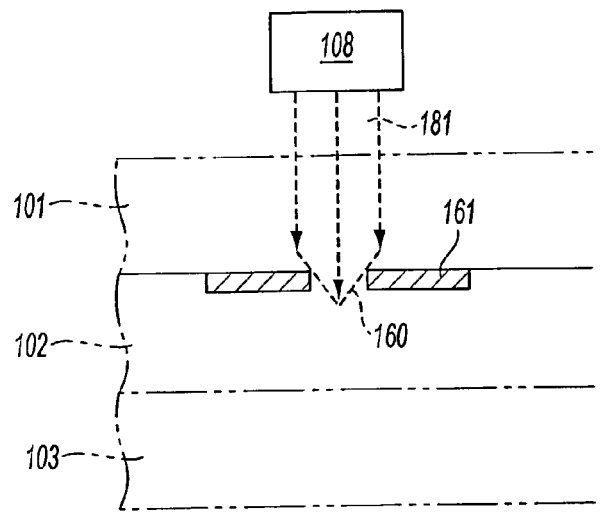
FIG. 7 is a diagrammatic view illustrating an irradiation of laser beam in Embodiment 1.

In this case, the laser beam 181 irradiated to the innerlayer conductor circuit 161 irradiates the second insulating layer 102 through the opening hole 160 formed in the central portion of the innerlayer conductor circuit 161 as shown in FIG. 7. Therefore, as shown in FIG. 2(B) and FIG. 5, a surplus hole 171 is formed beneath the opening hole 160. Moreover, the laser beam irradiated to the innerlayer conductor circuit 161 is weak and is reflected thereon, so that it does not damage the innerlayer conductor circuit.

When the laser beam 181 irradiated toward the innerlayer conductor circuit 131 arrives at the innerlayer conductor circuit 131, the laser beam 181 is reflected by the innerlayer conductor circuit 131. At this time, the irradiation of the laser beams 181 is stopped.

As the laser beam is used an excimer laser having a wavelength of 248 nm and an output of 50 W.

Thus, a shallow blind via-hole 141 having a depth of 0.08 mm and a deep blind via-hole 142 having a depth of 0.16 mm are formed in the printed wiring board as shown in FIG. 4. The blind via-holes 141, 142 have a diameter of about 100 μm.

Thereafter, as shown in FIG. 6, metal plated films 175, 176 are formed from an inside of the blind via-hole 141, 142 to an opening portion thereof by an electroless copper plating process. The metal plated film 175, 176 covers an upper face of the innerlayer conductor circuit 161, 131, a wall face of the blind via-hole 141, 142, and an opening portion of the blind via-hole in the outer conductor circuit 153, 155. Particularly, the metal plated film 175 is formed even in the surplus hole 171 located beneath the opening hole 160 in the central portion of the innerlayer conductor circuit 161.

In this way, a printed wiring board in which the innerlayer conductor circuits 161, 131 formed in the layers are electrically connected through the metal plated films 175, 176 formed in the blind via-holes 141, 142 is obtained.

As mentioned above, according to this embodiment, the opening hole 160 is formed in the innerlayer conductor circuit 161 forming the shallow blind via-hole. Therefore, even when the laser beam 181 is irradiated to the innerlayer conductor circuit in the previously formed blind via-hole in succession, a central portion of the laser beam 181 having a large energy passes through the opening hole 160 (FIG. 7).

The laser beam 181 passed through the opening hole is irradiated to only the second insulating layer 102 beyond the opening hole 160. As a result, the second insulating layer 102 beyond the opening hole in the innerlayer conductor circuit 161 is somewhat drilled, but there is no damage in the innerlayer conductor circuit 161 itself.

Moreover, damage is not caused in the innerlayer conductor circuit 131 beyond the deep blind via-hole 142 because the irradiation is stopped in the reflection of the laser beam 181.

Insides the thus formed blind via-holes 141, 142 having different depths are formed the metal plated films 175, 176. In this case, damage through the laser beam is not caused in both innerlayer conductor circuits as mentioned above, so that a state of forming insufficient metal plated film as described in the conventional technique can be avoided and hence the metal plated film having an excellent electric conductivity can be formed.

Embodiment 2

The production method of a second embodiment of the printed wiring board according to the second aspect of the invention is described with reference to FIG. 8 to FIG. 10.

Figure 8:
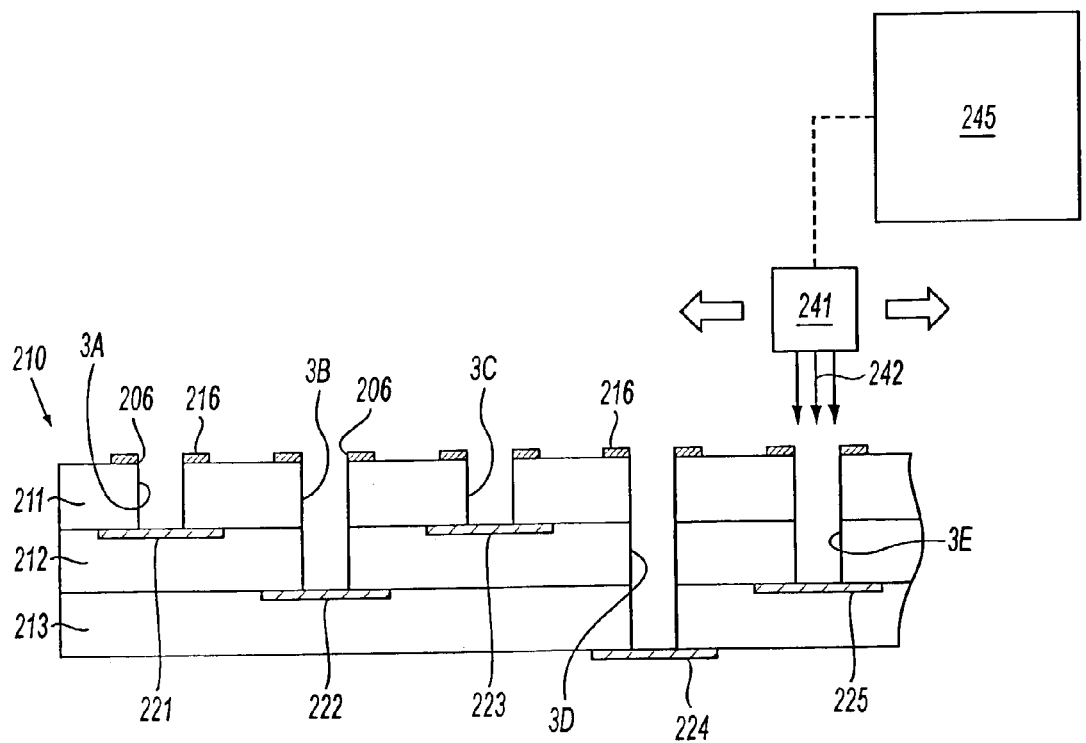
FIG. 8 is a diagrammatic section view illustrating the formation of blind via-holes through laser beam in Embodiment 2 and taken along an axis Y-Y in FIG. 9.
Figure 9:
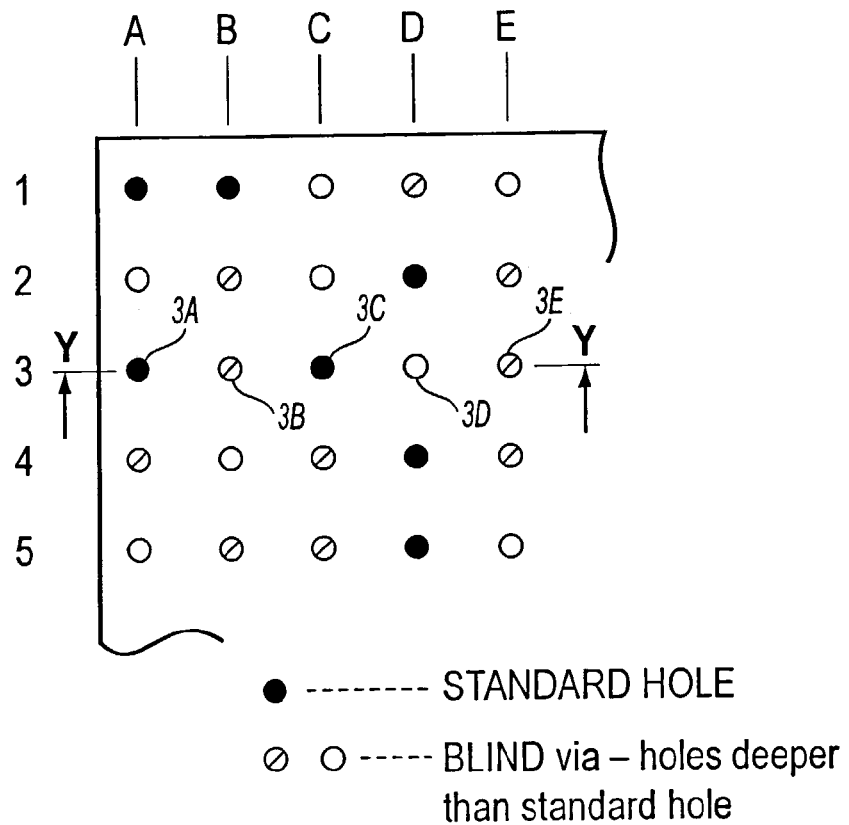
FIG. 9 is a diagrammatic plan view of the printed wiring board provided with blind via-holes in Embodiment 2.

At first, the printed wiring board 210 to be produced in this embodiment comprises three insulating layers 211, 212, 213 made of a synthetic resin, innerlayer conductor circuits 221~225 arranged between the insulating layers 211-213, and blind via-holes 3A~3E formed from an outermost surface of the printed wiring board 210 toward the innerlayer conductor circuits 221~225 as shown in FIG. 8 and FIG. 9.

Figure 10:
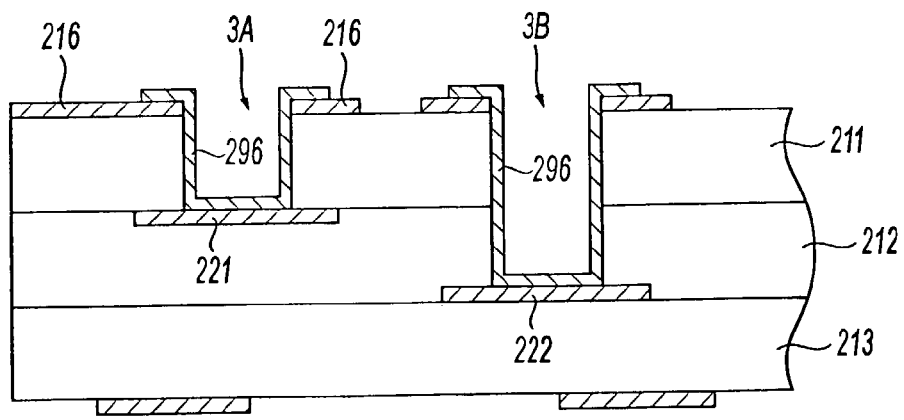
FIG. 10 is a diagrammatic view of the printed wiring board in Embodiment 2.

As shown in FIG. 10, metal plated films 296 extending from the innerlayer conductor circuits to each of outer conductor circuits 216 formed on the upper face of the printed wiring board are formed in inner walls of the blind via-holes 3A~3E.

In FIG. 8, a lower face conductor circuit 224 is arranged on a lower side face of the printed wiring board, which is called an innerlayer conductor circuit here.

As seen from the comparison of FIG. 8 with FIG. 9, the blind via-holes are formed at intersects of lines 1~5 with rows A~E in the printed wiring board 210 as shown in FIG. 9. For example, the blind via-holes 3A~3E having different depths as shown in FIG. 8 are formed in a Y-Y section of FIG. 9.

Among them, 3A and 3C are shallow blind via-holes and correspond to standard holes, and 3B and 3E are deeper blind via-holes, and 3D is a deepest blind via-hole. Moreover, 3A~3E indicate blind via-holes in a third line and rows A~E shown in FIG. 9.

The production method of the above printed wiring board is described below.

First, there is used a standard laser beam 242 having an energy strength required for the formation of the standard hole 3A, 3C as a shallowest blind via-hole. The standard holes 3A, 3C are formed by irradiating the standard laser beam 242 once, while the deeper and deepest blind via-holes 3B, 3D, 3E are formed by irradiating the standard laser beam 242 plural times.

Moreover, the printed wiring board 210 is prepared by forming the innerlayer conductor circuit and insulating layer every layer, for example, through a subtractive process, and laminating and hot-pressing them.

Also, the innerlayer conductor circuit 216 located on an upper and outer face is provided with an opening hole 206 for the formation of the blind via-hole extending to the innerlayer conductor circuits 221~225. The standard laser beam 242 is irradiated to the opening hole. In this embodiment, glass polyimide is used as the insulating layer.

As shown in FIG. 8, a laser beam oscillator 241 emitting the standard laser beam 242 is electrically connected to a coordinates control device 245 for moving and controlling the laser beam oscillator 241 to each irradiation position or a position of a blind via-hole to be formed.

The laser beam oscillator is provided with X-Y moving machine (not shown) moving in directions of lines and rows or X-Y directions shown in FIG. 9.

The X-Y moving machine is controlled by the coordinates control device 245, whereby the laser beam oscillator 241 is stopped in a position of a blind via-hole to be formed during the irradiation of the standard laser beam 242.

And also, the laser beam oscillator 241 is provided with an oscillator spottedly irradiating the standard laser beam 242 and if necessary, an adjuster adjusting the energy strength of the standard laser beam 242.

Moreover, the energy strength of the standard laser beam 242 irradiated to the same kinds of printed wiring boards is the same, so that the adjuster adjusts the energy strength in accordance with the kind of the printed wiring board, if necessary.

In this embodiment, the standard laser beam is used at a wavelength of 10.6 μm and an output of 3000 W for an irradiation time of 0.01 second by means of a $CO_2$ laser. In this way, as shown in FIG. 8, the standard holes 3A, 3C are a shallow blind via-hole having a depth of 0.08 mm, the deeper blind via-holes 3B, 3E having a depth of 0.16 mm, and the deepest blind via-hole 3D are formed in the printed wiring board 210. All of the blind via-holes 3A~3E have a diameter of about 100 μm.

In the formation of the above blind via-holes, there is used the standard laser beam 242 having an energy strength required for the formation of the standard holes 3A, 3C as a shallowest blind via-hole. The standard holes 3A, 3C are formed by irradiating the standard laser beam 242 once. Also, the blind via-boles 3B, 3E deeper than the standard hole are formed by irradiating the standard laser beam 242 two times. Furthermore, the deepest blind via-hole is formed by irradiating the standard laser beam 242 three times.

According to this embodiment, many blind via-holes are divided into the standard holes 3A, 3C and the other blind via-holes and it is enough to determine the irradiation number of the standard laser beam 242 in accordance therewith. Moreover, the blind via-holes other than the standard holes 3A, 3C have several kinds of depths, but the depth of each of the blind via-holes may previously be known in the design of the printed wiring board 210. Therefore, the irradiation number for every blind via-hole may previously be set.

The laser beam oscillator 241 is moved to a coordinate point indicating the position of each blind via-hole (FIG. 8) to emit the standard laser beam 242. The movement and stopping at the coordinate point are carried out by N/C control of the X-Y moving machine through the coordinates control device 245 for positioning.

In this embodiment, there is adopted a method wherein the standard laser beam is successively moved to adjoining blind via-holes and irradiated once (standard hole) or plural times for every hole in accordance with the depth.

After the formation of the holes, as shown in FIG. 10, a metal plated film 296 is formed by an electroless copper plating process so as to extend from an inside of the blind via-holes 3A~3E to an opening portion thereof. The metal plated films cover the upper faces of the innerlayer conductor circuits, wall faces of the blind via-holes and the opening portions of the blind via-holes in the outer conductor circuits 216.

According to this embodiment, it is sufficient to irradiate the standard laser beam once or plural times in accordance with the depth of the blind via-hole as mentioned above, so that the time required for the formation of many blind via-holes is shortened and the cost can be decreased. Also, it is sufficient to control whether or not the irradiation is plural times, so that the cost of the apparatus can be decreased. Furthermore, many blind via-holes having different depths can easily be formed.

Embodiment 3

A third embodiment of the printed wiring board according to the third aspect of the invention and the production method thereof are described with reference to FIG. 11 to FIG. 24.

Figure 20:
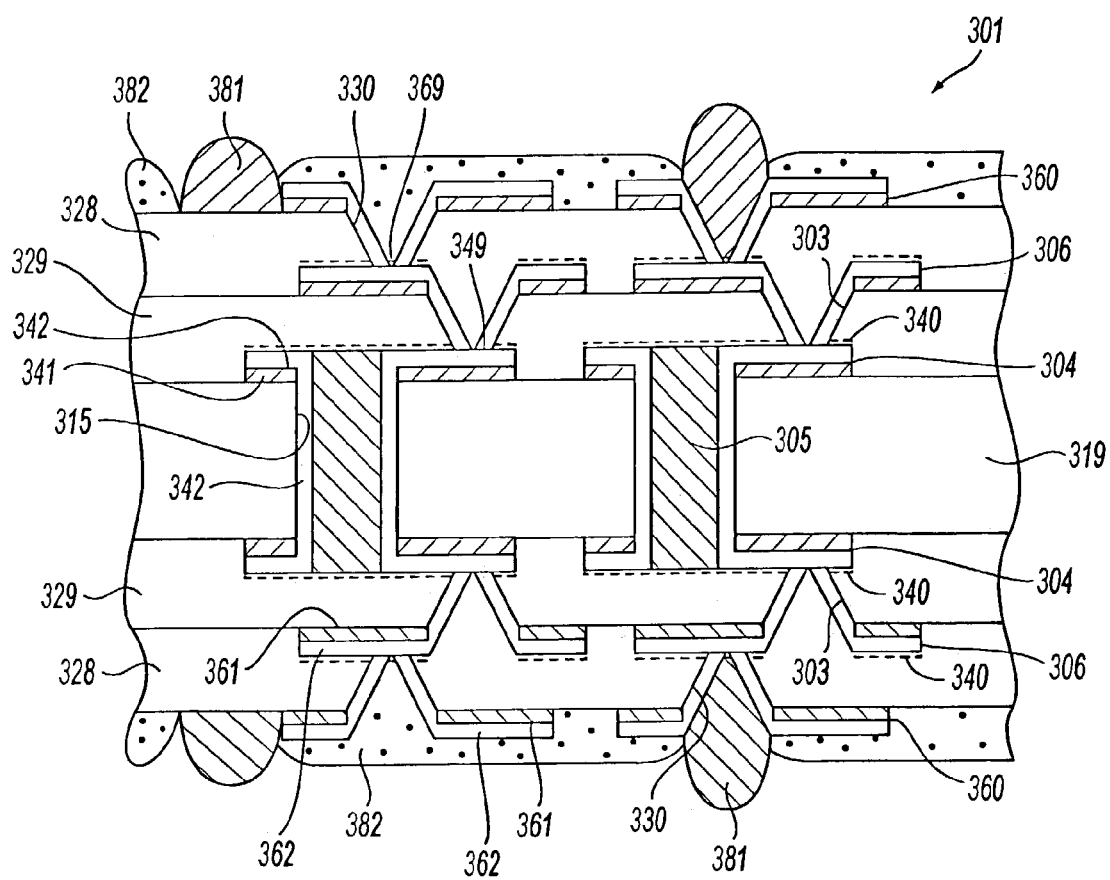
FIG. 20 is a diagrammatically section view of the printed wiring board in Embodiment 3.

As shown in FIG. 20, the printed wiring board 301 of this embodiment comprises insulating layers 329, 328, an innerlayer conductor circuit 304 arranged adjacent to the insulating layer 329 and provided on its surface with a black oxide film 340, and a via-hole 303 extending from an outermost face of the insulating layer 329 to the innerlayer conductor circuit 304.

Also, an exposed portion 349 having no black oxide film 340 on the innerlayer conductor circuit 304 is formed on a portion of the innerlayer conductor circuit 304 located at the bottom of the via-hole 303.

The details of the printed wiring board 301 are described below.

As shown in FIG. 20, the printed wiring board 301 comprises an innerlayer plate 319 provided with the innerlayer conductor circuit 304, two insulating layers 329, 328 placed on each surface of the innerlayer plate 319, and second conductor circuits 306, 360 formed on surfaces of the insulating layers 329, 328. Moreover, the second conductor circuit 360 is an outer conductor circuit in the printed wiring board 301.

In the innerlayer plate 319 are formed through-holes 315 filled with a solder 305, and the electric conduction of the innerlayer conductor circuits 304 formed on both surfaces of the innerlayer plate 319 is ensured by the through-hole 315.

The innerlayer conductor circuit 304 is comprised of a copper foil pattern 341 and a metal plated film 342 formed on the surface thereof. Also, as mentioned later, the black oxide film 340 is formed for ensuring an adhesion property to the insulating layer 329 laminated thereon.

In the formation of the via-hole 303, a laser beam is irradiated to the insulating layer 329. The irradiated portion forms the exposed portion having no black oxide film 340.

On both sides of the innerlayer plate 319 are formed the insulating layers 329. The second conductor circuits 306 are formed on the surface of the insulating layer 329. The second conductor circuit 306 is comprised of a copper foil pattern 361 and a metal plated film 362 likewise the above innerlayer conductor circuit 304, and the black oxide film 340 and the exposed portion 349 are also formed on the surface of the second conductor circuit 306.

Then, another insulating layer 328 is arranged on the insulating layer 329, and the second conductor circuit 360 as an outer conductor circuit is further formed on the surface thereof. Also, a via-hole 303 extending from an outermost surface to the second conductor circuit 306 is formed on the insulating layer 328.

Solder balls 382 are arranged on the surface of the insulating layer 328 and the via-holes 303. Also, the surface of the second conductor circuit 360 is covered with a solder resist 382.

Figure 13:
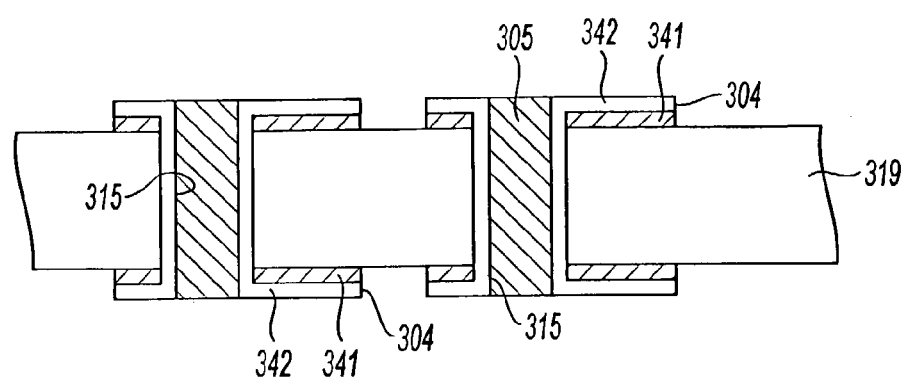
FIG. 13 is a diagrammatic view illustrating the formation of innerlayer conductor circuits in the production method of the printed wiring board subsequent to FIG. 12.
Figure 14:
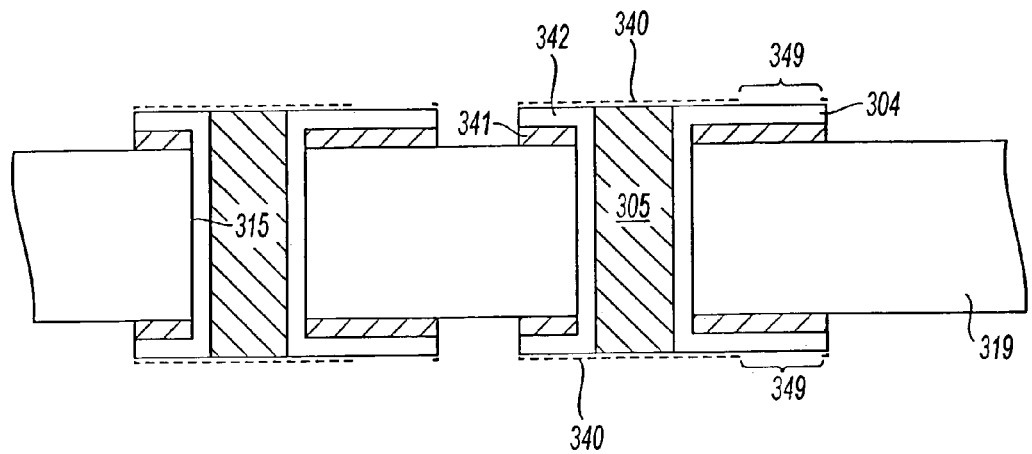
FIG. 14 is a diagrammatic view illustrating the formation of black oxide film and exposed portion in the production method of the printed wiring board subsequent to FIG. 13.
Figure 18:
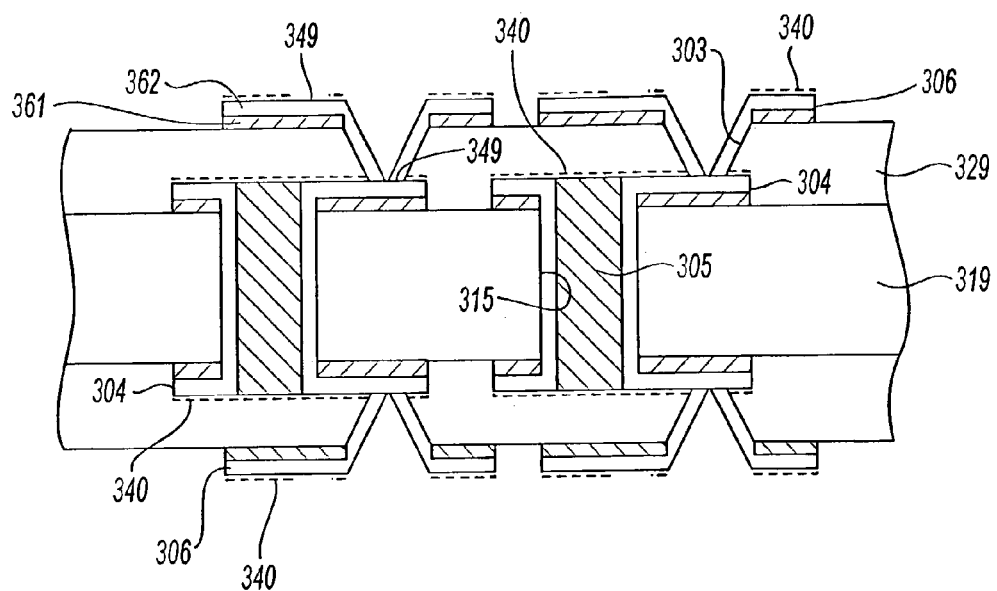
FIG. 18 is a diagrammatic view illustrating the formation of second conductor circuits in the production of the printed wiring board subsequent to FIG. 17.

In the production of the above printed wiring board 301, the innerlayer conductor circuit 304 is formed on the surface of the innerlayer plate 319 (FIG. 13), and the black oxide film 340 is formed on the surface of the innerlayer conductor circuit 304 (FIG. 14). Then, the second conductor circuit 306 is formed through the insulating layer 329 and the laser beam is irradiated to form the via-hole 303 extending from the outermost surface of the insulating layer 329 to the innerlayer conductor circuit 304. Thereafter, the metal plated film 362 is formed on the inner wall face of the via-hole 303 (FIG. 18).

The details of the production method are described below.

Figure 11:
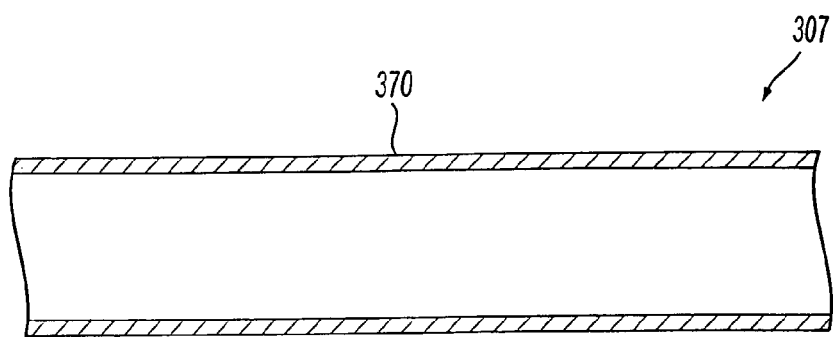
FIG. 11 is a diagrammatic view of a copper clad laminate as an innerlayer plate in the method of producing a printed wiring board according to Embodiment 3.
Figure 12:
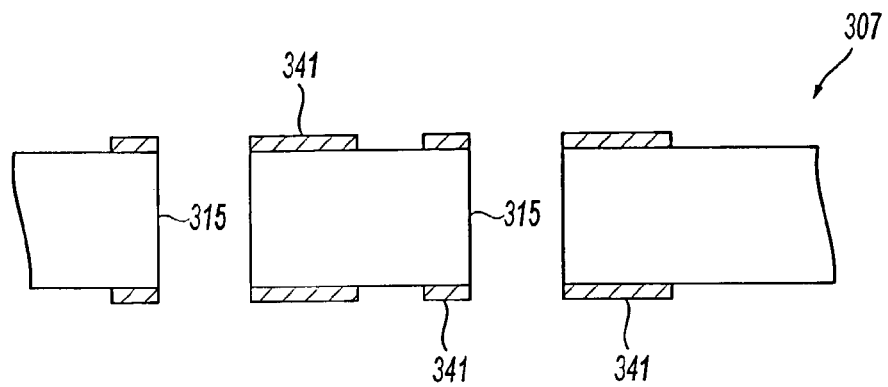
FIG. 12 is a diagrammatic view illustrating the formation of through-holes in the production method of the printed wiring board subsequent to FIG. 1.

At first, as shown in FIG. 11, there is provided a copper clad laminate 307 having a copper foil 370 on its surface. Then, the copper foil 370 is patterned by etching to form a copper foil pattern 341 as shown in FIG. 12. Thereafter, through-holes 315 are formed in the copper clad laminate 307.

As shown in FIG. 13, metal plated films 342 are formed on inner wall faces of the through-holes 315 and the copper foil patterns 341 by electroless copper plating. Thus, there are obtained innerlayer conductor circuits 304 electrically connected to the through-holes 315. Thereafter, solder 305 is filled in the through-hole 315.

As shown in FIG. 14, a black oxide film 340 is formed on the innerlayer conductor circuit 304 by a black oxide treatment.

The black oxide treatment is described with reference to the following drawings.

Figure 21:
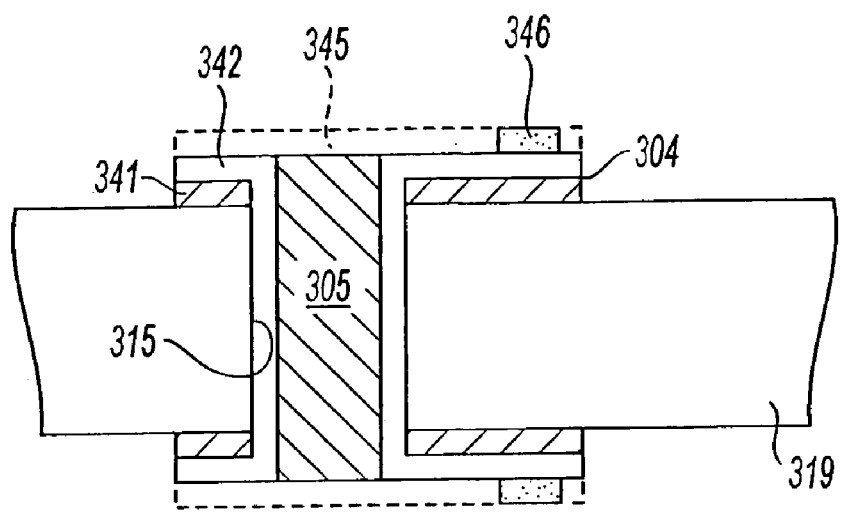
FIG. 21 is a diagrammatic view illustrating masks formed on the surface of the innerlayer conductor circuit in Embodiment 3.

First, as shown in FIG. 21, a film 345 is formed on a full surface of the innerlayer conductor circuit 304. Then, the film 345 is removed by etching so as to leave a portion corresponding to the exposed portion 349 on the surface of the innerlayer conductor circuit 304.

Figure 22:
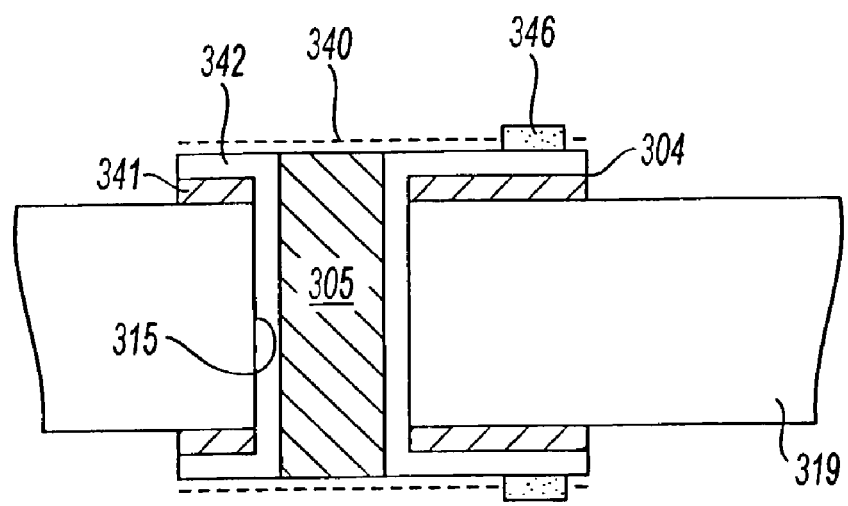
FIG. 22 is a diagrammatic view illustrating black oxide films formed on the surface of the innerlayer conductor circuit in Embodiment 3.

Next, as shown in FIG. 22, the surface of the innerlayer conductor circuit 304 is subjected to a chemical treatment, whereby the surface of the innerlayer conductor circuit 304 is oxidized to form a black oxide film 340 made of a black copper oxide. In this case, the portion corresponding to the mask 346 is not oxidized, and hence the black oxide film 340 is not formed.

Thereafter, the mask 346 is peeled and removed by etching. Thus, the exposed portion 349 is formed as shown in FIG. 14.

Figure 15:
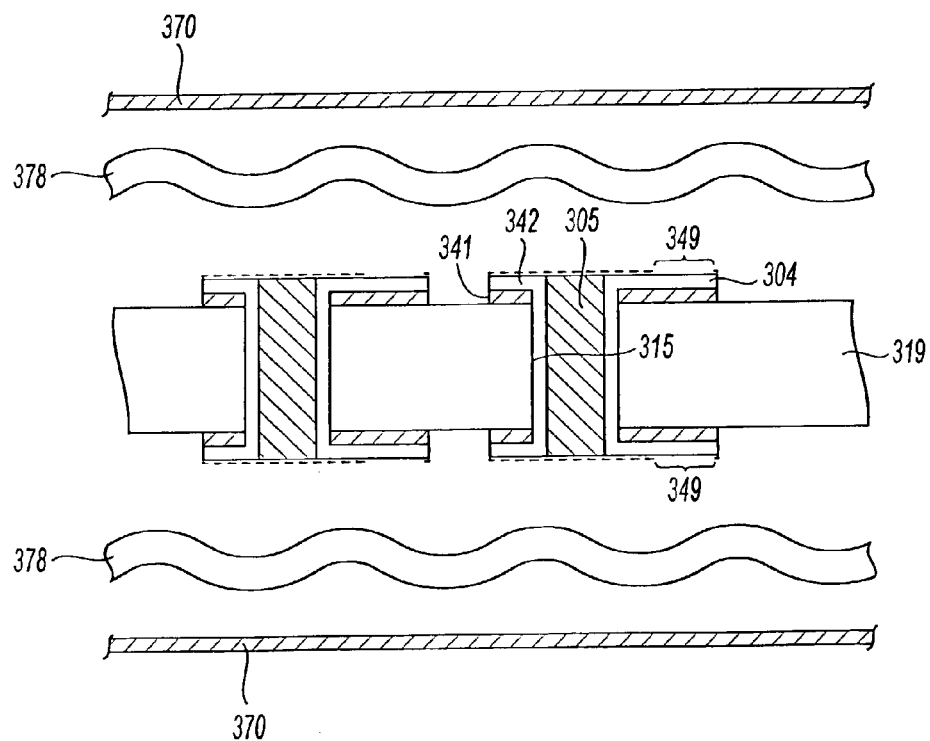
FIG. 15 is a diagrammatic view illustrating the lamination of prepreg and copper foil in the production of the printed wiring board subsequent to FIG. 14.
Figure 16:
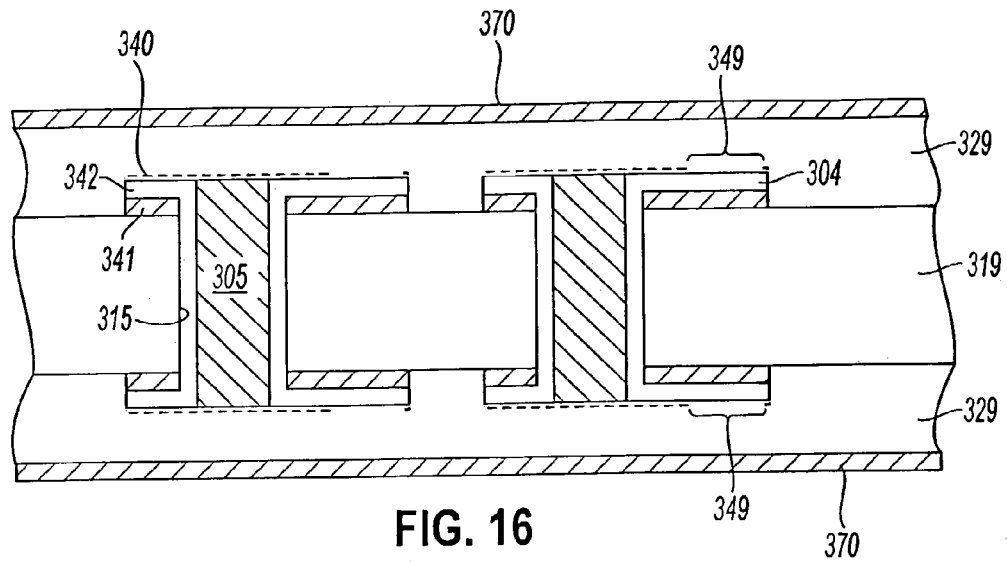
FIG. 16 is a diagrammatic view illustrating the formation of insulating layers in the production of the printed wiring board subsequent to FIG. 15.

Then, prepregs 378 and copper foils 370 are laminated on both surfaces of the innerlayer plate 319 and pressed together as shown in FIG. 15. Thus, there is obtained a laminate comprised of the innerlayer plate 319, insulating layers 329 and copper foils 370 as shown in FIG. 16.

Figure 17:
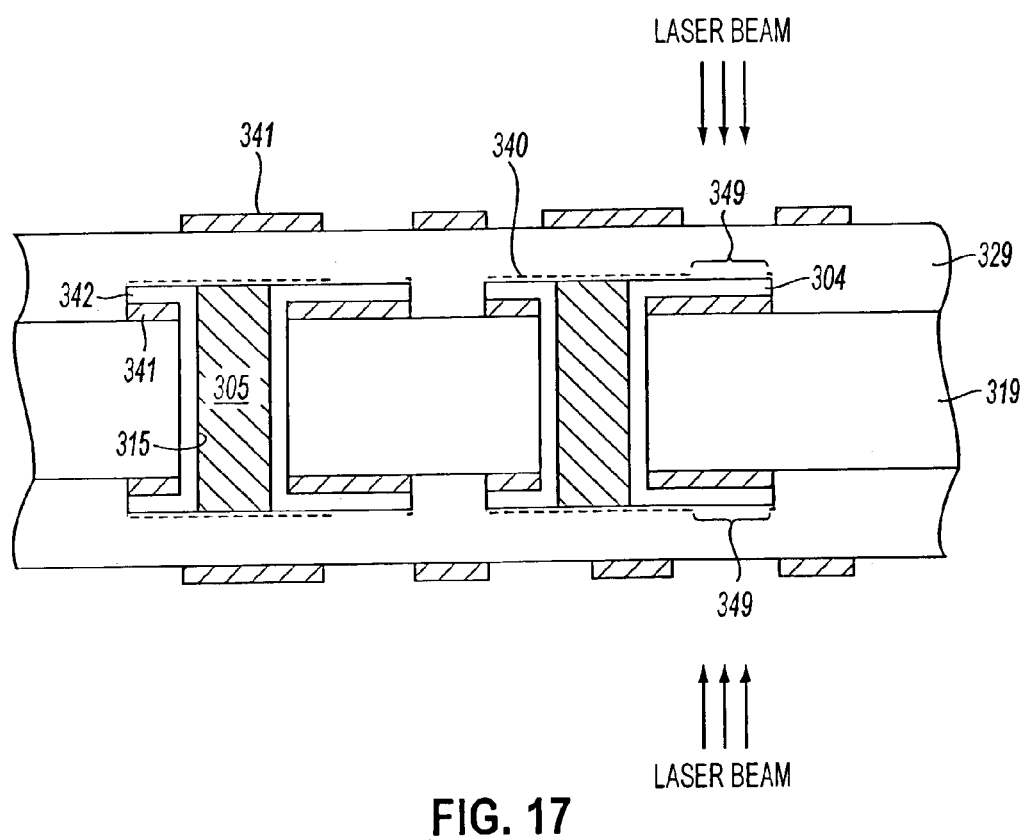
FIG. 17 is a diagrammatic view illustrating the patterning of copper foil in the production of the printed wiring board subsequent to FIG. 16.
Figure 23:
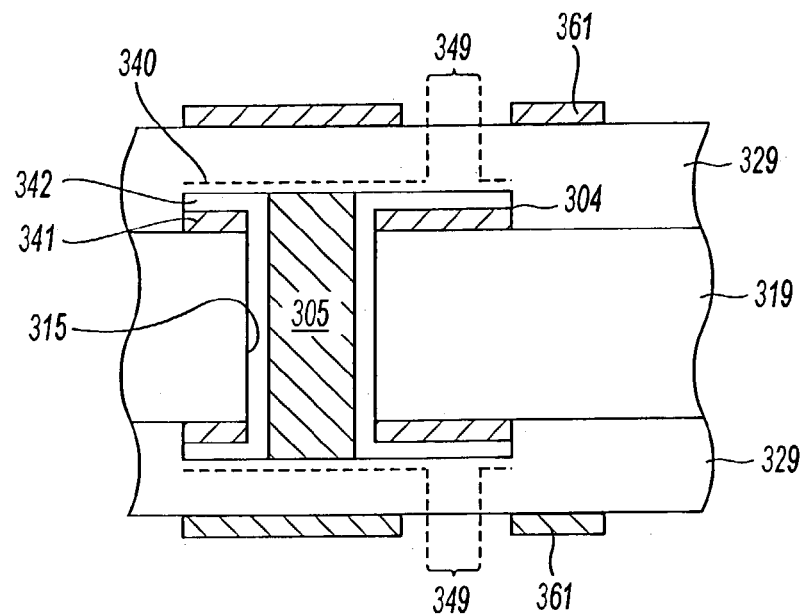
FIG. 23 is a diagrammatic view illustrating copper foil pattern as a second conductor circuit and exposed portion in Embodiment 3.
Figure 24:
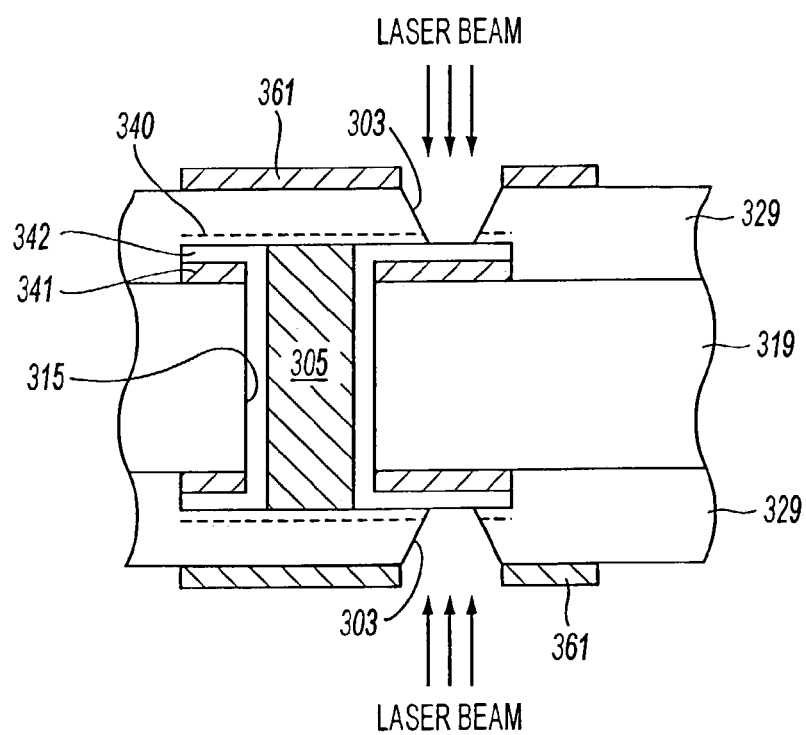
FIG. 24 is a diagrammatic view illustrating the formation of via-holes by irradiation of laser beam in Embodiment 3.

As shown in FIGS. 17 and 23, the copper foil 370 is rendered into a copper foil pattern by patterning. Then, as shown in FIG. 24, a laser beam is irradiated to form via-holes 303 on the insulating layer 329.

Moreover, an excimer laser is used at a wavelength of 248 nm and an output of 50 W as the laser beam.

As shown in FIG. 18, metal plated films 362 are formed on inner wall faces of the via-holes 303 and the copper foil pattern 361 by the same electroless plating as in the copper foil pattern 341.

Further, a black oxide film 340 is formed on the second conductor circuit 306 by the same black oxide treatment as in the innerlayer conductor circuit 304.

Figure 19:
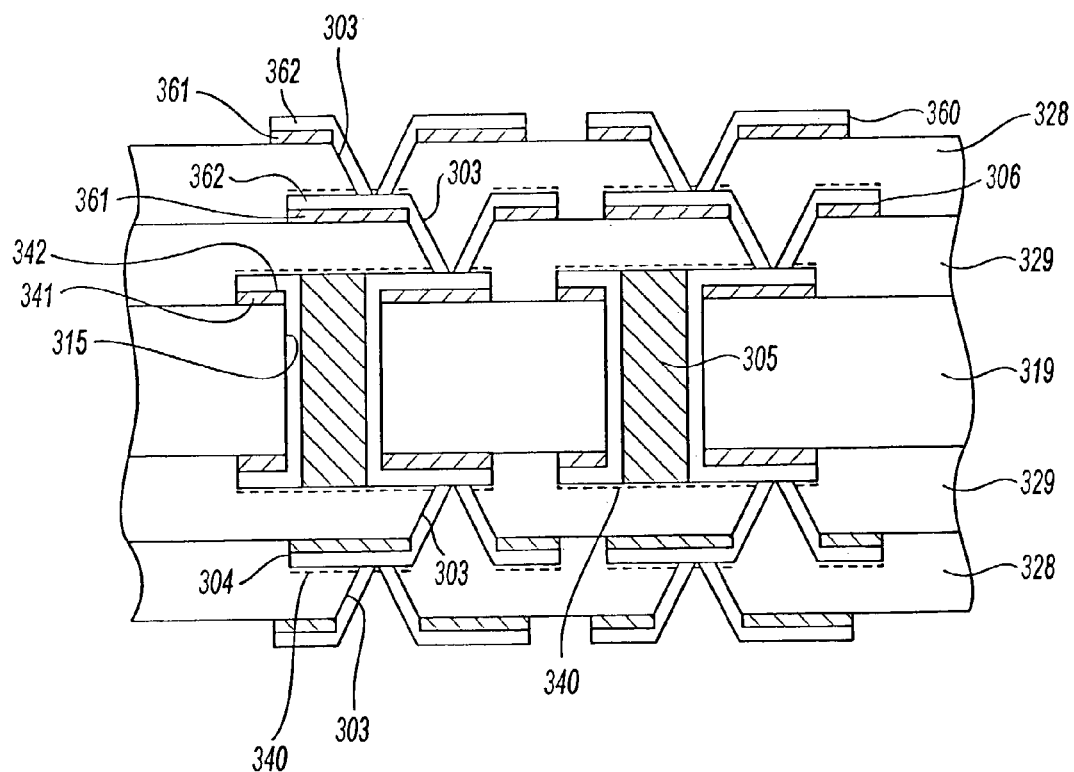
FIG. 19 is a diagrammatic view illustrating the formation of another set of insulating layers and second conductor circuits in the production of the printed wiring board subsequent to FIG. 18.

Then, an insulating layer 328, via-holes 303 and second conductor circuit 360 are formed on the surface of the insulating layer 329 likewise the case of forming the insulating layer 329 and the second conductor circuit 306 as shown in FIG. 19.

Thereafter, as shown in FIG. 20, solder balls 381 are arranged on the second conductor circuit 360 and the via-hole 303, and also a solder resist is formed between the solder balls 381.

In this way, the printed wiring board 1 is obtained.

The function and effect of this embodiment are described below.

In the production method according to this embodiment, as shown in FIG. 17, a portion irradiated by the laser beam is the exposed portion having no black oxide film 340 on the innerlayer conductor circuit 304.

Therefore, the laser beam is not absorbed by the innerlayer conductor circuit 304. As a result, there is no damage of the innerlayer conductor circuit caused through heat.

That is, the via-hole 303 can be formed by using the laser beam without damaging the innerlayer conductor circuit 304. And also, since the via-hole 303 is formed through the laser beam, there can be obtained via-holes having a smaller diameter.

In this embodiment, the via-hole 303 extending from the outermost surface of the insulating layer 328 to the second conductor circuit 306 is formed by the irradiation of the laser beam. Also, the portion irradiated through the laser beam forms the exposed portion 369 having no black oxide film 340 on the innerlayer conductor circuit.

Embodiment 4

Figure 25:
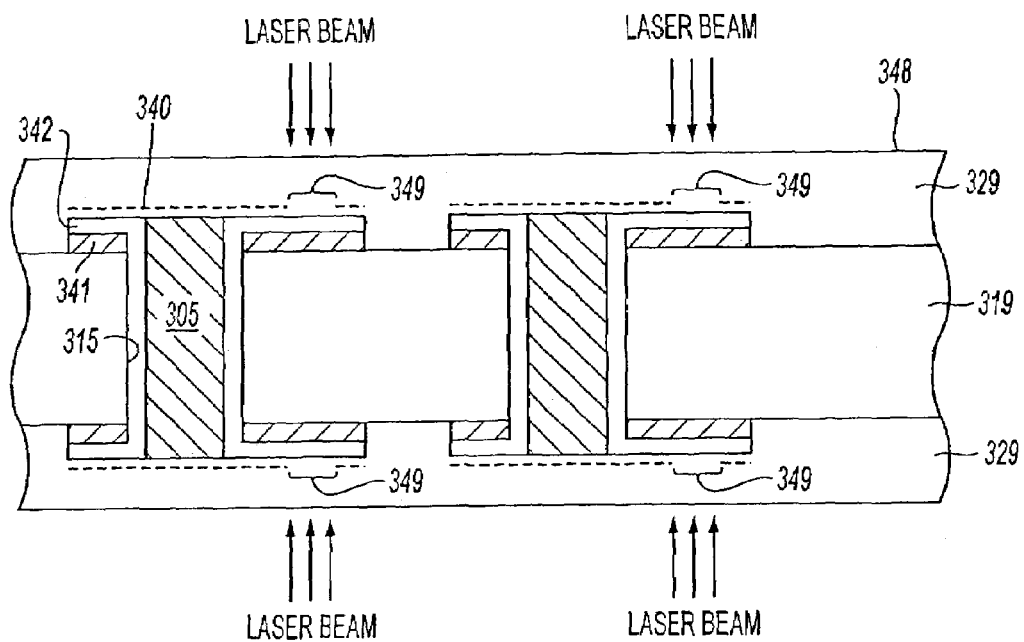
FIG. 25 is a diagrammatic view illustrating the formation of via-holes by irradiation of laser beam in Embodiment 4.
Figure 26:
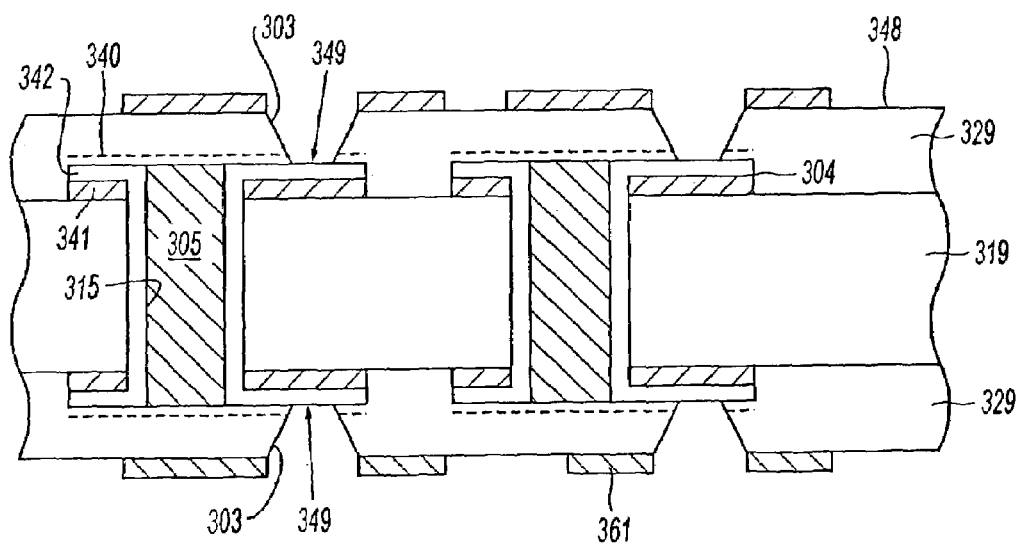
FIG. 26 is a diagrammatic view illustrating the formation of copper foil pattern utilizing a plating to an insulating layer in Embodiment 4.

This embodiment is a production method of a printed wiring board in which a copper foil pattern is formed by plating as shown in FIGS. 25 and 26.

First, an innerlayer plate 319 provided with through-holes 315 and innerlayer conductor circuits 304 is made from a copper clad laminate through the same process as in Embodiment 3. Further, a black oxide film 340 and an exposed portion 349 are formed on the innerlayer conductor circuit 304.

In the formation of the black oxide film 340 and exposed portion 349, however, the black oxide film 340 is previously formed on a full surface of the innerlayer conductor circuit 304 and then unnecessary portions of the black oxide film 340 are selectively etched to form the exposed portions 349.

Then, insulating layers 329 are formed on both surfaces of the innerlayer plate 319.

Then, as shown in FIG. 25, laser beams are irradiated to the insulating layer 329 to form via-holes 303.

Next, the surface of the insulating layer 329 is subjected to a roughening treatment through physical polishing or chemical treatment (agent solution) to obtain a roughened surface 348.

Then, the roughened surface 348 is subjected to an electroless plating through a mask. Thereafter, the mask is removed. Thus, a copper foil pattern 341 is obtained as shown in FIG. 26.

Thereafter, the metal plated films 342 are formed on the copper foil pattern 341 and the inner wall faces of the via-holes 303 and the second conductor circuits 306 electrically connected to the via-hole 303 are formed in the same manner as in Embodiment 3. Furthermore, solder balls and solder resists are formed on the insulating layer 329 and the via-holes 303.

In this way, there is obtained the printed wiring board as shown in Embodiment 3 and FIG. 20.

In the production method of the printed wiring board according to this embodiment, a resin is used as the insulating layer, so that it is possible to control the insulating layer thickness to about 40 μm, which is suitable for reducing the thickness and weight of the printed wiring board.

The same function and effect as in Embodiment 3 are obtained.

Embodiment 5

A printed wiring board according to the fifth embodiment of the invention and the production method thereof are described with reference to FIG. 27 to FIG. 29.

Figure 27:
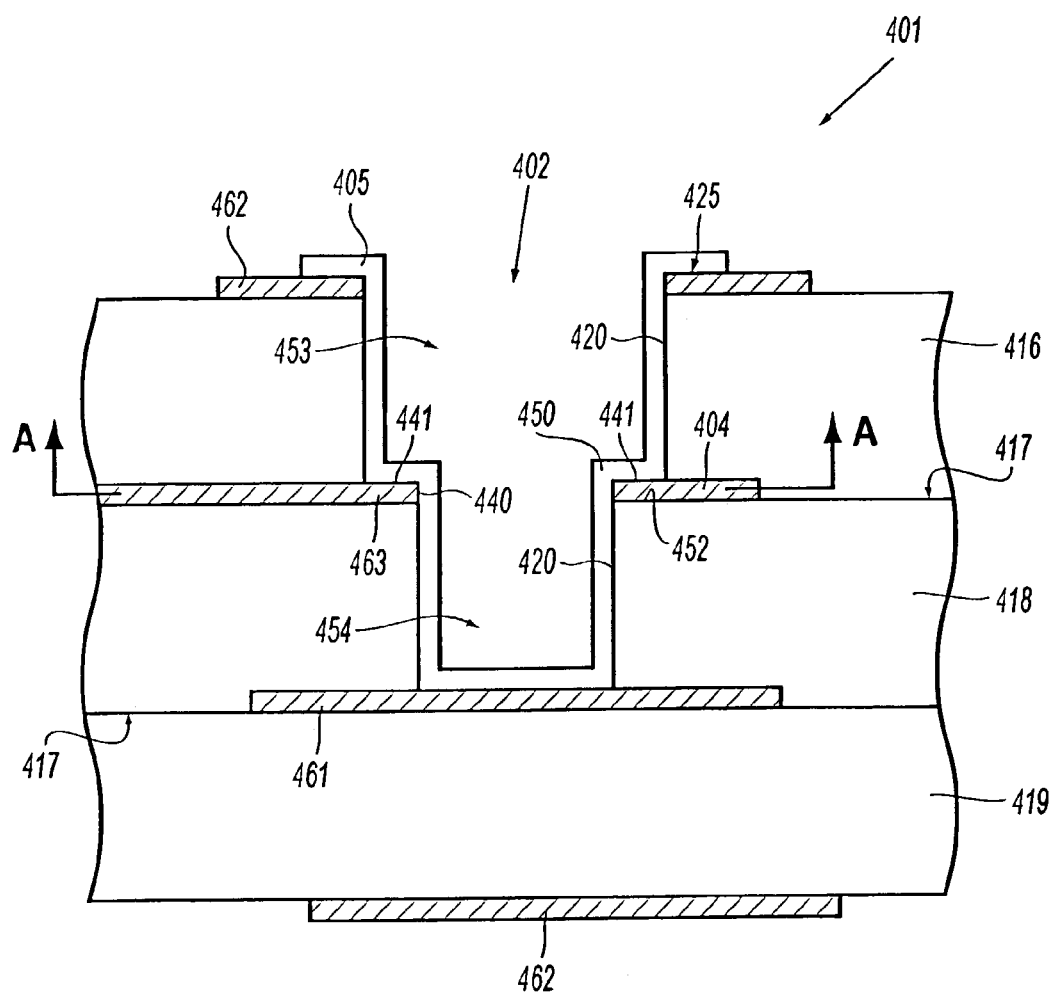
FIG. 27 is a diagrammatic section view of the printed wiring board in Embodiment 5.
Figure 28:
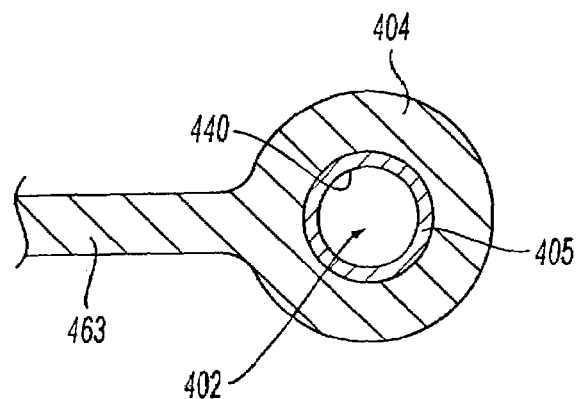
FIG. 28 is a section view taken along an axis A-A in FIG. 27.

As shown in FIGS. 27 and 28, the printed wiring board 401 of this embodiment comprises two insulating layers 418, 416 located on an innerlayer conductor circuit 461 and a via-hole 402 extending from an outermost surface of the insulating layer 416 through the two insulating layers 418, 416 to the innerlayer conductor circuit 461. On an inner wall face of the via-hole 402 is formed an inner metal plated film 405 electrically connecting the innerlayer conductor circuit 461 to an outerlayer conductor circuit 462 formed on the outermost surface.

And also, the printed wiring board 401 is provided with an annular middle land 404 protruding toward the inside of the via-hole 402 and having an opening hole 440 as shown in FIGS. 27 and 28.

Furthermore, the via-hole 402 forms a stepwise via-hole having a stepwise portion 452 at the annular middle land 404 in which a diameter of an outer via-hole 453 located outward from the annular middle land 404 is larger than a diameter of an inner via-hole 454 located inward toward the innerlayer conductor circuit 461.

In addition, the inner metal plated film 405 forms a stepwise plated film 450 along inner wall faces of the outer via-hole 453 and inner via-hole 454.

Moreover, the via-hole 402 is a blind via-hole.

The details of the printed wiring board 401 are described below.

As shown in FIG. 27, the printed wiring board 401 comprises an innerlayer plate 419 provided with an outerlayer conductor circuit 462 and in innerlayer conductor circuit 461, two insulating layers 418, 416 arranged on the surface of the innerlayer conductor circuit 461, a boundary conductor circuit 463 and an annular middle land 404 formed on the surface of the insulating layer 418, and an outerlayer conductor circuit 462 formed on the surface of the insulating layer 416.

As shown in FIG. 28, the annular middle land 404 is a conductive land connected to the boundary conductor circuit 463.

In the printed wiring board 401 is formed a via-hole 402 extending from the outermost surface of the insulating layer 416 to the innerlayer conductor circuit 461.

The via-hole 402 is comprised of an outer via-hole 453, an inner via-hole 454 and a stepwise portion 452 existing therebetween.

The insulating layers 416, 418 are exposed in the inner wall face 20 of the via-hole 402. Also, the annular middle land 404 is exposed between the insulating layers 416, 418 or from the stepwise portion 452 to form an exposed portion 441. Furthermore, an inner diameter portion of an opening hole 440 of the annular middle land 404 is exposed in the via-hole 402.

Although the inner metal plated film 405 is joined to the inner wall face 420 of the via-hole 402, it is at a state of adhering to the outer conductor circuit 462 mainly existing in an opening edge 425 of the via-hole 402, exposed portion 411 of the annular middle land 404, a side face of the opening hole 440 and the innerlayer conductor circuit 461 facing the bottom of the via-hole 402 as shown in FIG. 27.

As shown in FIG. 27, the annular middle land 404 has an outer diameter larger than the diameter of the outer via-hole 453 and is provided with the opening hole 440 having the same diameter as the inner via-hole 454. And also, the annular middle land 404 is formed integrally with the boundary conductor circuit 463 by etching the copper foil.

In the production of the printed wiring board 401 according to this embodiment, the via-hole 402 is formed by irradiating laser beams from the outermost surface of the insulating layer 416 toward the innerlayer conductor circuit 461.

In this case, the laser beam arrives at innerlayer conductor circuit 461 through the opening hole 440 of the annular middle land 404, and the laser beam is irradiated to a range required for forming the diameter of the outer via-hole 453.

Then, the inner metal plated film 405 is formed after the formation of the via-hole 402.

The details of the production method are described below.

There is first provided a copper clad laminate having a copper foil on its surface, and then the copper foil is patterned. Next, a copper plated film is formed on the copper foil to form innerlayer conductor circuits 461 and outer conductor circuits 462 on the innerlayer plate 419 as shown in FIG. 29.

Then, a prepreg and a copper foil are laminated on the surface of the innerlayer conductor circuit 461 in the innerlayer plate 419. Next, the copper foil is patterned and thereafter a copper plated film is formed on the copper foil. Thus, there is obtained an insulating layer 418 having boundary conductor circuits 463 and annular middle lands 404. Also, an exposed portion of the insulating layer 418 is formed as a laser irradiating portion 472 mentioned later.

Then, an insulating layer 416 having outer conductor circuits 462 is formed on the surface of the outer innerlayer conductor circuit 462 in the same manner as mentioned above. Similarly, an exposed portion of the insulating layer 418 is also formed as a laser irradiating portion 471 mentioned later.

Figure 29:
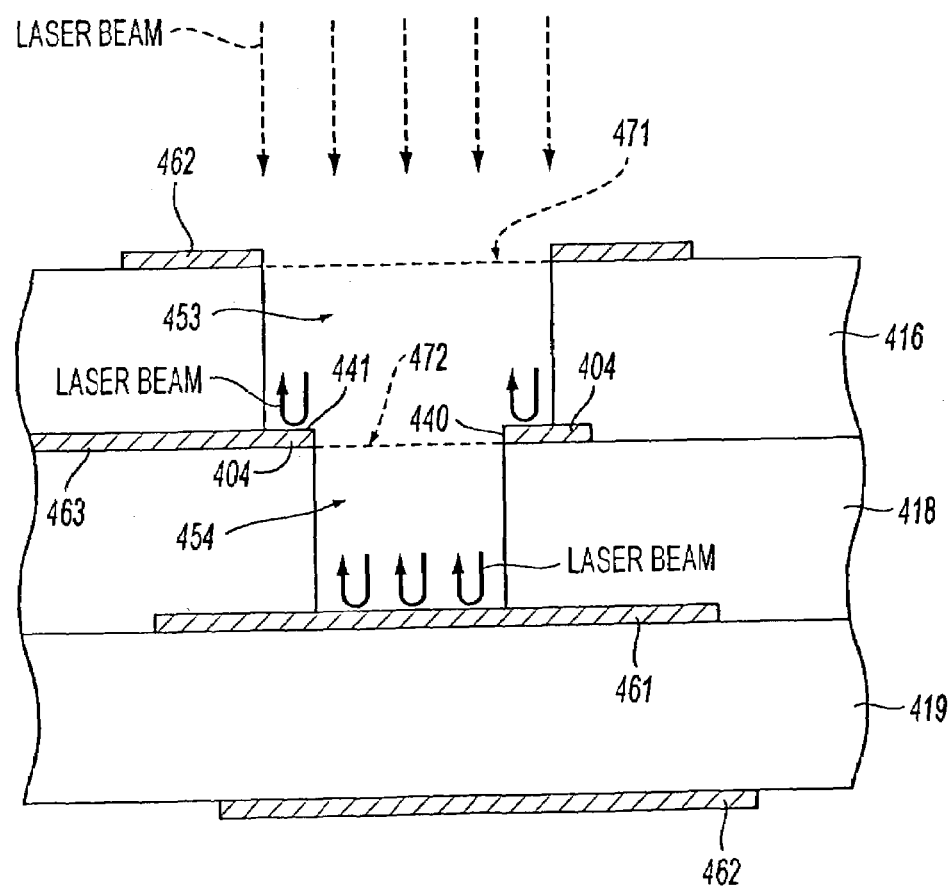
FIG. 29 is a diagrammatic view illustrating the formation of a via-hole by irradiation of laser beam in Embodiment 5.

Moreover, the irradiating portions 471 and 472 are concentric circles as shown in FIG. 29, in which the irradiating portion 472 is smaller than the irradiating portion 471. Furthermore, the irradiating portion 471 has the same diameter as the outer via-hole 453, and the irradiating portion 472 has the same diameter as the inner via-hole 454. And also, the irradiating portion 472 is inside the opening hole 440 of the annular middle land.

Then, the laser beam is irradiated to the irradiating portion 471 as shown in FIG. 29. In this case, the laser beam arrives at a portion of the annular middle land 404 to vaporize and remove the insulating layer 416 beneath the irradiating portion 471, whereby the outer via-hole 453 is formed.

Since the annular middle land 404 is made of a metal, the reflectance of the laser beam is high. For this end, the laser beam striking the exposed portion 441 of the annular middle land 404 is reflected at this portion, so that the insulating layer 418 existing beneath the exposed portion 41 is left to stand without removing by vaporization.

On the other hand, the insulating layer 418 is at an exposed state inside the opening hole 440 or at the irradiating portion 472. For this end, the insulating layer 418 existing at this portion is vaporized and removed by the laser beam to form the inner via-hole 454. The laser beam is shut off by the innerlayer conductor circuit 461 and does not arrives at a position beneath such a circuit.

Thereafter, as shown in FIG. 27, the inner metal plated film 405 is formed in the via-hole 402 by electroless copper plating.

In this way, there is obtained the printed wiring board 401 according to this embodiment.

In this embodiment, the via-hole 402 has a diameter of 100 μm, and the annular dummy land 404 has the opening hole 440 of 100 μm in diameter and an outer diameter of 200 μm. And also, an excimer laser is used at a wavelength of 248 nm and an output of 50 W as the laser beam.

The function and effect of this embodiment are described below.

In the printed wiring board 401 of this embodiment is formed the annular middle land 404 protruding toward the inside of the via-hole 402 and having the opening hole 440. Also, the via-hole 402 is a stepwise via-hole having the stepwise portion 452 at the annular middle land 404. Furthermore, the inner metal plated film 405 forms a stepwise plated film 450 along the inner wall faces of the outer via-hole 453 and the inner via-hole 454.

The annular middle land 404 has the exposed portion 441 at the stepwise portion 452 of the via-hole 402. The exposed portion 441 indicates a ring having an outer diameter equal to the diameter of the outer via-hole 453 and an inner diameter equal to the diameter of the inner via-hole 454. In this case, the inner plated film 405 forms the stepwise plated film 450 and contacts therewith. (see FIG. 27).

The inner metal plated film 405 is difficult to adhere to the exposed portions of the insulating layers 418, 416 in the via-hole 402, but can strongly adhere to the annular middle land 404 made of the copper plated film. Therefore, the inner metal plated film 405 is adhered to the exposed portion 441 of the annular middle land 404 and can strongly be adhered to the via-hole 402.

Also, the inner diameter side face of the opening hole 440 in the annular middle land 404 is exposed to the via-hole 402, so that the inner metal plated film 405 can be adhered at this portion.

Therefore, there can be prevented the separation and falling down of the inner metal plated film 405 can be prevented.

Furthermore, the via-hole 402 in the printed wiring board 401 of this embodiment is formed by the irradiation of the laser beam, so that the size can be finer.

Embodiment 6

Figure 30:
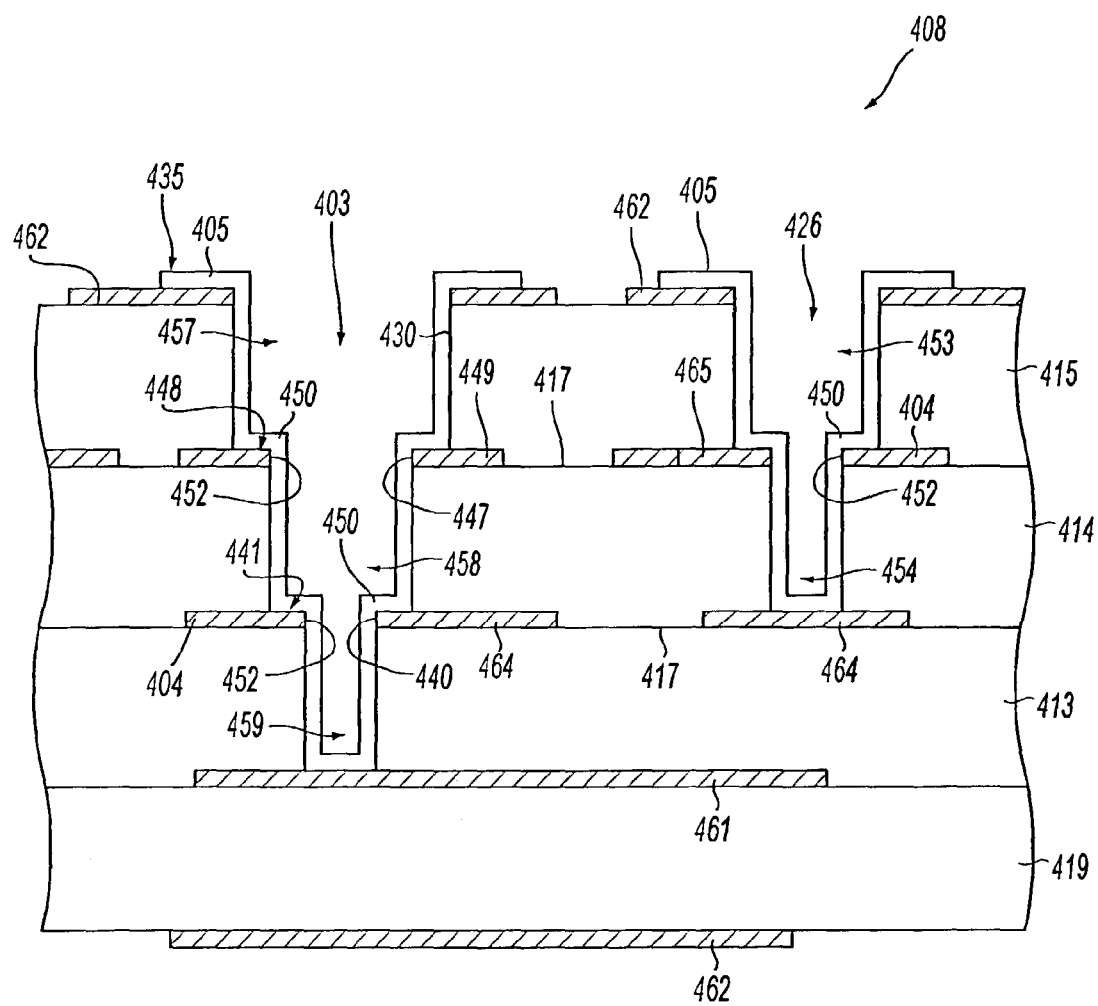
FIG. 30 is a diagrammatic section view of the printed wiring board in Embodiment 6.

This embodiment is a printed wiring board in which a via-hole 403 passes through three insulating layers 413~415 as shown in FIG. 30.

That is, the printed wiring board 408 of this embodiment comprises an innerlayer plate 419 and three insulating layers 413~415 arranged on the innerlayer plate 419. On the surfaces of the innerlayer plate 419 are formed an innerlayer conductor circuit 461 and an outerlayer conductor circuit 462. An outerlayer conductor circuit 462 is formed on the insulating layer 415. Also, boundary conductor circuits 464, 465 are formed at boundary portions 417 among the insulating layers 413~415.

A via-hole 403 is a stepwise via-hole having stepwise portions 452 at two annular middle lands 449, 404. The via-hole 403 is comprised of an outer via-hole 457 located outside the annular middle land 449, a middle via-hole 458 located between the annular middle lands 449 and 404, and an inner via-hole 459 located inside the annular middle land 404.

In the inside of the via-hole 403 is formed an inner plated film 405.

On the peripheral edge of the via-hole 403 are arranged annular middle lands 404, 449 protruding toward the inside thereof as different layers. The annular middle land 449 as an upper layer is a dummy land not connected to the boundary conductor circuit 465 and is ring-shaped. On the other hand, the annular middle land 404 as a lower layer is a conductive land connected to the boundary conductor circuit 464.

The annular middle lands 449, 404 have opening holes 447, 440, respectively. The diameter of the opening hole 447 is equal to the diameter of the middle via-hole 458, and the diameter of the opening hole 440 is equal to the diameter of the inner via-hole 459.

The inner metal plated film 405 is adhered to the inner wall face 430 of the via-hole 403, but adheres to the outerlayer conductor circuit 462 mainly on an opening edge 435 of the via-hole 403, exposed portions 448, 441 of the annular middle lands 449, 404, opening holes 440, 447 and the innerlayer conductor circuit 461 facing the bottom of the via-hole 403. Moreover, the via-hole 403 is a blind via-hole covered at its one-side surface.

Also, a via-hole 426 passing through the insulating layer 415 and extending to the boundary conductor circuit 464 is formed in the printed wiring board 408. The structure of the via-hole 426 is the same as in the via-hole of Embodiment 5. Moreover, the annular middle land 404 in the via-hole 426 is a conductive land connected to the boundary conductor circuit 465.

In this embodiment, an annular dummy land 449 is formed on a portion including no boundary conductor circuit 465, whereby the thickness of connecting conductor circuit 465 is compensated and the formation of depression in the opening peripheral edge 435 of the via-hole 403 can be prevented. The function and effect similar to those of Embodiment 5 can be developed in this embodiment.

Embodiment 7

A printed wiring board according to the seventh embodiment of the invention is described with reference to FIGS. 31 and 32.

Figure 31:
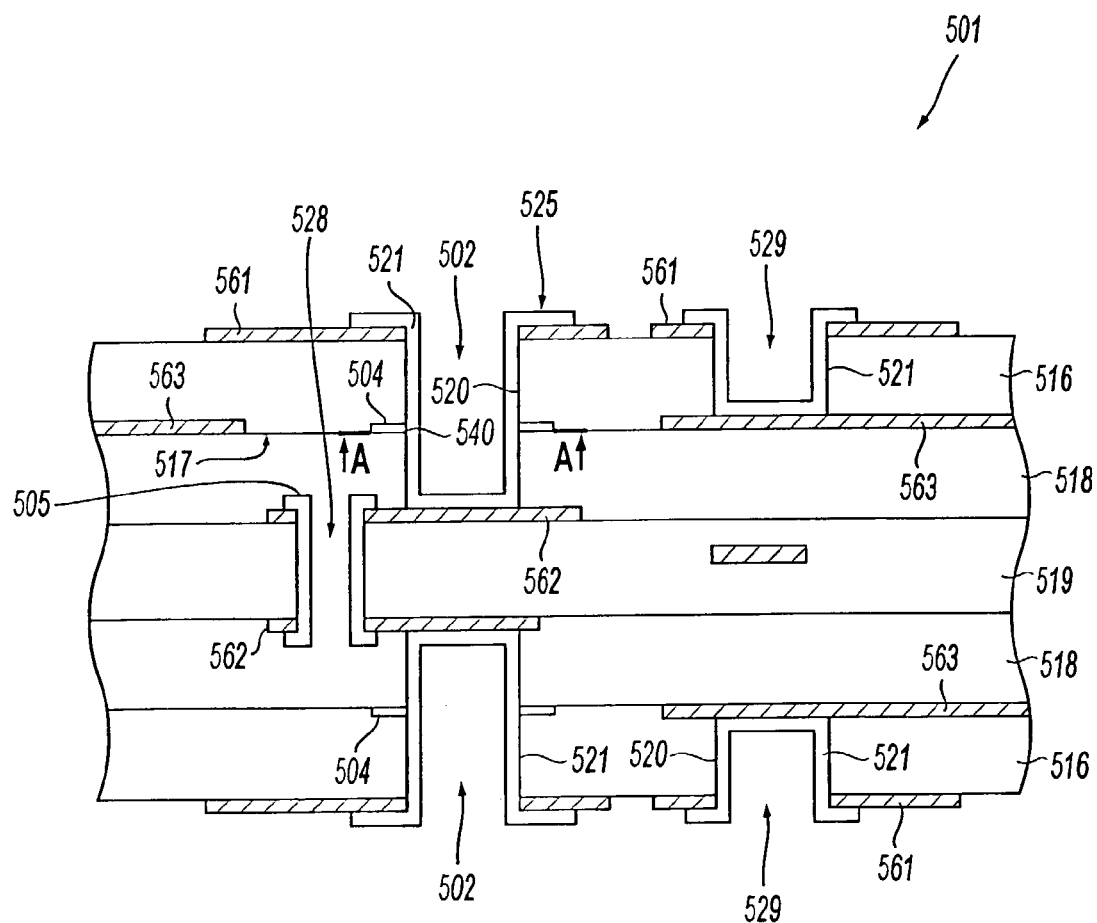
FIG. 31 is a diagrammatic section view of the printed wiring board in Embodiment 7.

In the printed wiring board 501 of this embodiment, as shown in FIG. 31, two insulating layers 518, 516 are laminated onto each face of an innerlayer conductor circuit 562, and a via-hole 502 extending from an outermost surface of the insulating layer 516 through the two insulating layers 518, 516 to the innerlayer conductor circuit 562 is formed.

In the via-hole 502 is formed an inner metal plated film 521 electrically connecting the innerlayer conductor circuit 562 to an outerlayer conductor circuit 561. The via-hole 502 is a blind via-hole.

Figure 32:
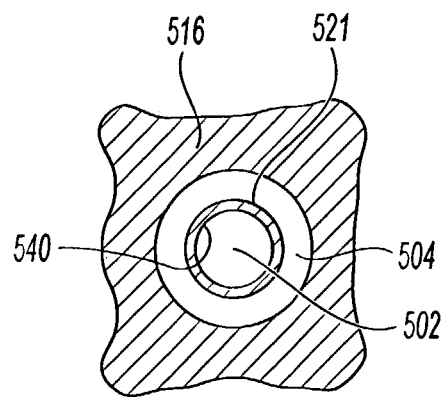
FIG. 32 is a section view taken along an axis A-A in FIG. 31.

Also, a reinforcing annular dummy land 504 having an opening hole 540 around the via-hole 502 is formed in a boundary portion 517 between the two insulating layers 518, 516 as shown in FIG. 32. The annular dummy land 504 is adhered to the inner metal plated film 521.

The details of the printed wiring board 501 are described below.

As shown in FIG. 31, the printed wiring board 501 comprises an innerlayer plate 519 provided with an innerlayer conductor circuit 562, two insulating layers 518, 516 laminated on each surface of the innerlayer plate 519, innerlayer conductor circuits 563 and annular dummy land 504 arranged on the surface of the insulating layer 518 and outerlayer conductor circuits 561 arranged on the surface of the insulating layer 516.

Moreover, a through-hole 528 is formed in the innerlayer plate 519. In the through-hole 528 is formed a metal plated film 505 electrically connecting the two innerlayer conductor circuits 562 formed on both surfaces of the innerlayer plate 519 to each other.

In the printed wiring board 501 are formed a via-hole 502 extending from an outermost surface of the insulating layer 516 to the innerlayer conductor circuit 562 and a via-hole 529 extending from the outermost surface of the insulating layer 516 to the innerlayer conductor circuit 563.

Moreover, the via-hole 502 is formed in a portion with no innerlayer conductor circuit 563.

In an inner wall face 520 of the via-hole 502 are exposed the insulating layers 516 and 518, and an opening hole 540 of the annular dummy land 504 is exposed between the insulating layers 518, 516.

In this case, the inner metal plated film 521 is adhered to the inner wall face 520 of the via-hole 502, but adheres to an outerlayer conductor circuit 561 mainly existing on an opening peripheral edge 525 of the via-hole 502, the opening hole 540 of the annular dummy land 504 and an innerlayer conductor circuit 562 facing the bottom of the via-hole 502.

The annular dummy land 504 is made of a copper plated layer, and has an outer diameter larger than the diameter of the via-hole 502 and an opening hole 540 having the same diameter as the via-hole 502 as shown in FIG. 32. Also, the annular dummy land 504 is formed by etching in the formation of the innerlayer conductor circuit 563.

Furthermore, the annular dummy land 504 is a reinforcing land separately arranged so as not to electrically connect to the innerlayer conductor circuit 563.

Moreover, a via-hole 529 is formed so as to extend through the insulating layer 516 to the innerlayer conductor circuit 563. An inner metal plated film 521 is also formed in the via-hole 529. The inner metal plate film 521 is adhered to the innerlayer conductor circuit 561 mainly arranged on an opening peripheral edge 25 of the via-hole 529, an inner wall of the via-hole 529 and an innerlayer conductor circuit 516 facing the bottom of the via-hole 529.

The production method of such a multilayer printed wiring board according to this embodiment is described below.

There is first provided a copper clad laminate having a copper foil on its surface, and the copper foil is patterned. Then, the copper clad laminate is drilled to form a through-hole 528. Next, a metal plated film is formed in the through-hole 528 by electroless copper plating. Thus, there is obtained an innerlayer plate 519 having the through-hole 528 and an innerlayer conductor circuit 562.

Then, a prepreg and a copper foil are laminated on the surface of the innerlayer plate 519. Thereafter, the copper foil is patterned by etching to form an insulating layer 518 having an innerlayer conductor circuit 563 and an annular dummy land 504.

Next, a prepreg and a copper foil are laminated on the surface of the insulating layer 518 and the copper foil is patterned in the same manner as mentioned above. Thus, there is obtained an insulating layer 516 having an outerlayer conductor circuit 561.

Thereafter, a laser beam is irradiated from the outermost surface of the insulating layer 516. In this case, the laser beam arrives at the innerlayer conductor circuit 562 through the opening hole 540 of the annular dummy land 504. Thus, there are formed a via-hole 502 extending to the innerlayer conductor circuit 562 and a via-hole 529 extending to the innerlayer conductor circuit 563.

Thereafter, inner metal plated films 505 are formed in the via-holes 502, 529 by electroless copper plating.

In this way, there is obtained the printed wiring board 501 according to this embodiment.

Moreover, the via-holes 502, 529 have a diameter of 100 μm, and the annular dummy land 504 is provided with the opening hole 540 having a inner diameter of 100 μm and an outer diameter of 200 μm. Also, an excimer laser is used at a wavelength of 248 nm and an output of 50 W as the laser beam.

The function and effect of this embodiment are described below.

In the printed wiring board 501 of this embodiment, the annular dummy land 504 is formed around the via-hole 502, and such an annular dummy land 504 is adhered to the innerlayer conductor circuit 521 in the via-hole 502.

The inner metal plated film 521 hardly adheres to exposed portions of the insulating layers 518, 516 in the via-hole 502 and is weak in adhesion strength, but can strongly adhere to the annular dummy land 504. Therefore, the inner metal plated film 521 can be strongly adhered to the via-hole 502.

As a result, this prevents the separation and falling down of the inner metal plated film 521.

And also, the via-holes 502, 529 in the printed wiring board 501 of this embodiment are formed by the irradiation of the laser beam, so that the size can be refined.

Embodiment 8

Figure 33:
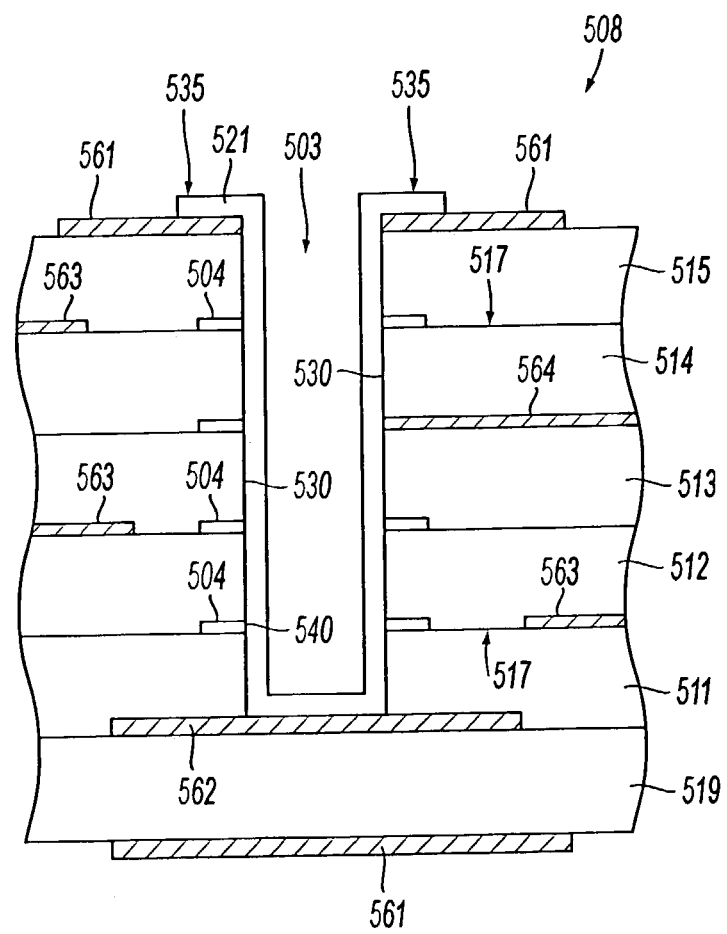
FIG. 33 is a diagrammatic section view illustrating a via-hole in Embodiment 8.

This embodiment is a printed wiring board 508 in which a via-hole 503 passes through five insulating layers 511~515 as shown in FIG. 33.

The printed wiring board 508 is a laminate comprised of an innerlayer plate 519 and five insulating layers 511~515. On the surfaces of the innerlayer plate 519 are formed an innerlayer conductor circuit 562 and an outerlayer conductor circuit 561. On the insulating layer 519 is formed an outerlayer conductor circuit 561.

Furthermore, innerlayer conductor circuits 563, 564 are formed on boundary portions 517 among these insulating layers 511~515. The inner-layer conductor circuit 563 is not conductive to the via-hole 503, while the other innerlayer conductor circuit 564 is conductive to the via-hole 503. And also, the via-hole 503 is formed so as to pass through the innerlayer conductor circuit 564.

The via-hole 503 is formed in portions of the insulating layers 511, 512, 514 including no innerlayer conductor circuit 563 and provided with reinforcing annular dummy lands 504 having an opening hole 540.

In this case, an inner metal plated film 521 formed in the via-hole 503 adheres to an inner wall face 530 of the via-hole 503, but adheres to an outerlayer conductor circuit 561 mainly existing on an opening peripheral edge 535 of the via-hole 503, the opening hole 540 of the annular dummy land 504 and an innerlayer conductor circuit 562 facing the bottom of the via-hole 503.

In the printed wiring board 508 of this embodiment, the innerlayer conductor circuits 563, 564 are formed on boundary portions 517 among the different insulating layers 511~515. And also, the via-hole 503 is formed in a portion including no innerlayer conductor circuit 563 but including the innerlayer conductor circuit 564.

When the annular dummy land 504 is not existent, the opening peripheral edge 535 of the via-hole 503 is decreased by a total thickness of the innerlayer conductor circuits 563 formed on the insulating layers 511, 512, 514.

However, the annular dummy land 504 is formed in the printed wiring board 508 of this embodiment, so that the metal plated film 521 is strongly adhered thereto and there is caused a depression or the like in the opening peripheral edge 535 of the via-hole 503.

In addition, the same function and effect as in Embodiment 7 are developed.

Embodiment 9

A printed wiring board of Embodiment 9 according to the sixth aspect of the invention and the production method thereof are described with reference to FIG. 34 to FIG. 37.

In the printed wiring board of this embodiment, an insulating layer 619 is provided on its upper face with an upper conductor circuit 621 and on its lower face with a lower conductor circuit 622. And also, a blind via-hole 615 passing through the insulating layer 619 and bottoming to the lower conductor circuit 622 is formed between the upper conductor circuit 621 and the lower conductor circuit 622. The blind via-hole 615 has a diameter of 0.2 mm.

In an inner wall of the blind via-hole 615 is formed a via-plated layer 616 for electrically connecting the upper conductor circuit 621 to the lower conductor circuit 622.

A flowing hole 611 of a plating solution having a diameter smaller than that of the blind via-hole 615 is formed in the lower conductor circuit 622 constituting the bottom of the blind via-hole 615. A diameter of the plating solution flowing hole 611 is 0.03 mm. The plating solution flowing hole 611 is closed with the via-plated layer 616.

In the production of the printed wiring board 601, the blind via-hole 615 is formed by irradiating a laser beam from an upper face of the insulating layer 619 toward the lower conductor circuit 622 and at the same time the plating solution flowing hole 611 is formed in the lower conductor circuit 622 through the laser beam.

Then, a chemically plated hole 617 is formed in the blind via-hole 615 by flowing a chemical plating solution into the blind via-hole 615 and the plating solution flowing hole 611.

Thereafter, electric plating is carried out by flowing an electric plating solution to form the via-plated layer 616. The chemically plated hole 617 is formed for facilitating the formation of the via-plated layer 616 to the blind via-hole 615.

The details of the above production method are described below.

Figure 34:
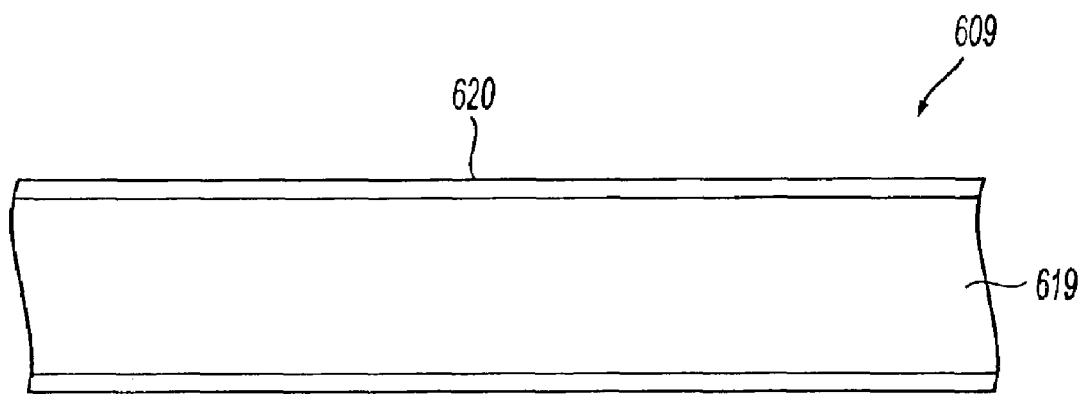
FIG. 34 is a diagrammatic section view of a copper clad laminate in Embodiment 9.

As shown in FIG. 34, there is provided a copper clad laminate 609 comprised of an insulating layer 619 and copper foils 620, and the copper foils 620 are patterned. Thus, there is obtained the insulating layer 619 provided with an upper conductor circuit 621 and a lower conductor circuit 622. In the patterning, there are formed a laser beam irradiating portion for the formation of a blind via-hole 615 exposing the insulating layer 619 and an exposed portion 623 for the formation of a flowing hole 611 of an electric plating solution.

Figure 35:
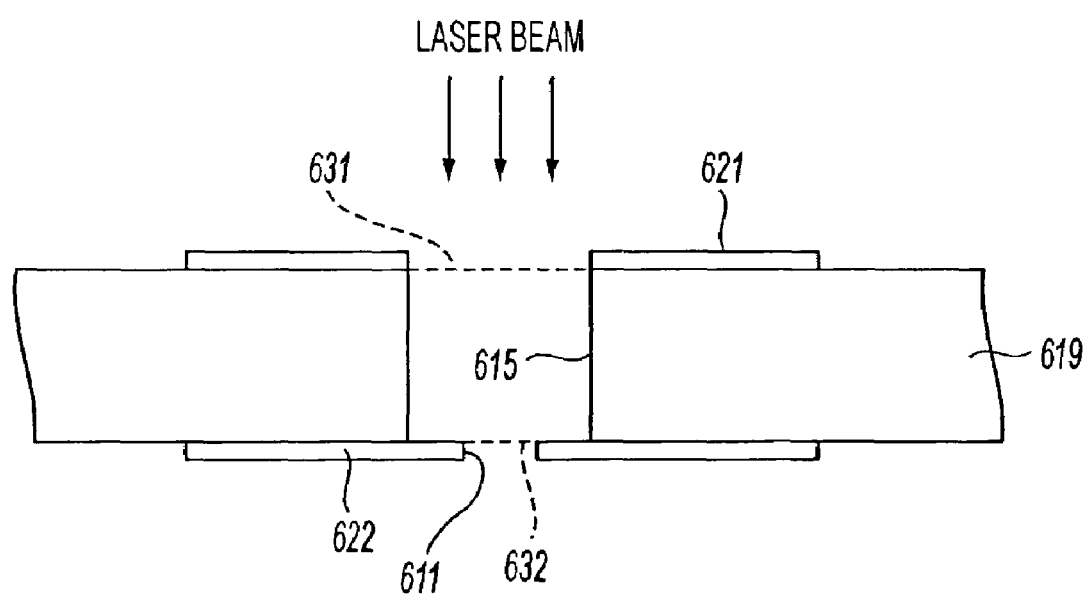
FIG. 35 is a diagrammatic section view illustrating the formation of a blind via-hole through laser beam in Embodiment 9.

Then, as shown in FIG. 35, a laser beam is irradiated to the laser beam irradiating portion 631 of the insulating layer 619 to obtain a blind via-hole 615. In this case, energy of the laser beam is high in its central portion and becomes low in its peripheral edge portion. And also, the lower conductor circuit 622 made of a metal reflects the laser beam. For this end, the laser beam passes through the insulating layer 619 at the exposed portion 632 to form a hole. This is a flowing hole 611 of the plating solution.

Moreover, an excimer laser is used at a wavelength of 248 nm and an output of 50 W as the laser beam.

Next, the insulating layer 619 is immersed in a chemical copper plating tank. The chemical plating solution is flowed in the inside and outside of the blind via-hole 615 through the plating solution flowing hole 611.

Figure 36:
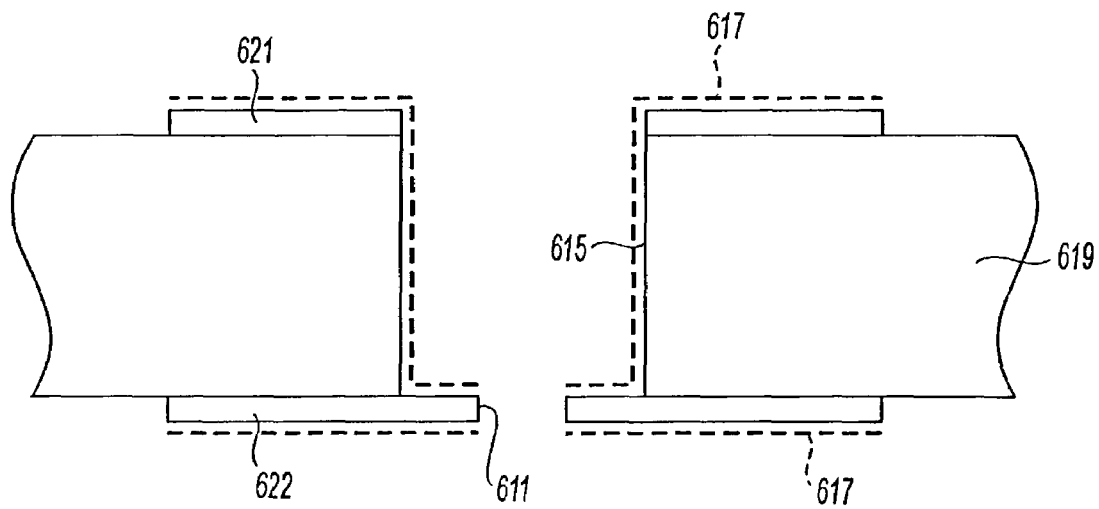
FIG. 36 is a diagrammatic section view illustrating the formation of a chemically plated layer to the blind via-hole in Embodiment 9.

Thus, copper is precipitated in the blind via-hole 615 and on the upper conductor circuit 621 and lower conductor circuit 622 to obtain a chemically plated layer 617 made of copper as shown in FIG. 36.

Figure 37:
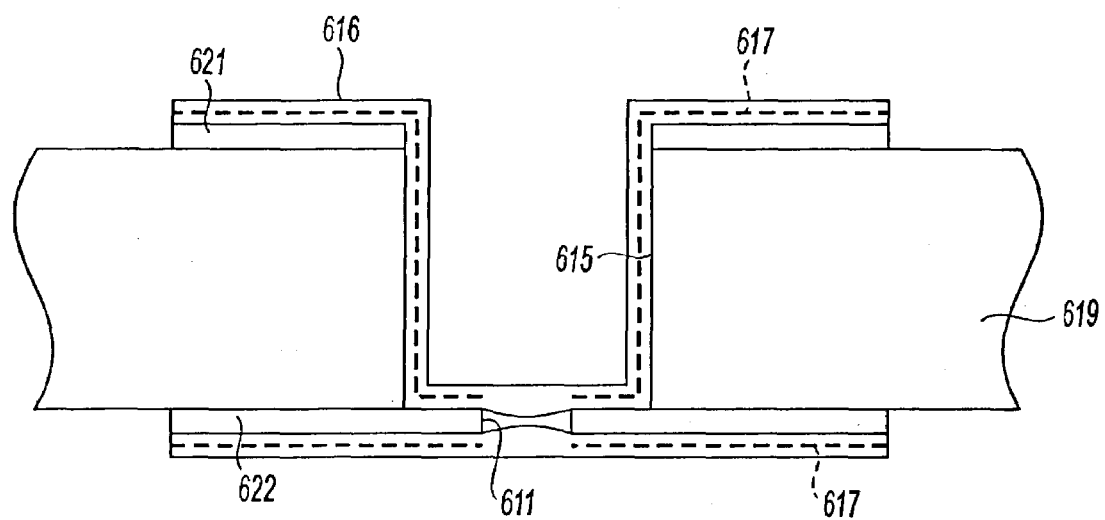
FIG. 37 is a diagrammatic section view of the printed wiring board in Embodiment 9.

Then, the insulating layer 619 is immersed in an electric plating tank filled with an electric copper plating solution as shown in FIG. 37. Thereafter, the electric plating is carried out by flowing the electric plating solution as in the chemical plating.

Thus, copper is precipitated onto the surface of the chemically plated layer 617 to obtain a via-plated layer 616.

In this way, there is obtained the printed wiring board 601 according to this embodiment.

The function and effect of this embodiment are described below.

In the printed wiring board of this embodiment, the plating solution flowing hole 611 having a diameter smaller than the blind via-hole 615 is formed in the lower conductor circuit 621 constituting the bottom of the blind via-hole 615.

In the formation of the via-plated layer 616, therefore, the plating solution can be flowed into the outside and inside of the blind via-hole 615 through the plating solution flowing hole 611. For this end, a uniform via-plated layer 616 can be obtained without forming a spotted state. As a result, there can be obtained the printed wiring board 601 having an excellent electrical conduction between the upper conductor circuit 621 and the lower conductor circuit 622 or an excellent connection reliability therebetween.

Although the plating solution flowing hole 611 is at a state of closing with the via-plated layer 616 in the printed wiring board 601 of this embodiment, the plating solution flowing hole may be at a through-hole state without closing, in a finished printed wiring board 601.

Although the printed wiring board 601 of this embodiment is a single layer wiring board, a multilayer board may be formed by further arranging an insulating layer 619 on the surfaces of the upper conductor circuit 621 and the lower conductor circuit 622 of the above embodiment.

Embodiment 10

Figure 38:
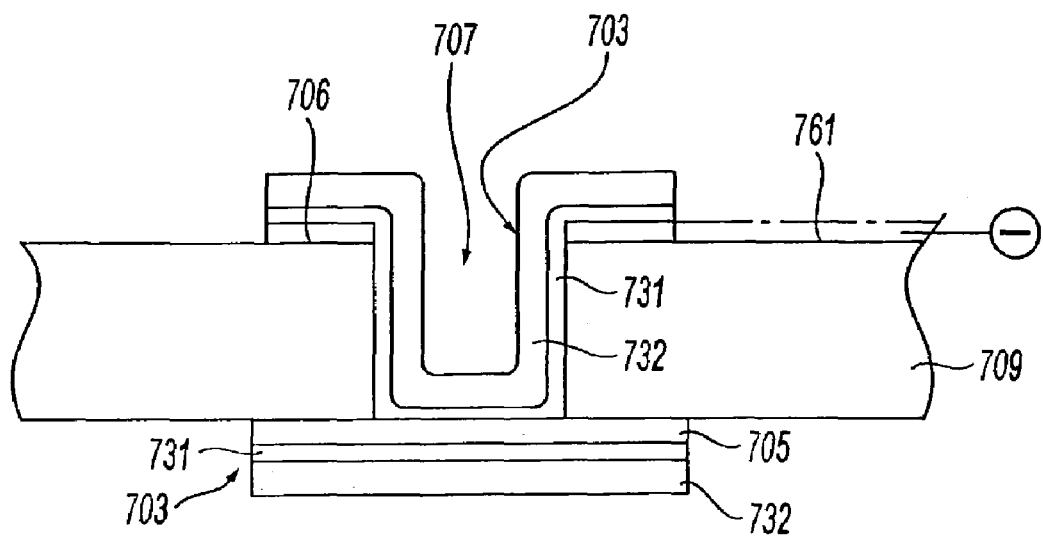
FIG. 38 is a section view of the printed wiring board in Embodiment 10.

In a printed wiring board according to the tenth embodiment of the invention, as shown in FIG. 38, an upper face pattern 706 and a lower face pattern 705 are formed on an upper face and a lower face of an insulating substrate 709 and electrically connected to each other through an electric conduction hole 707.

The production method of the above printed wiring board is described below.

There is first provided an insulating substrate 709 made from glass epoxy resin. The thickness of the insulating substrate 709 is 100 μm. Then, copper foils are attached to the upper and lower faces of the insulating substrate 709 and subjected to etching or the like to form an upper face pattern 706 and a lower face pattern 705 and also form an electrical lead 761 for flowing current to an inner wall of an electric conduction hole 707 in the electric plating treatment. The upper face pattern 706 is formed on a peripheral edge of a portion forming the electric conduction hole. The lower face pattern 705 is formed so as to close a portion of the insulating substrate 709 forming the electric conduction hole.

Then, a laser beam is irradiated to the insulating substrate 709 not covered with the upper face pattern 706 to form an electric conduction hole 707. In this case, the hole formation is continued till the bottom of the electric conduction hole 707 arrives at the lower face pattern 705 formed on the lower face of the insulating substrate 709. The diameter of the electric conduction hole 707 is 0.1 mm.

Then, the insulating substrate 709 is subjected to a chemical copper plating treatment. The chemical copper plating treatment is carried out by a general method. Thus, a thin plated film 731 having a thickness of about 1 μm is formed on an inner wall of the electric conduction hole.

Next, the surface of the insulating substrate 709 is washed.

Thereafter, the insulating substrate 709 is subjected to an electric copper plating treatment. The electric copper plating treatment is carried out immersing the insulating substrate 709 as an anode in an electric plating bath. The chemically plated film 731 is connected as a cathode to a negative of a power source through the electrical lead 761. The electric plating bath contains copper sulfate and has a bath temperature of 60° C. At this state, current having a current density of 1.2 A/dm$^2$ is supplied to the chemically plated film 731. Thus, copper is eluted from the surface of the cathode to precipitate copper on the surface of the chemically plated film serving as the anode. The electric plating treatment is conducted for 20 minutes.

The electric plating treatment is repeated two times to form a thick plated film 732. From the thin plated film 731 and the thick plated film 732 is obtained a metal plated film 703 having a total thickness of 10 μm.

Thereafter, the electrical lead 761 is removed.

In this way, there is obtained the printed wiring board.

With respect to the thus obtained printed wiring board, a state of forming the metal plated film in the electric conduction hole is observed by means of a microscope. As a result, the metal plated film having a uniform thickness is formed in the inner wall of the electric conduction hole. Further, the metal plated film in the inside of the electric conduction hole is 10 μm, which is the same as the thickness of the metal plated film formed on the surface of each of the upper face pattern and the lower face pattern (10 μm).

COMPARATIVE EXAMPLE

In this example, current supplied to the thin plated film in the electric plating treatment is 1.5~2.0 A/dm$^2$. In this case, even when the electric plating treatment is conducted, the plating metal is not normally precipitated in the inside of the electric conduction hole.

Figure 39:
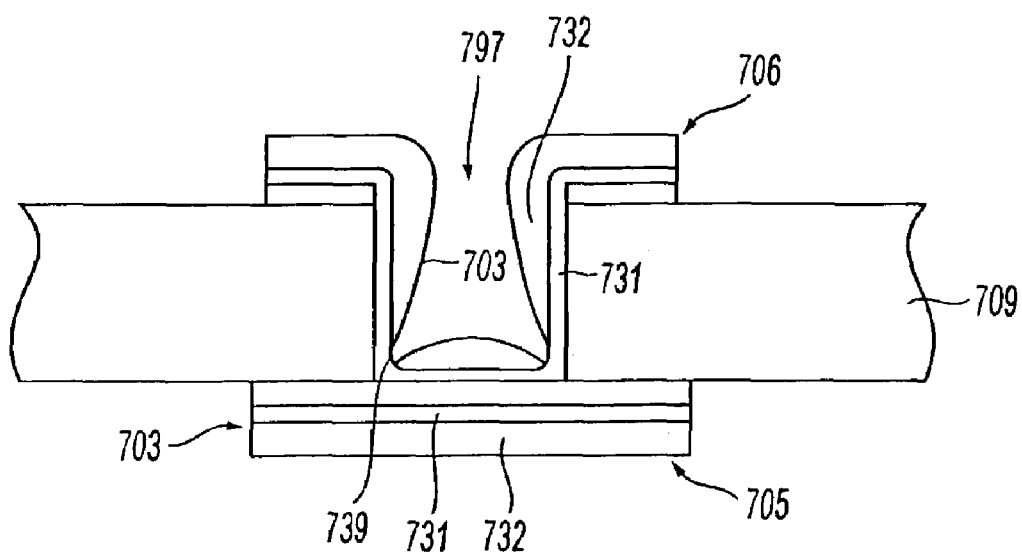
FIG. 39 is a section view of a printed wiring board as a comparative example.

That is, as shown in FIG. 39, the thickness of the electrically plated film 703 becomes very thin, or there may be caused non-precipitated portion 739 of the plated film. This is due to the fact that hydrogen gas produced by electrolytic plating reaction remains in the inside of the narrow electric conduction hole 797.

Embodiment 11

A printed wiring board according to the eleventh aspect of the invention is described with reference to FIGS. 40~43.

Figure 40:
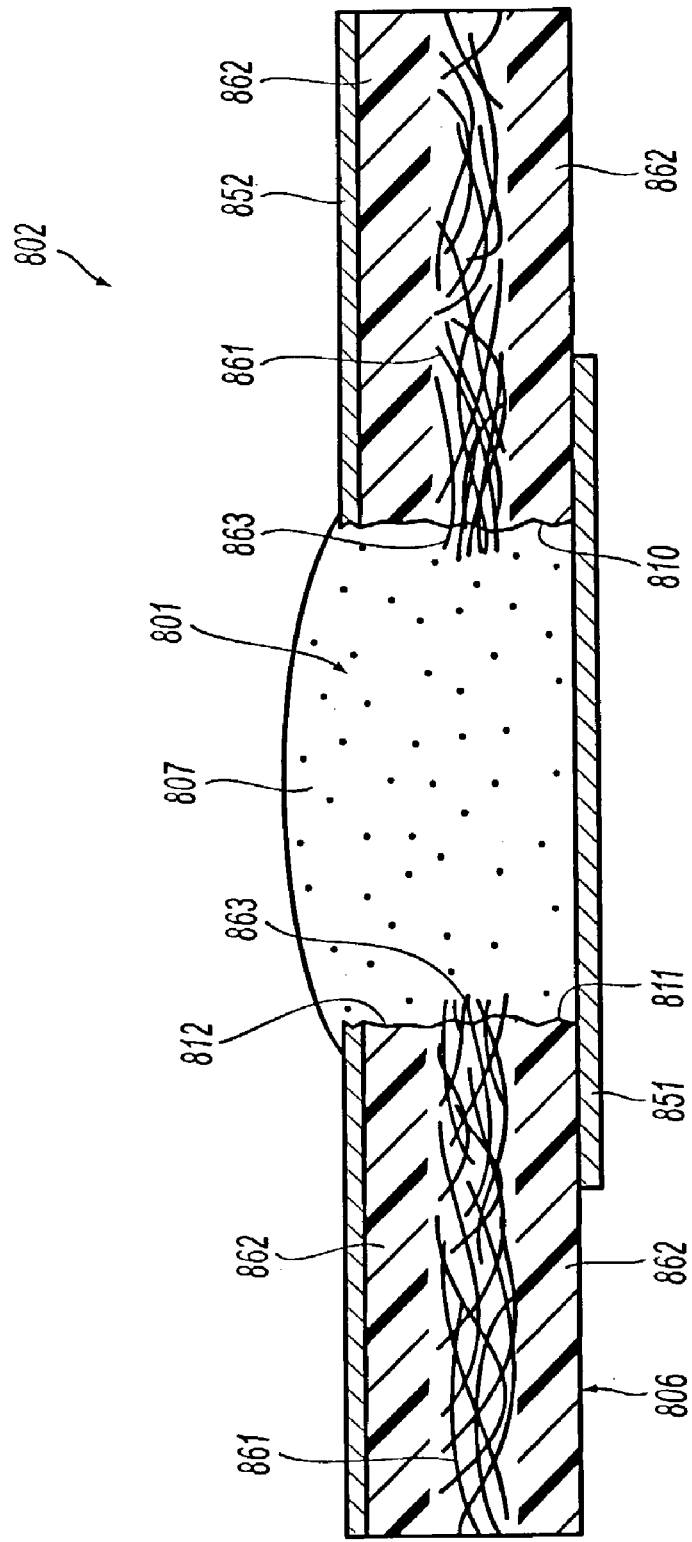
FIG. 40 is a section view of the printed wiring board in Embodiment 11.

As shown in FIG. 40, the printed wiring board 802 of this embodiment comprises conductor patterns 851, 852 formed on a surface of a thin insulating substrate 806, and a solder filling hole 801 passing through the insulating substrate 806 and extending to an upper face of the conductor pattern 851. The inside of the solder filling hole 801 is filled with solder paste 807.

Figure 43:
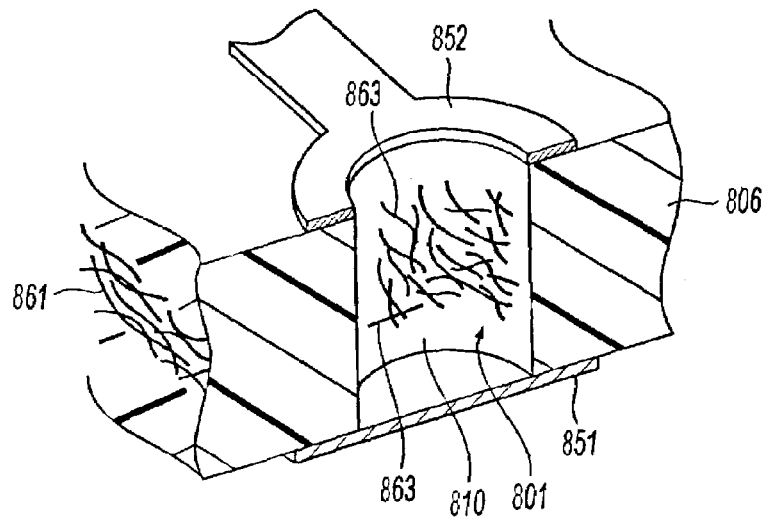
FIG. 43 is a partially cutaway perspective view of the printed wiring board illustrating a wall face state of the solder filling hole in Embodiment 11.

The insulating substrate 806 is formed by impregnating fibers 861 of a glass cloth into epoxy resin 862. As shown in FIGS. 40 and 43, end portions 863 of the fibers 861 protrude from a wall face 810 of the solder filling hole 801. As shown in FIG. 40, the end portions 863 of the fibers 861 encroach into the solder paste 807.

The insulating substrate 806 is a thin sheet of 0.1 mm in thickness. The solder filling hole 801 has a diameter of 0.3 mm.

In the printed wiring board 802 of this embodiment are formed many solder filling holes 801. And also, a mounting portion for mounting an electronic part and terminals for connecting to other members are arranged on the surface of the printed wiring board 802.

The production method of the above printed wiring board is described below.

Figure 41:
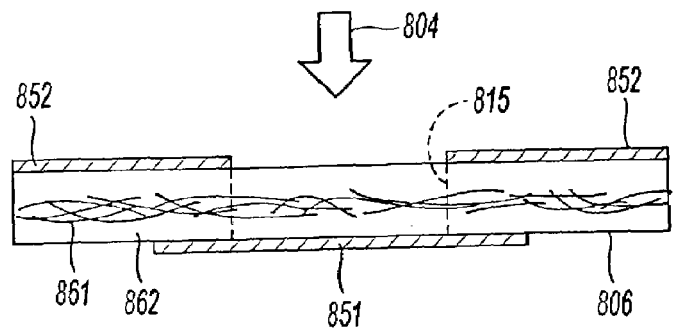
FIG. 41 is a section view of an insulating substrate illustrating a method of forming a solder filling hole in Embodiment 11.

As shown in FIG. 41, there is first provided an insulating substrate 806 formed by impregnating fibers 861 of a glass cloth into an epoxy resin 862. Then, copper foils are adhered to upper and lower faces of the insulating substrate 806 and unnecessary portions thereof are removed by etching to form conductor patterns 852, 851. In this case, a lower face of a portion of the insulating substrate corresponding to a position of a solder filling hole to be formed is covered with a part of the conductor pattern 851, while an upper face thereof is opened without forming the conductor pattern 852.

Figure 42:
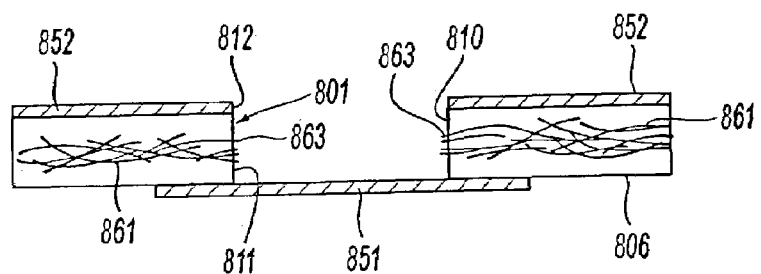
FIG. 42 is a section view of the insulating substrate provided with the solder filling hole in Embodiment 11.

Then, a laser beam 804 is irradiated to a portion 815 of the insulating substrate 806 corresponding to a position of a solder filling hole to be formed, whereby a solder filling hole 801 is formed in the insulating substrate 806 as shown in FIG. 42. In this case, end portions 863 of the fibers 861 are protruded from a wall face 810 of the solder filling hole 801 as shown in FIGS. 42 and 43. Also, the conductor pattern 851 covering an opening portion 811 of the solder filling hole 801 is left as it is without forming hole.

Next, as shown in FIG. 40, a solder paste 807 is filled into an inside of the solder filling hole 801 from another opening portion 812 of the solder filling hole 801 not covered with the conductor pattern 852 by printing process to join the solder paste 807 to the solder filling hole 801.

In this way, there is obtained the printed wiring board 802 shown in FIG. 40.

The function and effect of this embodiment are described below.

In this embodiment, as shown in FIG. 40, the end portions 863 of the fibers 861 included in the insulating substrate 806 protrude from the wall face 810 of the solder filling hole 801. The end portions 863 of the fibers 861 encroach into the solder paste 807 filled in the inside of the solder filling hole 801. Therefore, the solder paste 807 is strongly adhered to the solder filling hole 801. As a result, even when the printed wiring board 802 is subjected to dynamic influence from exterior, the solder paste 807 never comes out of the solder filling hole 801.

Since the end portions 863 of the fibers 861 exposed from the wall face 810 of the solder filling hole 801 encroach into the inside of the solder 807, even when a joining area between the wall face 810 of the solder filling hole 801 and the solder paste 807 is small in the thin insulating substrate 806, the solder paste 807 never comes out of the solder filling hole 801.

Therefore, electrical conduction between the conductor patterns 852 and 851 formed on the upper and lower faces of the insulating substrate 806 can surely be attained by the solder paste 807 in the solder filling hole 801.

In this embodiment, as shown in FIG. 41, the solder filling hole 801 is formed by the irradiation of the laser beam 804, whereby the end portions 863 of the fibers 861 are left on the wall face 810 of the solder filling hole 801. Therefore, the end portions 863 of the fibers 861 can easily be protruded from the wall face 810 of the solder filling hole 801.

And also, the solder filling hole 801 can be formed only in the insulating substrate 806 through the laser beam 804 as shown in FIG. 42, so that the production steps can be simplified. The conductor pattern 851 covering the opening portion 811 of the solder filling hole 801 can be left as it is. For this end, the conductor patterns 851, 852 may previously be formed on the upper and lower faces of the insulating substrate before the formation of the solder filling hole 801.

Embodiment 12

Figure 44:
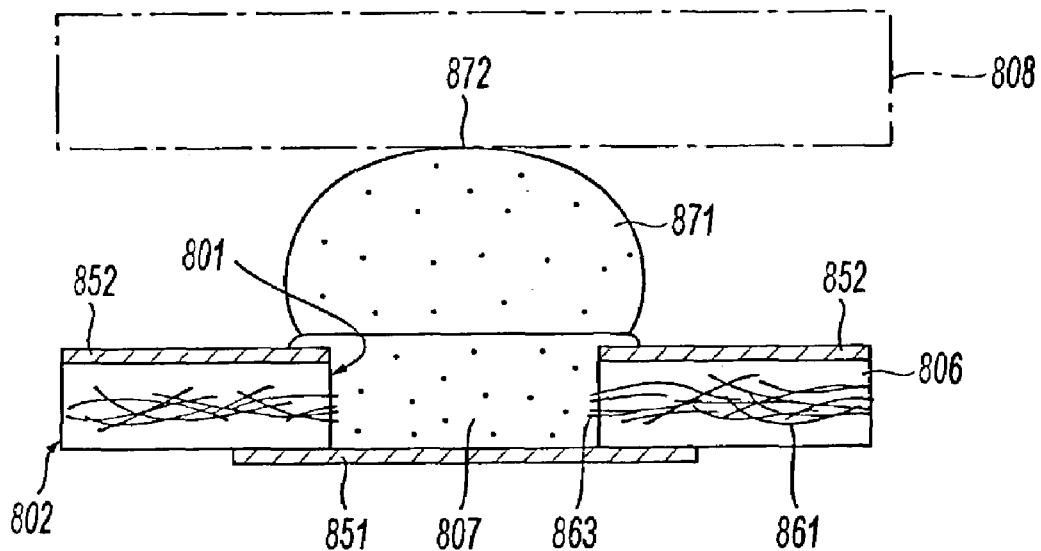
FIG. 44 is a section view of the printed wiring board in Embodiment 12.

In a printed wiring board of this embodiment, as shown in FIG. 44, a solder 807 is filled in an inside of a solder filling hole 801 and thereafter a solder ball 871 is adhered to an upper end thereof.

An upper portion 872 of the solder ball 871 is a portion to be joined to other member 808.

Figure 45:
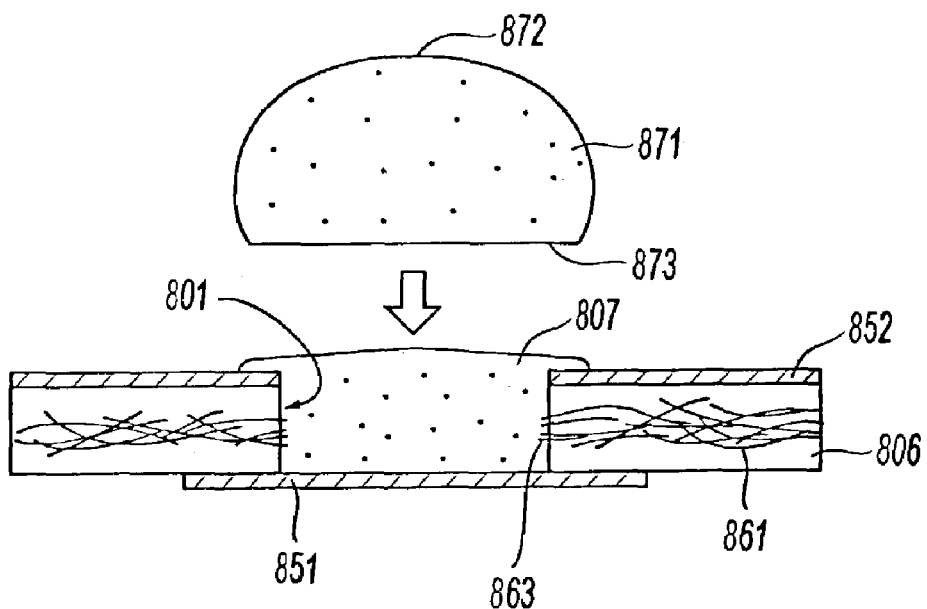
FIG. 45 is a diagrammatic view illustrating a method of bonding a solder ball to a solder filled in the inside of the solder filling hole in Embodiment 12.

In the joining of the solder ball 871 to the solder paste 807 inside the solder filling hole 801, as shown in FIG. 45, a lower portion 873 of the solder ball 871 is a flat surface, while an upper portion 872 of the solder ball 871 is spherical.

Then, the solder ball 871 is placed on the solder paste 807 filled in the inside of the solder filling hole 801 at a state of facing the lower portion 873 of the solder ball 871 thereto likewise Embodiment 11. Next, the solder ball 871 and the solder paste 807 are joined to each other by heat melting.

Even in this embodiment, the solder paste 807 is strongly adhered to the solder filling hole 801 likewise Embodiment 11, so that there can be ensured electrical connection reliability between the solder ball 871 joined to the solder paste 807 and the solder filling hole 801.

Embodiment 13

Figure 46:
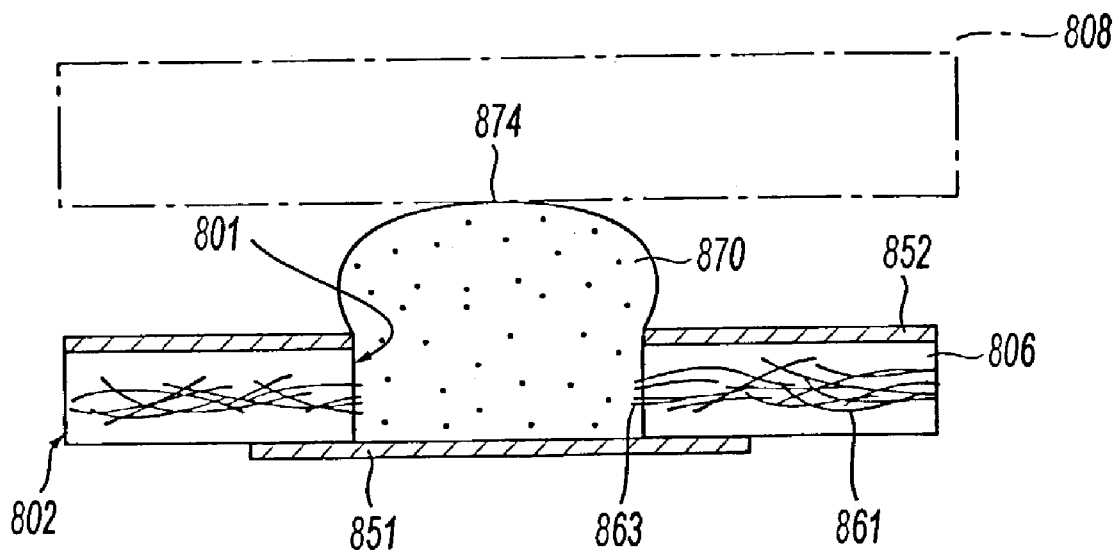
FIG. 46 is a section view of the printed wiring board in Embodiment 13.
Figure 47:
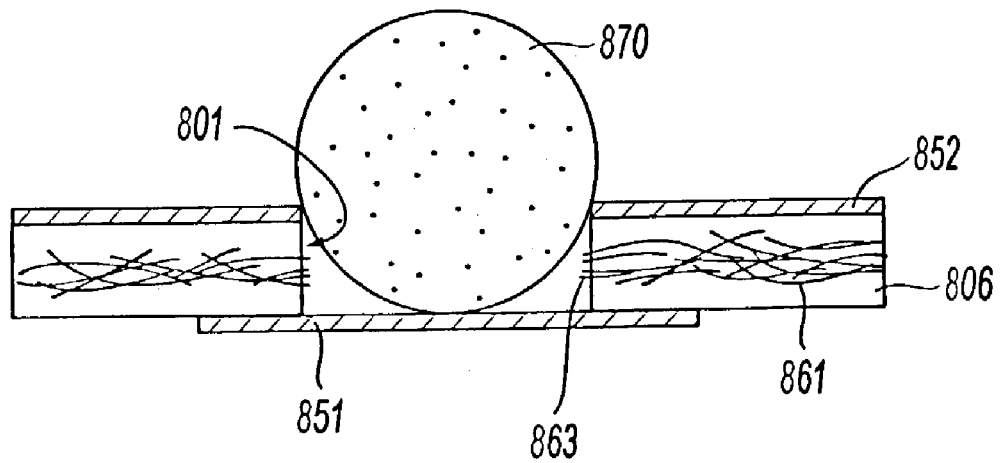
FIG. 47 is a diagrammatic view illustrating a method of feeding a solder ball to the inside of the solder filling hole in Embodiment 13.

In a printed wiring board of this embodiment, as shown in FIGS. 46 and 47, a ball-shaped solder 870 is fed to an inside of a solder filling hole 801 and melted by heating to fill the solder into the inside of the solder filling hole 801.

That is, as shown in FIG. 47, the solder filling hole 801 is formed by using the laser beam as in Embodiment 11. The diameter of the solder filling hole 801 is 0.3 mm. Then, a spherical solder ball 870 having a diameter of 0.35 mm is rolled on the surface of the insulating substrate 806 to feed the solder ball 870 to the inside of the solder filling hole 801.

Next, the solder ball 870 is melted by heating, whereby the end portions 863 of the fibers 861 protruded from the wall face 810 of the solder filling hole 801 encroach into the inside of the solder ball 870 as shown in FIG. 46.

An upper portion 874 of the solder ball 870 is a portion to be joined to other member 808.

Even in this embodiment, the end portions 863 of the fibers 861 protruded from the wall face 810 of the solder filling hole 801 encroach into the inside of the solder ball 870, so that the joining strength between the solder filling hole 801 and the solder ball 870 is high.

Embodiment 14

A printed wiring board according to the fourteenth embodiment of the invention and production method thereof are described with reference to FIG. 48~FIG. 55.

Figure 52:
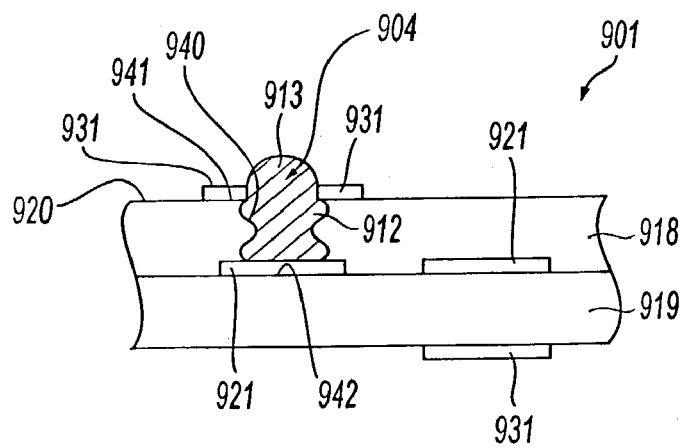
FIG. 52 is a diagrammatic section view of a main part of the printed wiring board in Embodiment 14.
Figure 53:
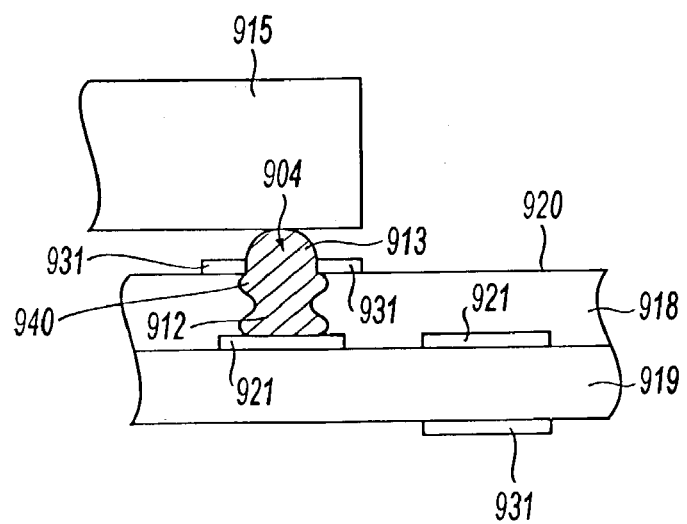
FIG. 53 is a diagrammatic view illustrating the printed wiring board and another electronic part arranged thereon in Embodiment 14.

As shown in FIGS. 52 and 53, the printed wiring board 901 of this embodiment comprises two insulating layers 918, 919. Innerlayer conductor circuits 921 are formed between the insulating layers 918, 919. On an outermost surface 920 of the insulating layer 918 is formed a blind via-hole 904 toward the innerlayer conductor circuit 921. A solder 912 is filled in the inside of the blind via-hole 904. A wall face 940 of the blind via-hole 904 is wavy at a section thereof.

The details of the printed wiring board 901 are described below.

As shown in FIG. 52, an outerlayer conductor circuit 931 is formed on the outermost surface 920 of the insulating layer 918.

The blind via-hole 904 filled with the solder 912 is formed so as to ensure electrical conduction between the outerlayer conductor circuit 931 and the innerlayer conductor circuit 921 existing at a bottom 942.

As shown in FIG. 53, another electronic part 915 is mounted onto the solder 912 filled in the blind via-hole 904 through a solder ball 913.

Moreover, the solder 912 filled in the blind via-hole 904 and the solder ball 913 are represented by different numerals for convenience' sake, but they are integrally united with each other.

The production method of the printed wiring board 901 is described below.

At first, there is provided a copper clad laminate having copper foil on its surface, and the copper foil is patterned. Then, the surface of the copper foil is subjected to electroless copper plating to obtain an insulating layer 919, innerlayer conductor circuits 921 and an outerlayer conductor circuit 931.

Then, a prepreg and copper foil are laminated on the surface of the insulating layer 919. Next, the copper foil is patterned. Thereafter, the copper foil is subjected to electroless copper plating to obtain an insulating layer 918 and an outerlayer conductor circuit 931.

At this time, a laser beam irradiating portion 981 exposing the insulating layer 918 is simultaneously formed on an outermost surface 920.

Moreover, the prepreg is used by impregnating a glass cloth with epoxy resin.

Figure 48:
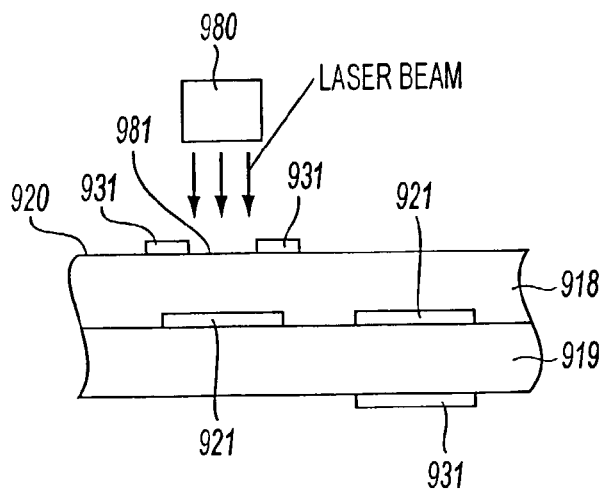
FIG. 48 is a diagrammatic view illustrating the irradiation of laser beam in the production of the printed wiring board in Embodiment 14.

Then, as shown in FIG. 48, a laser beam is irradiated to the laser beam irradiating portion 981 by using a laser beam oscillator 980. Thus, the insulating layer 918 is vaporized and removed to obtain a blind via-hole 904 arriving at the innerlayer conductor circuit 921.

Figure 49:
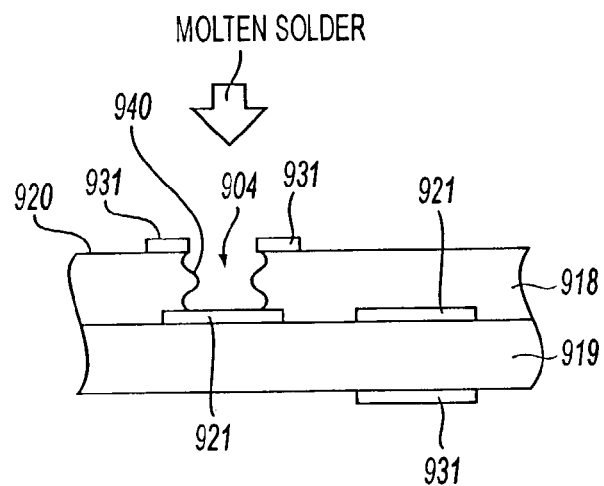
FIG. 49 is a diagrammatic view of a blind via-hole in the production of the printed wiring board in Embodiment 14.

In the insulating layer 918, it is difficult to vaporize and remove the glass cloth portion as compared with the epoxy resin portion. Therefore, as shown in FIG. 49, a wall face 940 is wavy. That is, a portion protruding toward the blind via-hole 904 is a glass cloth existing portion, while a concave portion to the blind via-hole 904 is mainly an epoxy resin existing portion.

And also, an excimer laser is used at a wavelength of 248 nm and an output of 50 W as the laser beam.

Figure 50:
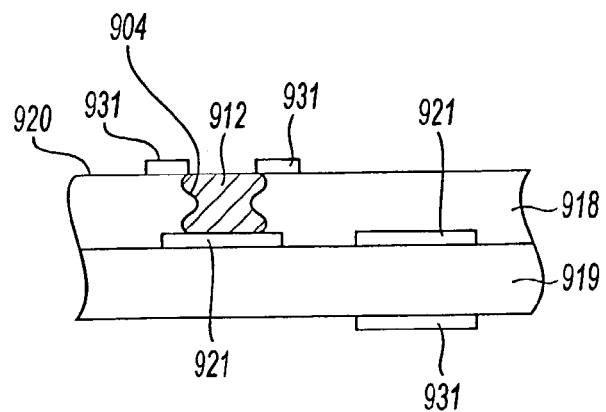
FIG. 50 is a diagrammatic view of the blind via-hole filled with a solder in the production of the printed wiring board in Embodiment 14.
Figure 51:
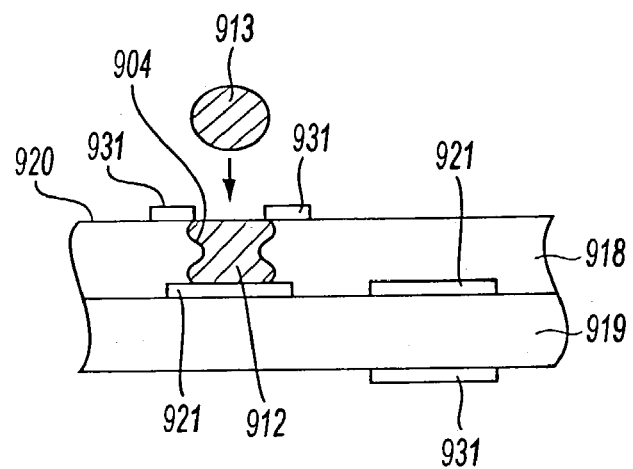
FIG. 51 is a diagrammatic view illustrating the arrangement of a solder ball in the production of the printed wiring board in Embodiment 14.

Next, molten solder is flowed into the blind via-hole 904 as shown in FIG. 49. Thus, a solder 912 is filled in the blind via-hole 904 as shown in FIG. 50. Then, a solder ball 913 is placed on the surface of the solder 912 as shown in FIG. 51, and adhered by heating to the solder 912 as shown in FIG. 52. Thereafter, an electronic part 915 is adhered to the solder ball 913 as shown in FIG. 53.

In this way, there is obtained the printed wiring board 901 of this embodiment.

The function and effect of this embodiment are described below.

In the printed wiring board 901, as shown in FIG. 53, the sectional shape of the wall face 940 of the blind via-hole 904 is uneven (wavy). Therefore, the solder 912 filled in the blind via-hole 904 encroaches into the unevenness and fixed thereto. As a result, the solder 912 can provide a high adhesion strength to the blind via-hole 904.

Since the insulating layer 918 in the printed wiring board 901 is formed by impregnating the epoxy resin into the glass cloth, the blind via-hole 904 having a wavy section can be obtained only by the irradiation of the laser beam. And also, the hole is formed through the laser beam, so that a small diameter hole of 100 μm can be obtained as the blind via-hole 904.

Figure 54:
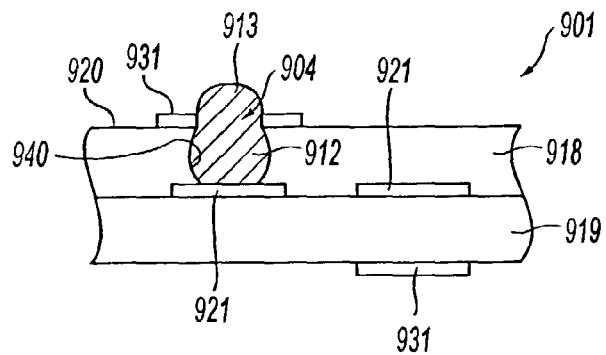
FIG. 54 is a diagrammatic section view of a main part of the printed wiring board having a blind via-hole of a concave form in Embodiment 14.
Figure 55:
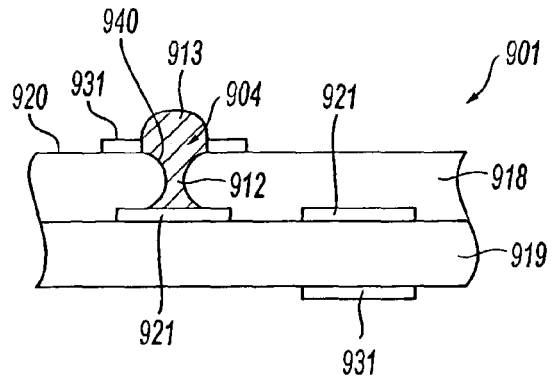
FIG. 55 is a diagrammatic section view of a main part of the printed wiring board having a blind via-hole of a convex form in Embodiment 14.

As another shape of the blind via-hole 904 in this embodiment, mention may be made of a concave form widening in the lateral direction of the blind via-hole 904 as shown in FIG. 54 and a convex form protruding toward the inside of the blind via-hole 904 as shown in FIG. 55.

Embodiment 15

The production method of a printed wiring board according to the fifteenth aspect of the invention is described with reference to FIG. 56~FIG. 59.

Figure 56:
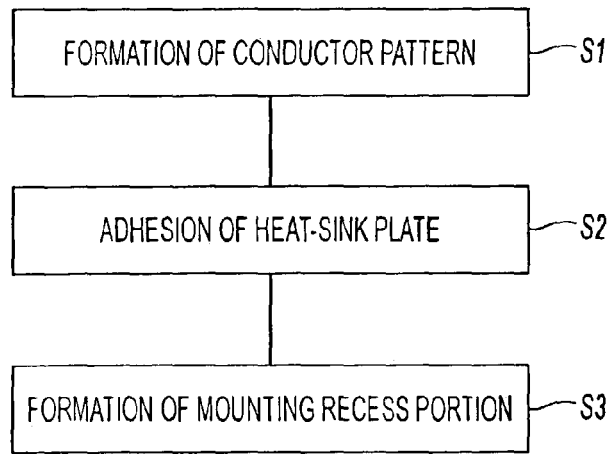
FIG. 56 is a flow chart illustrating a method of producing the printed wiring board in Embodiment 15.

An outline of the production method according to this embodiment is explained. At first, as shown in FIG. 56, a conductor pattern is formed on an insulating substrate at a step S1. Then, a heat-sink plate is adhered to a lower face of the insulating substrate at a position corresponding to a mounting recess portion to be formed at a step S2. Thereafter, a laser beam is irradiated from an upper face of the insulating substrate at the position of the mounting recess portion to form a mounting recess portion at a step S3.

The details of the production method is described below.

Figure 57:
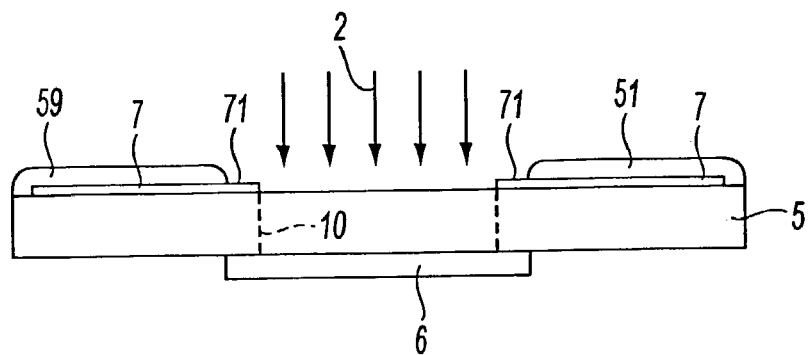
FIG. 57 is a section view of the printed wiring board illustrating a method of forming a mounting recess portion in Embodiment 15.

At the step S1, there is provided an insulating substrate including a glass epoxy resin substrate. The thickness of the insulating substrate is 0.3 mm. Then, a copper foil is adhered to one surface of the insulating substrate and subjected to light exposure, etching or the like. Thus, a conductor pattern 7 is formed from the copper foil as shown in FIG. 57. Next, the surface of the conductor pattern 7 is covered with Ni/Au plated film.

Then, the surface of the insulating substrate 5 is covered with a solder resist 59. In this case, an opening portion exposing a bonding pad 71 for the conductor pattern 7 is formed on the solder resist 51.

And also, a heat-sink plate 6 is adhered to a lower face of the insulating substrate 5 at a position 10 corresponding to a mounting recess portion to be formed. The heat-sink plate 6 is a copper plate having a thickness of 0.2 mm.

Figure 58:
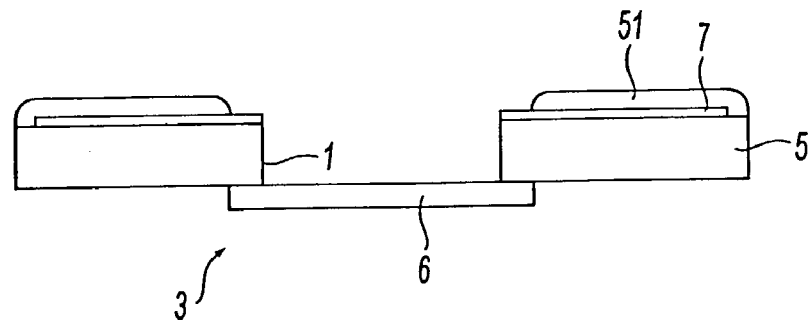
FIG. 58 is a section view of the printed wiring board in Embodiment 15.

As shown in FIG. 57, a laser beam 2 is then irradiated from an upper face of the insulating substrate at the position 10 of the mounting recess portion. As the laser beam 2 a carbon dioxide gas laser is used. The irradiation of the laser beam is stopped when a bottom of the mounting recess portion 1 reaches the surface of the heat-sink plate 6. Thus, the mounting recess portion 1 is formed in the insulating substrate 5 as shown in FIG. 58. A printed wiring board 3 is obtained as mentioned above.

Figure 59:
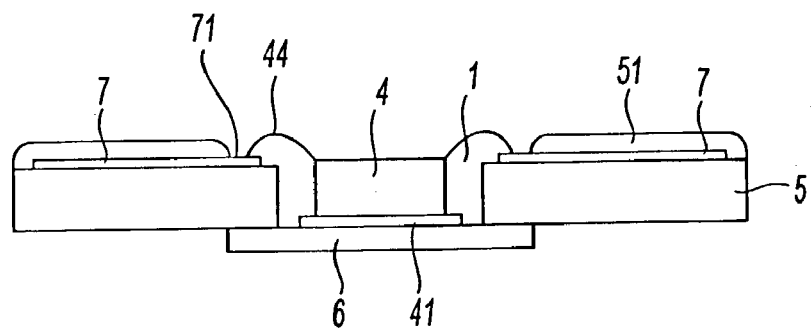
FIG. 59 is a section view of the printed wiring board mounted with an electronic part in Embodiment 15.

In the printed wiring board 3, as shown in FIG. 59, an electronic part 4 is mounted onto the bottom of the mounting recess portion 1 by using an adhesive 41 such as silver paste or the like. The electronic part 4 is connected to the bonding pad 71 through a bonding wire 44 to thereby electrically connect to the conductor pattern 7.

The function and effect of this embodiment are described below.

As shown in FIG. 56, the mounting recess portion is formed by the irradiation of the laser beam after a portion of the insulating substrate forming the mounting recess portion is covered with the heat-sink plate. Therefore, the opening portion having a desired size can easily be obtained.

In this embodiment, as shown in FIG. 57, the mounting recess portion 1 is formed by irradiating the laser beam 2 to the upper face of the portion 10 forming the mounting recess portion.

In this case, the laser beam 2 vaporizes and removes the insulating substrate 5 under its high energy to gradually form a hole toward the inside of the insulating substrate 5. When a top of the laser beam 2 arrives at the heat-sink plate 6, the laser beam 2 is reflected by the heat-sink plate 6 made of a metal. For this end, the irradiation of the laser beam 2 is stopped at this time. Thus, there can be formed the mounting recess portion 1 in which one of the opening portions is covered with the heat-sink plate 6.

Since the mounting recess portion 1 is formed by the irradiation of the laser beam 2, the hole formation can be carried out without damaging the insulating substrate.

Further, the bottom of the mounting recess portion 1 is a surface of the heat-sink plate 6. Therefore, the electronic part 4 is mounted onto the surface of the heat-sink plate 6 in the inside of the mounting recess portion 1. As a result, the mounting recess portion 1 having an excellent heat dissipation can be formed.

Embodiment 16

Figure 60:
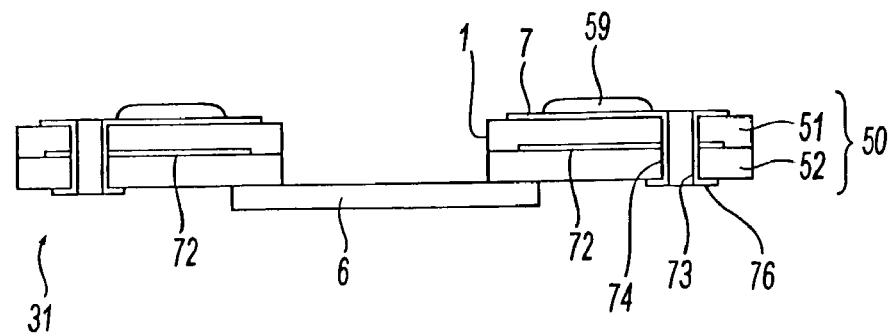
FIG. 60 is a section view of the printed wiring board in Embodiment 16.
Figure 61:
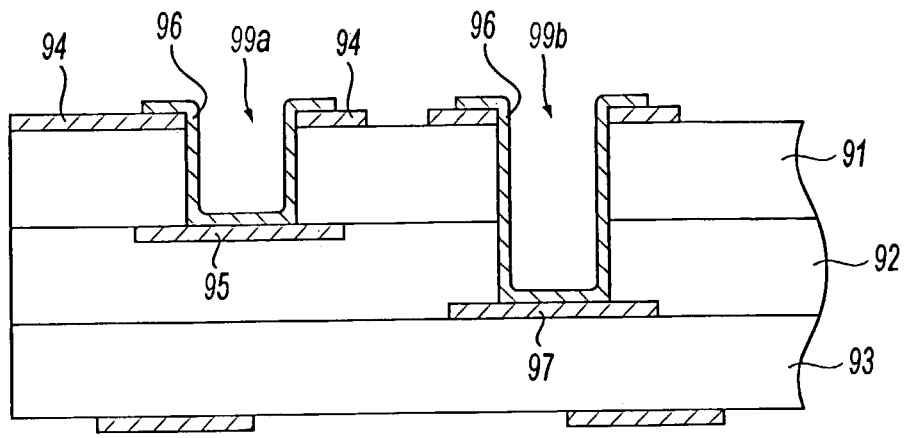
FIG. 61 is a diagrammatic view of a printed wiring board in the conventional example.
Figure 62:
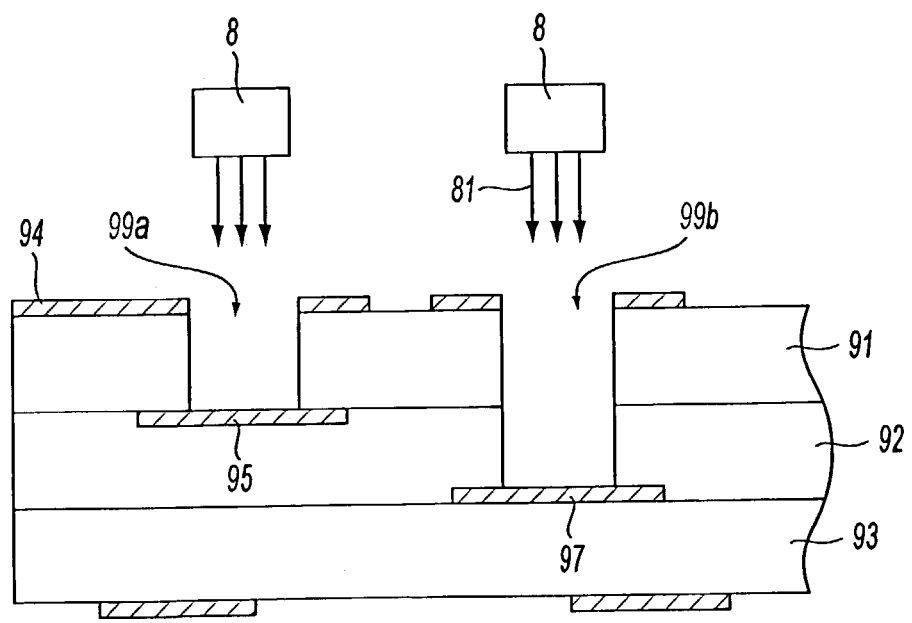
FIG. 62 is a diagrammatic view illustrating the formation of holes through laser beam in the conventional example.
Figure 63:
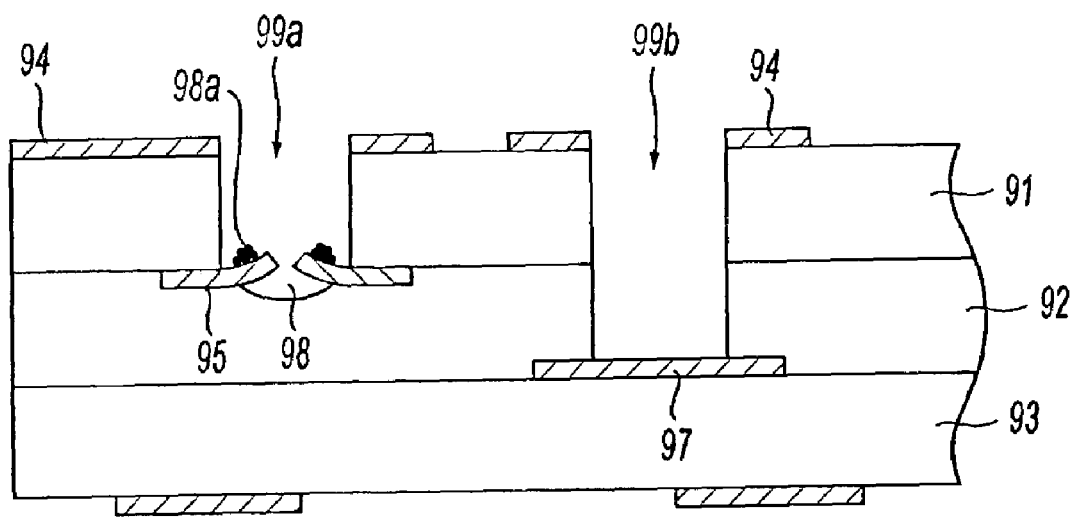
FIG. 63 is a diagrammatic view illustrating a problem in the hole formation through laser beam in the conventional example.

A printed wiring board of this embodiment comprises a multilayer substrate 50 formed by laminating two insulating substrates 51, 52 as shown in FIG. 60. Conductor patterns 72 are formed between the insulating substrates 51, 52.

The conductor patterns 72 formed in the inside of the multilayer substrate 50 are electrically connected to conductor patterns 7, 71 formed on both surfaces of the multilayer substrate 50 through through-holes 73.

In the production of the printed wiring board 31, there are provided two flexible films having a thickness of 0.2 mm and a flexibility. They are insulating substrates 51, 52. Then, conductor patterns 7, 72, 76 are formed on the surfaces of the insulating substrates 51, 52, which are adhered with a resinous adhesive to obtain a multilayer substrate 50.

Then, through-holes 73 are formed in the multilayer substrate 50 by using a drill and further an inner wall thereof is covered with a copper plated film 74. Next, the surface of the multilayer substrate 50 other than the through-holes 73 and a neighborhood of a portion forming the mounting recess portion is covered with a solder resist 59. Thereafter, the mounting recess portion 1 is formed by the irradiation of the laser beam as in Embodiment 15 to provide the printed wiring board 31.

In this embodiment, the conductor pattern 72 is formed on not only the surface but also the inside of the multilayer substrate 50. Therefore, a high density wiring of the printed wiring board 31 can be realized. And also, the mounting recess portion 1 passing through the two insulating substrates 51, 52 is formed by the irradiation of the laser beam. As a result, it is unnecessary to previously form the through-hole in the insulating substrate and it is also not required to conduct the positioning for connecting these through-holes to each other. Therefore, according to the production method of this embodiment, the printed wiring board 31 can easily be produced.

Even in this embodiment, the same effect as in Embodiment 15 can be obtained.

According to the invention, via-holes having a sure conductivity can be formed through the laser beam without causing damage of innerlayer conductor circuit and there can be provided a production method of a printed wiring board capable of realizing novel circuit formation through the laser beam.

What is claimed is:

1. A method of manufacturing a printed wiring board, comprising:
   providing a first insulating layer having an outer surface and an inner surface, wherein the outer surface and the inner surface of the first insulating layer have a plurality of conductor circuits;
   forming an opening hole in a inner surface conductor circuit, which is one of the plurality of conductor circuits on the inner surface of the first insulating layer, wherein a center of the opening hole is at a position coincident to a central portion of a bottom of a blind via-hole to be subsequently formed;
   laminating a second insulating layer to the inner surface of the first insulating layer, wherein the inner surface conductor circuit with the opening hole is between the first insulating layer and the second insulating layer;
   irradiating a laser beam from the outer surface of the first insulating layer to form the blind via-hole arriving at the inner surface conductor circuit with the opening hole between the first insulating layer and the second insulating layer and the laser beam penetrating into the opening hole such that a surplus hole is formed in the second insulating layer; and
   forming a metal plated film on the inner surface conductor circuit with the opening hole between the first insulating layer and the second insulating layer and surfaces of the blind via-hole and the surplus hole.

2. A method of producing a printed wiring board according to claim 1, wherein the metal plated film is formed so as to cover the opening hole in the inner surface conductor circuit.

3. A method of manufacturing a printed wiring board, comprising:
   providing a first insulating layer having an outer surface and an inner surface, wherein the outer surface and the inner surface of the first insulating layer have a plurality of conductor circuits;
   forming an opening hole in a inner surface conductor circuit, which is one of the plurality of conductor circuits on the inner surface of the first insulating layer, wherein a center of the opening hole is at a position coincident to a central portion of a bottom of a blind via-hole to be subsequently formed;
   laminating a second insulating layer to the inner surface of the first insulating layer, wherein the inner surface conductor circuit with the opening hole is between the first insulating layer and the second insulating layer;
   providing a conductor circuit without an opening hole and a third insulating layer, wherein the conductor circuit without an opening hole is arranged between the second insulating layer and the third insulating layer;
   irradiating a laser beam from the outer surface of the first insulating layer to form the blind via-hole arriving at the inner surface conductor circuit with the opening hole between the first insulating layer and the second insulating layer;
   irradiating a laser beam from the outer surface of the first insulating layer to form a blind via-hole arriving at the conductor circuit without an opening hole between the second insulating layer and the third insulating layer and the laser beam penetrating into the opening hole such that a surplus hole is formed in the second insulating layer; and
   forming a metal plated film on the inner surface conductor circuit with the opening hole between the first insulating layer and the second insulating layer and the conductor circuit without an opening hole between the second insulating layer and the third insulating layer and surfaces of the blind via-holes and the surplus hole.

4. A method of producing a printed wiring board according to claim 3, wherein the opening hole formed in the inner surface conductor circuit has a diameter that is 30-60% of a diameter of the blind via-hole.

5. A method of manufacturing a printed wiring board, comprising:
   providing a first insulating layer having an outer surface and an inner surface, wherein the outer surface and the inner surface of the first insulating layer have a plurality of conductor circuits;
   forming an opening hole in a inner surface conductor circuit, which is one of the plurality of conductor circuits on the inner surface of the first insulating layer, wherein a center of the opening hole is at a position coincident to a central portion of a bottom of a blind via-hole to be subsequently formed, wherein the opening hole has a diameter corresponding to 30-60% of a diameter of the blind via-hole to be subsequently formed;

laminating a second insulating layer to the inner surface of the first insulating layer, wherein the inner surface conductor circuit with the opening hole is between the first insulating layer and the second insulating layer;

irradiating a laser beam from the outer surface of the first insulating layer to form the blind via-hole arriving at the inner surface conductor circuit with the opening hole between the first insulating layer and the second insulating layer and the laser beam penetrating into the opening hole such that a surplus hole is formed in the second insulating layer; and forming a metal plated film on the inner surface conductor circuit with the opening hole between the first insulating layer and the second insulating layer and surfaces of the blind via-hole and the surplus hole.

* * * * *